United States Patent
Yoo et al.

(10) Patent No.: US 7,336,336 B2
(45) Date of Patent: Feb. 26, 2008

(54) THIN FILM TRANSISTOR ARRAY SUBSTRATE, METHOD OF FABRICATING THE SAME, LIQUID CRYSTAL DISPLAY PANEL HAVING THE SAME AND FABRICATING METHOD THEREOF

(75) Inventors: Soon Sung Yoo, Gunpo-shi (KR); Youn Gyoung Chang, Uiwang-shi (KR); Heung Lyul Cho, Suwon-shi (KR); Seung Hee Nam, Suwon-shi (KR)

(73) Assignee: LG. Philips Co. Ltd., Seoul (KR)

( * ) Notice: Subject to any disclaimer, the term of this patent is extended or adjusted under 35 U.S.C. 154(b) by 155 days.

(21) Appl. No.: 10/964,485

(22) Filed: Oct. 13, 2004

(65) Prior Publication Data

US 2005/0078264 A1  Apr. 14, 2005

(30) Foreign Application Priority Data

Oct. 14, 2003  (KR)  ...................... 10-2003-0071403
Nov. 4, 2003  (KR)  ...................... 10-2003-0077660

(51) Int. Cl.
*G02F 1/1368*  (2006.01)
*H01L 21/00*  (2006.01)

(52) U.S. Cl. .................... 349/187; 349/40; 349/43; 349/106; 349/123; 349/149; 438/30

(58) Field of Classification Search ............ 349/42, 349/43, 106, 110, 149, 151, 152, 153, 187, 349/190, 123, 40; 438/30, 151, 159, 155; 430/5, 6, 7, 311, 321; 257/59, 72
See application file for complete search history.

(56) References Cited

U.S. PATENT DOCUMENTS 6,338,989 B1   1/2002  Ahn et al.
2005/0077517 A1*   4/2005  Chang et al. ............. 257/59
2005/0078246 A1*   4/2005  Yoo et al. ................ 349/122

FOREIGN PATENT DOCUMENTS

JP   H12-267132   9/2000
JP   H13-339065   9/2000
KR   1997-0011963   3/1997

OTHER PUBLICATIONS

Office Action for corresponding Chinese Patent Application No. 200410083701.2.

* cited by examiner

*Primary Examiner*—Toan Ton
*Assistant Examiner*—Tai Duong
(74) *Attorney, Agent, or Firm*—Brinks Hofer Gilson & Lione

(57) ABSTRACT

A substrate has intersecting gate and data lines with a gate insulating film therebetween, a thin film transistor provided at an intersection of the gate and data lines, a pixel electrode connected to the transistor, a pad connected to a signal line via a contact hole and containing a transparent conductive film, and a protective film overlapping a color filter array substrate to expose the film. The contact hole exposes the end of the pad and/or signal line and an adjacent area. A gate electrode, source and drain electrodes, and a contact electrode are formed from first, second, and third conductive layers, respectively. A contact hole exposes the first conductive layer of one transistor and an adjacent portion of the second conductive layer of another transistor. The contact electrode connects the exposed first and second conductive layers. Only three mask processes are used in fabricating the substrate.

11 Claims, 64 Drawing Sheets

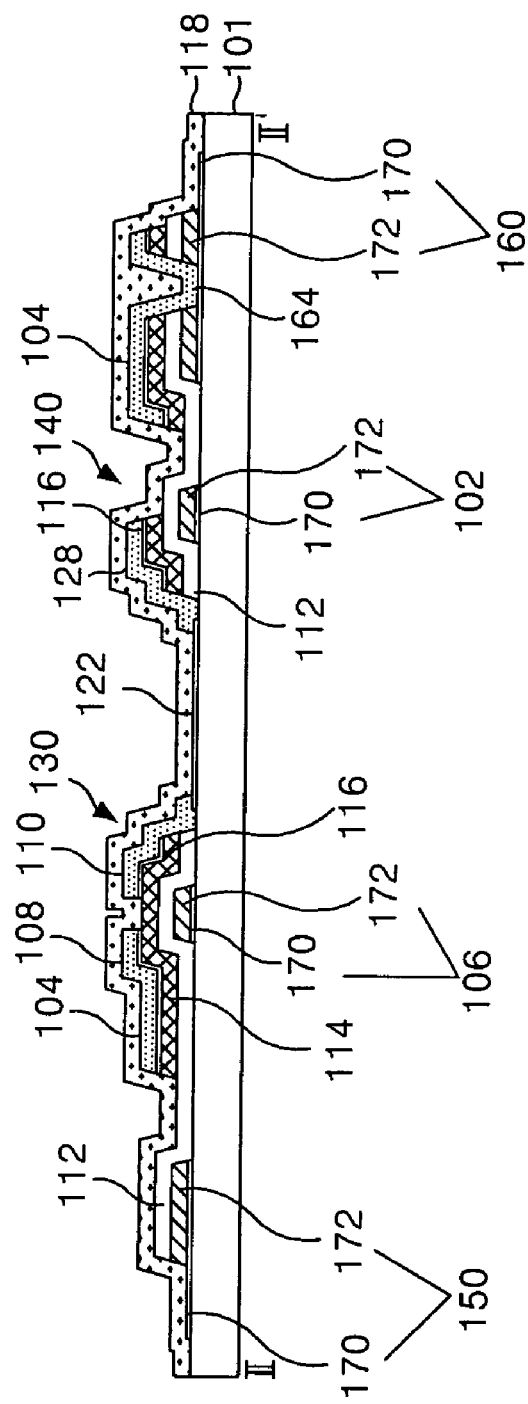

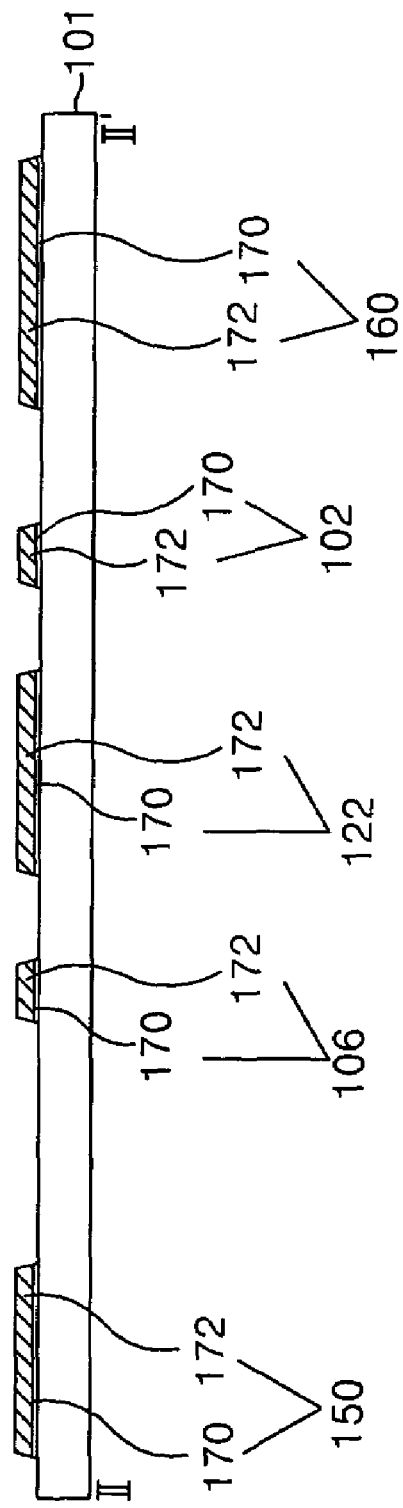

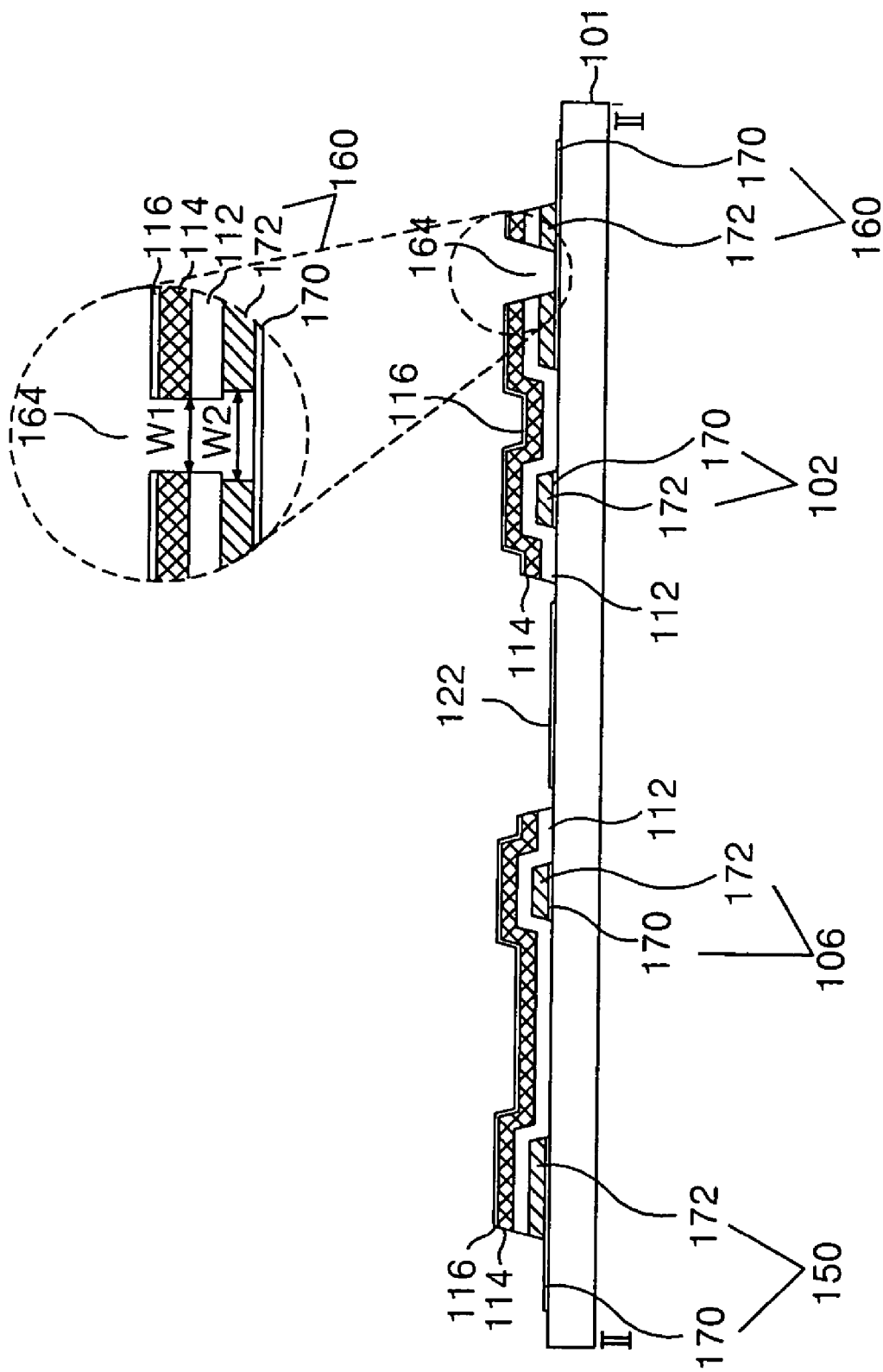

FIG.24A
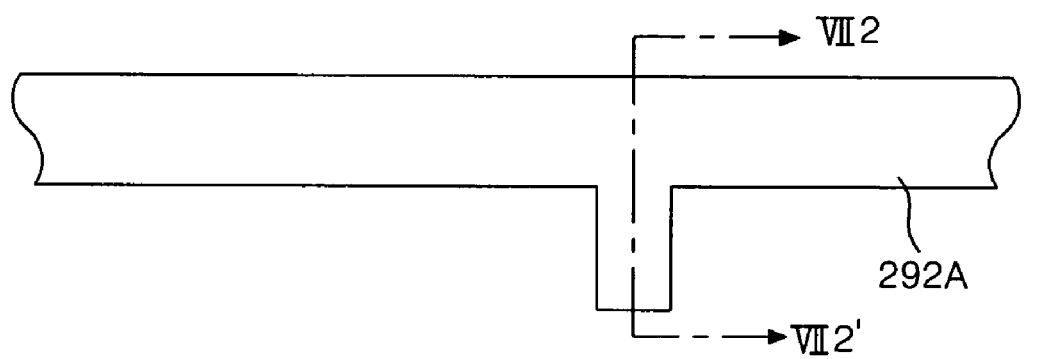
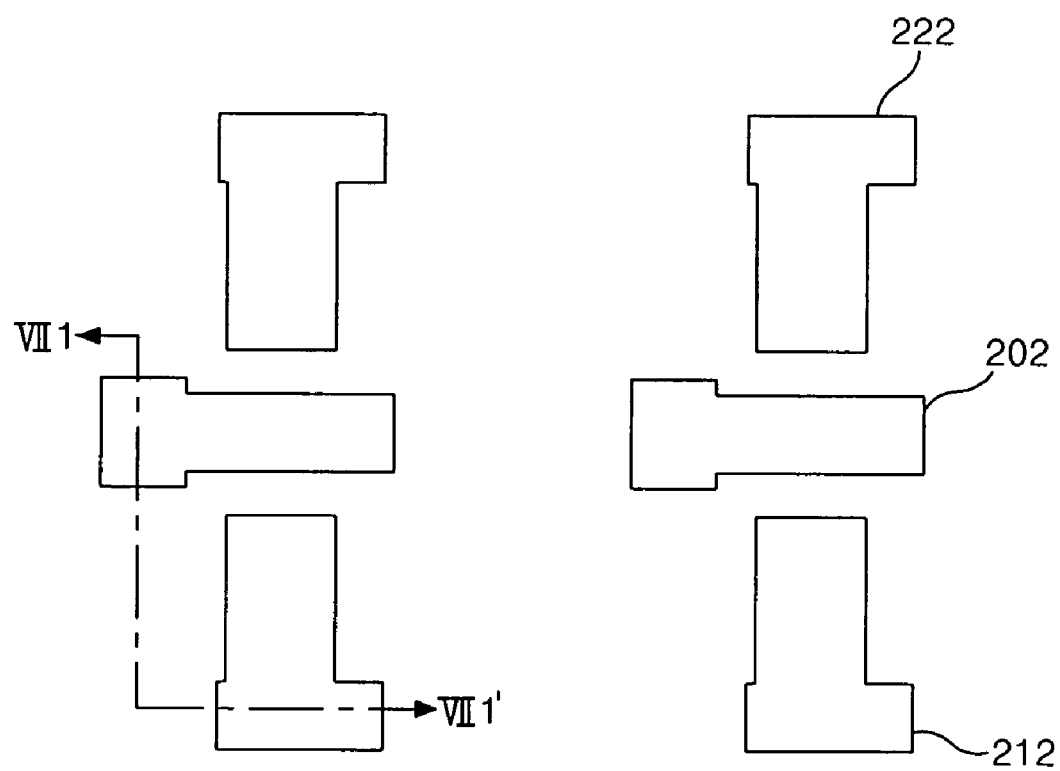

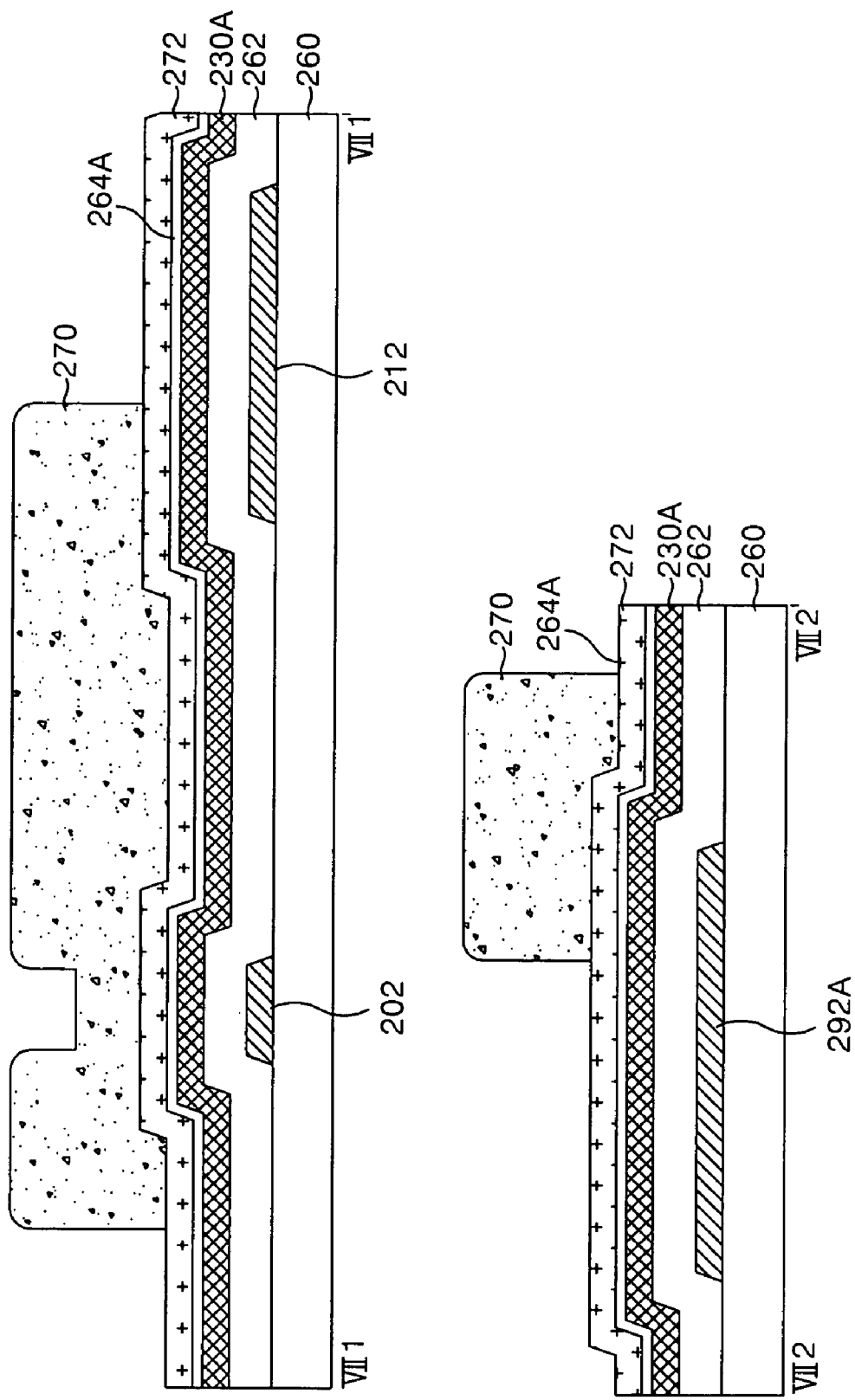

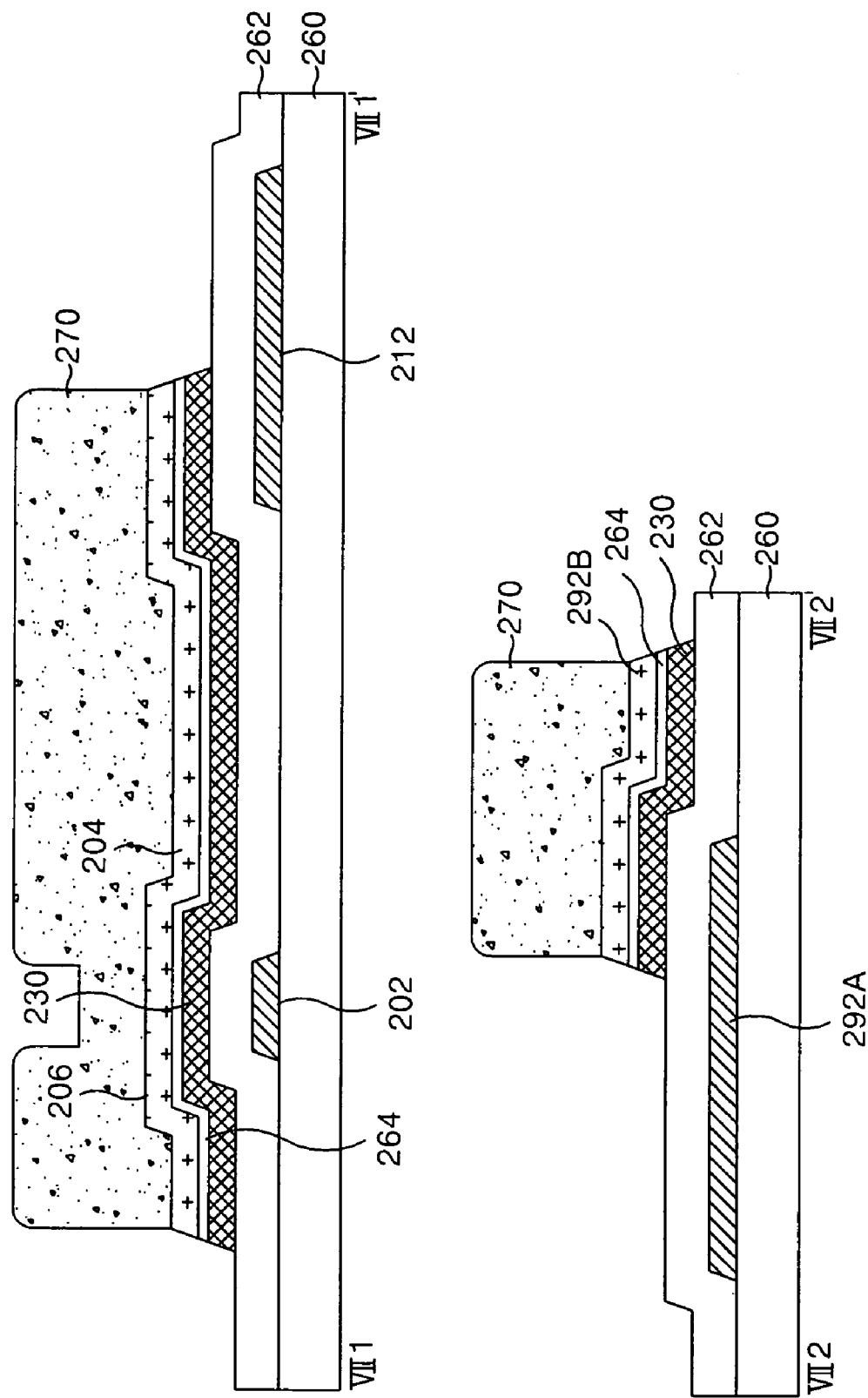

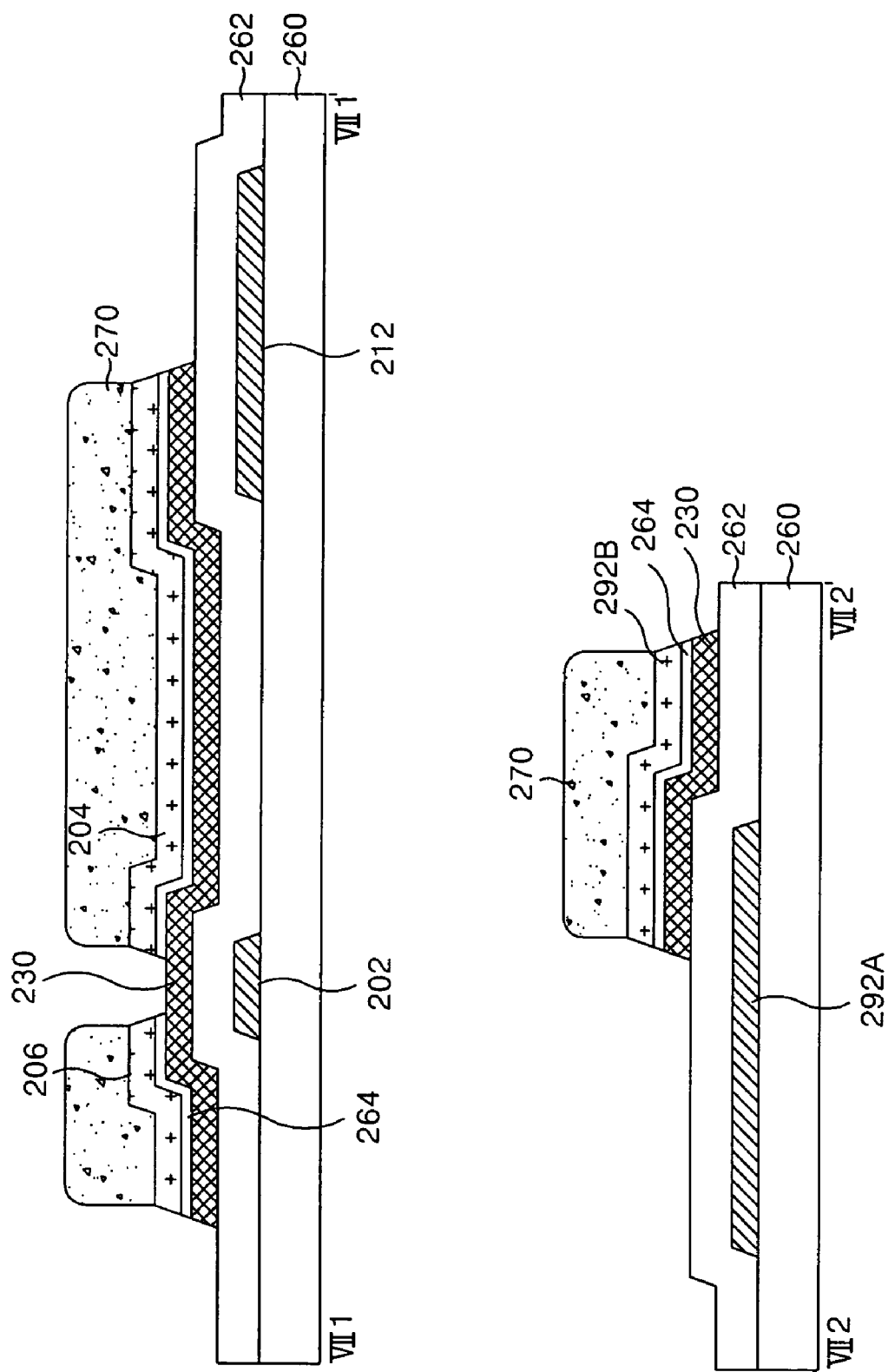

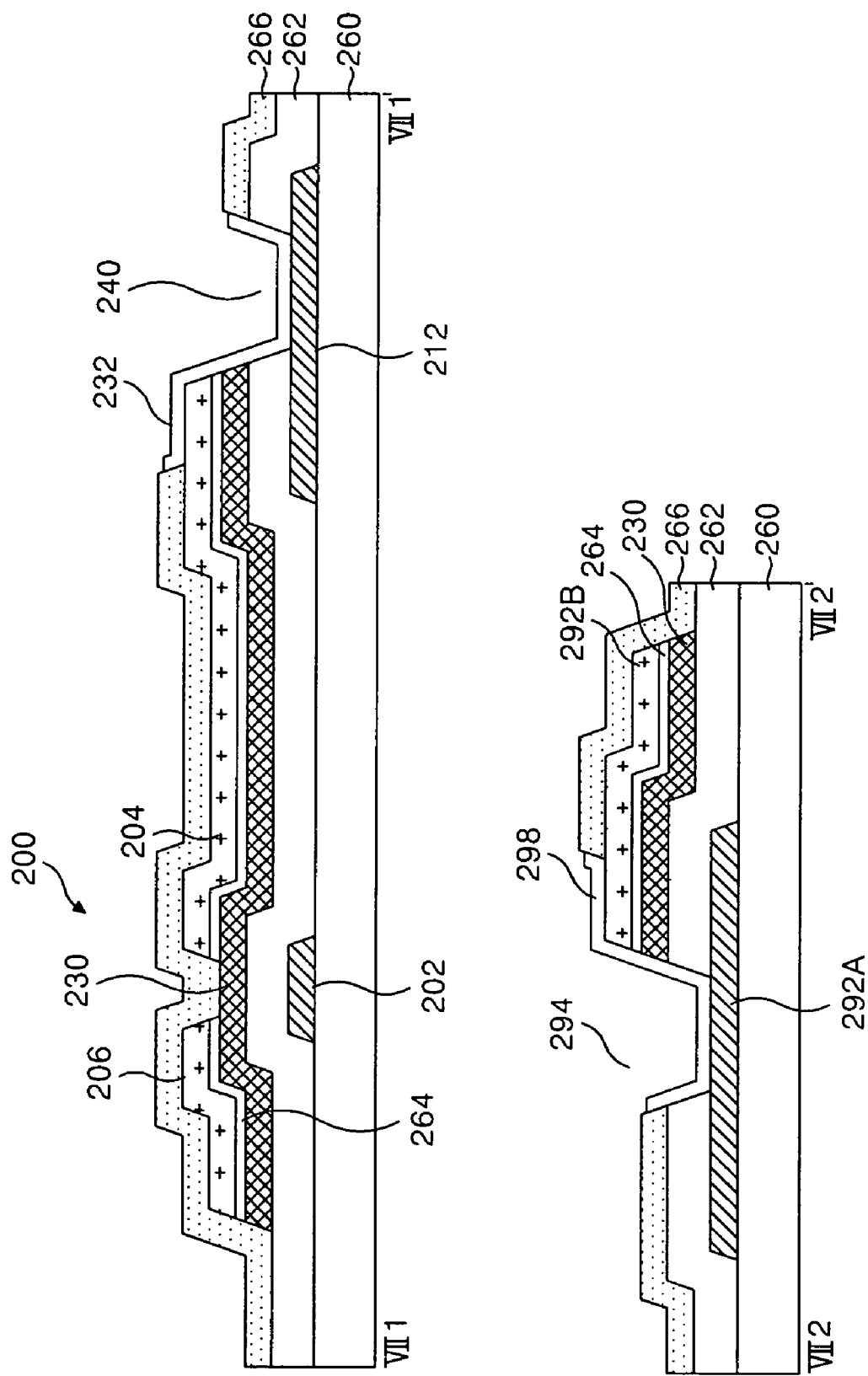

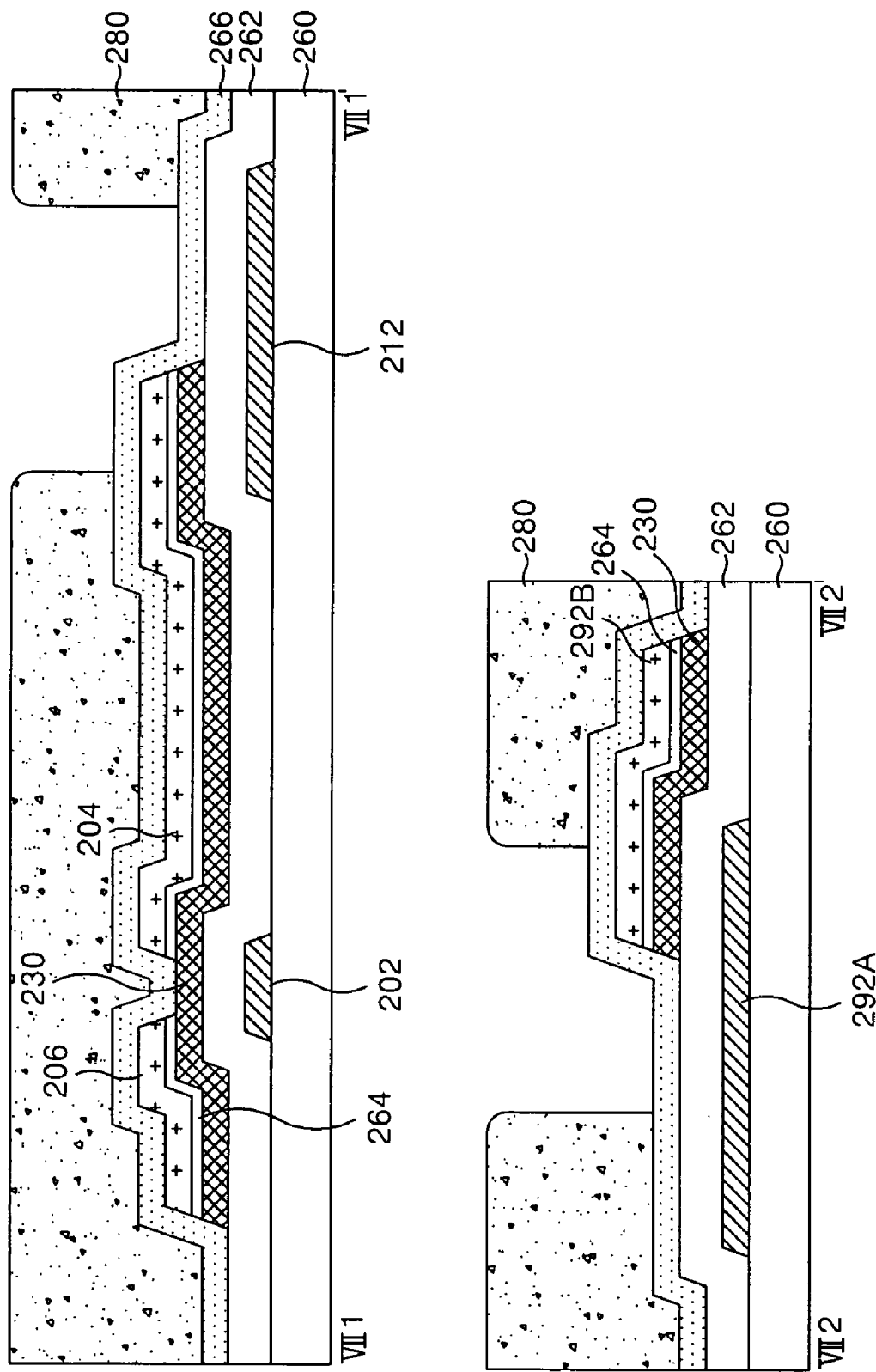

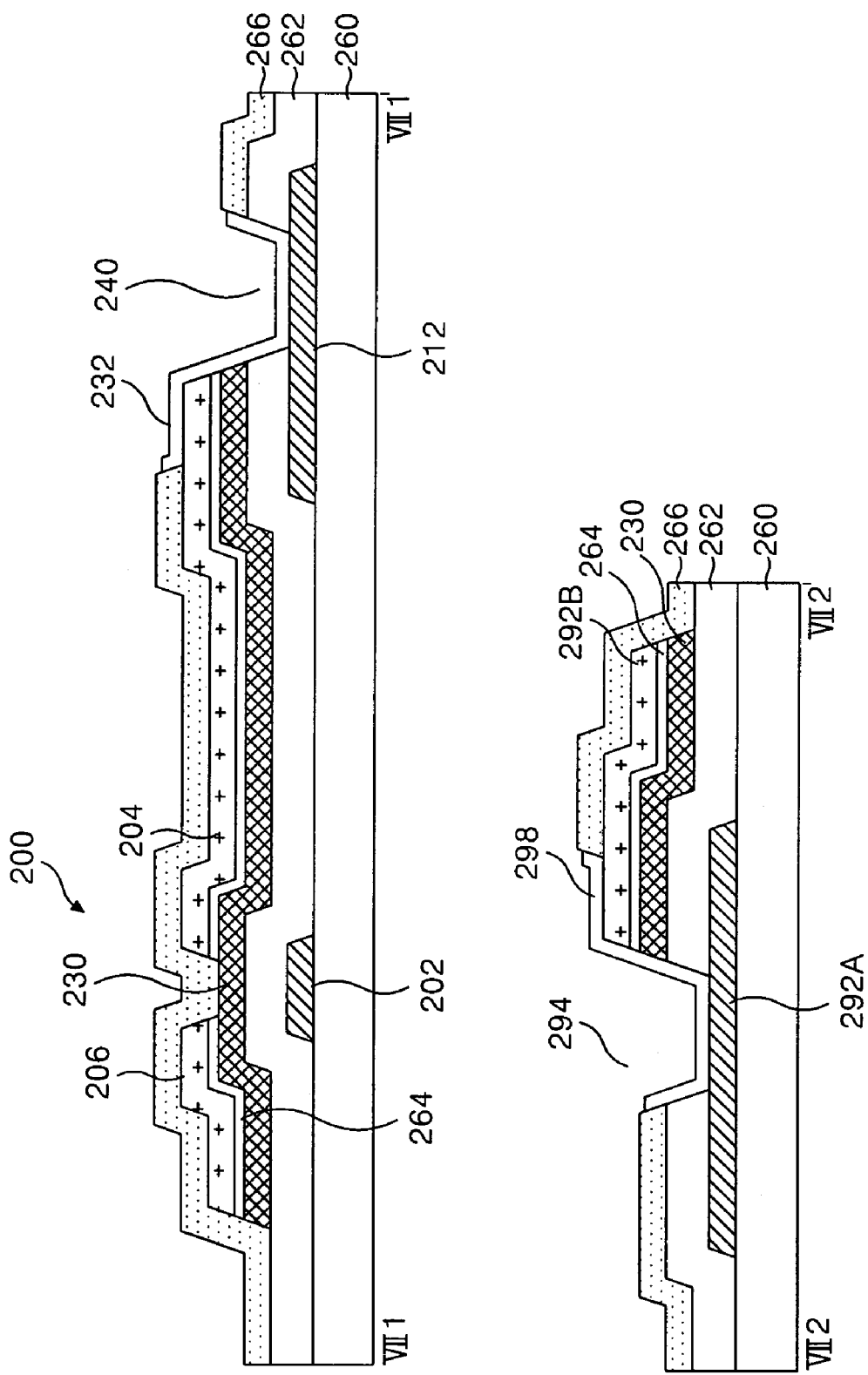

FIG.31A
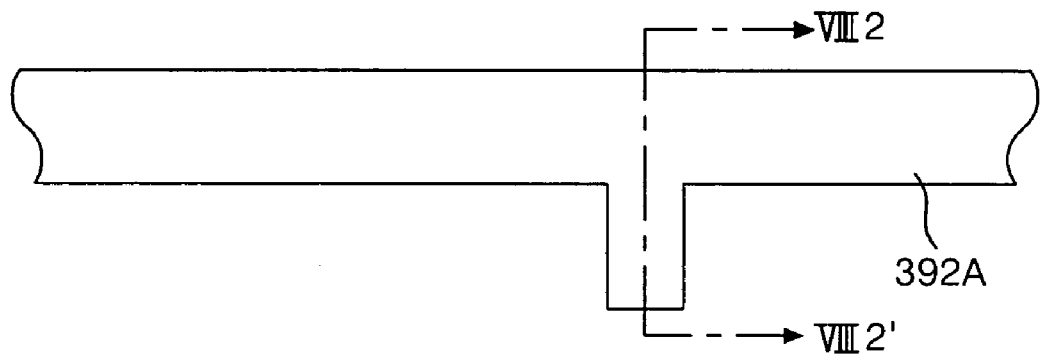
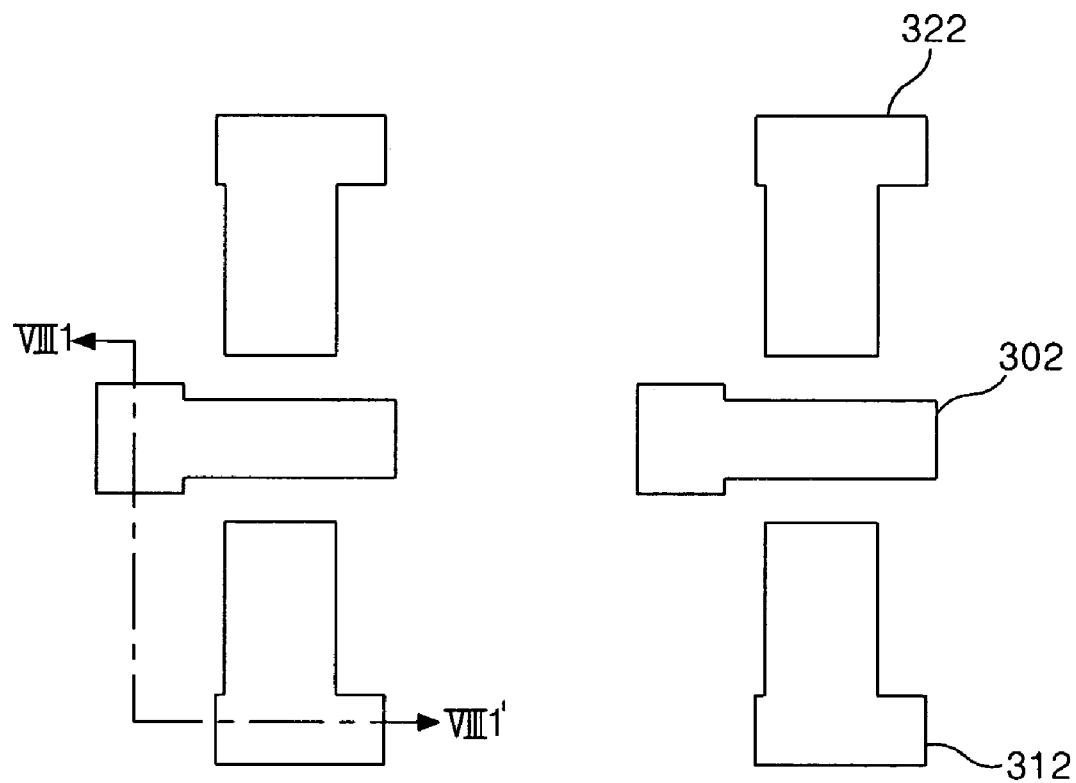

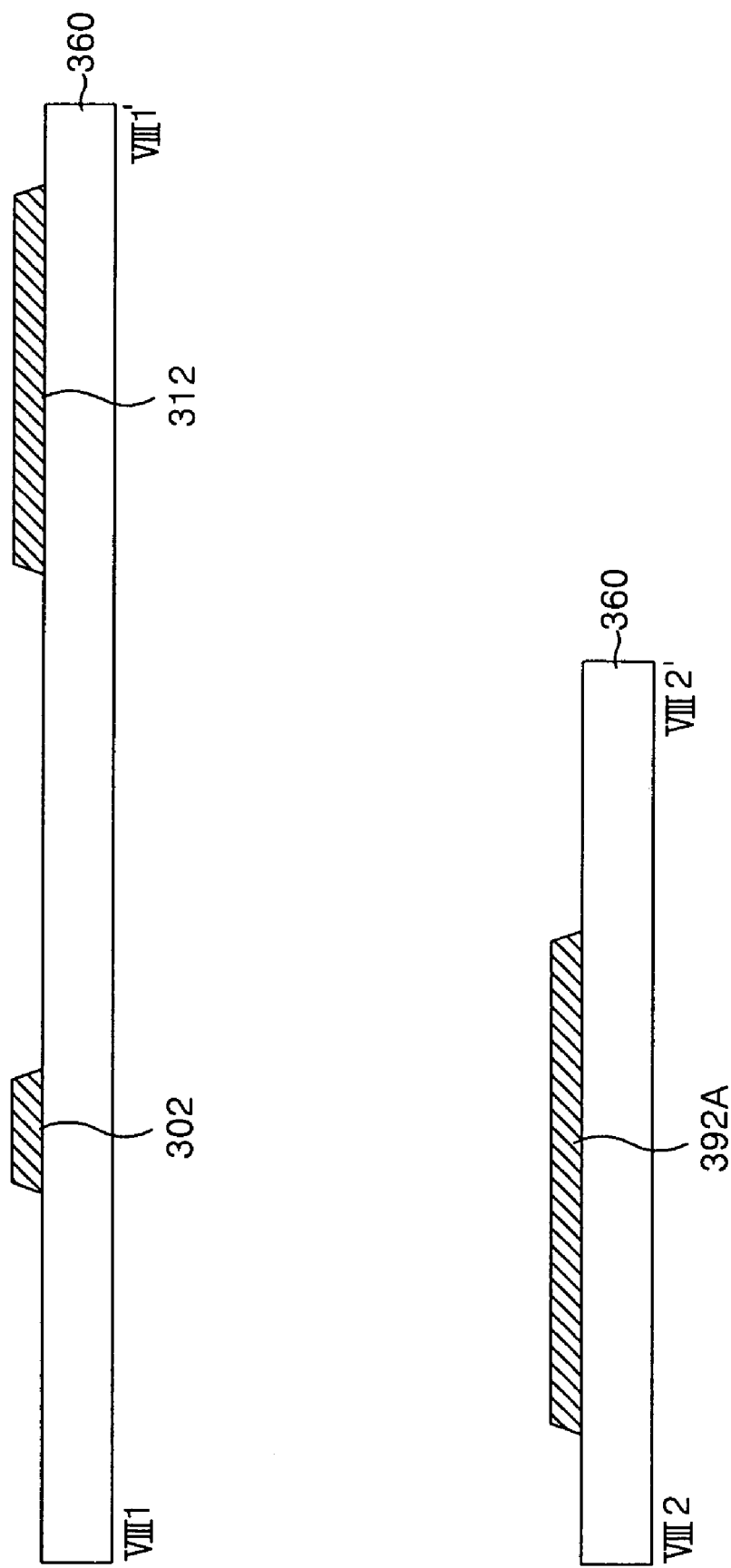

FIG.32A
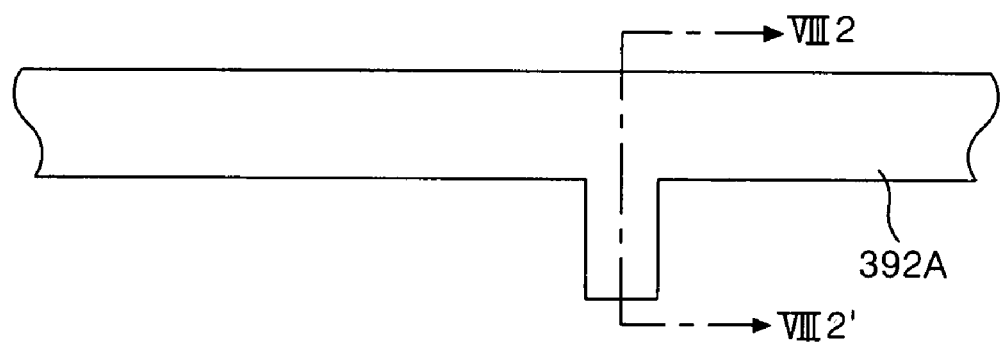
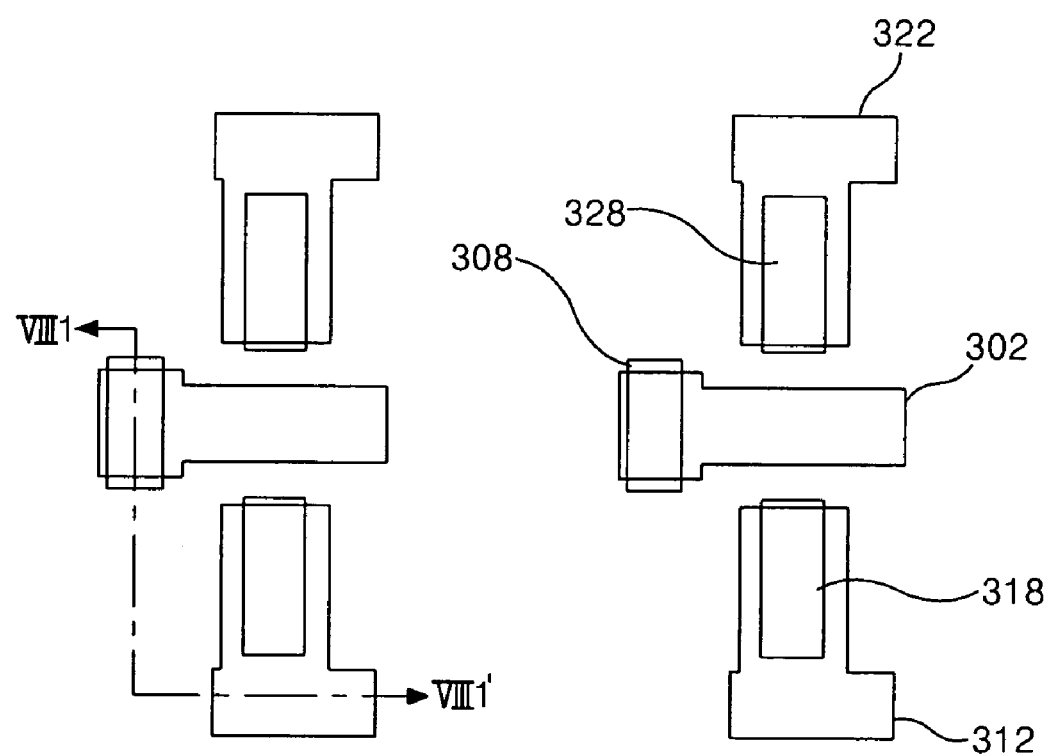

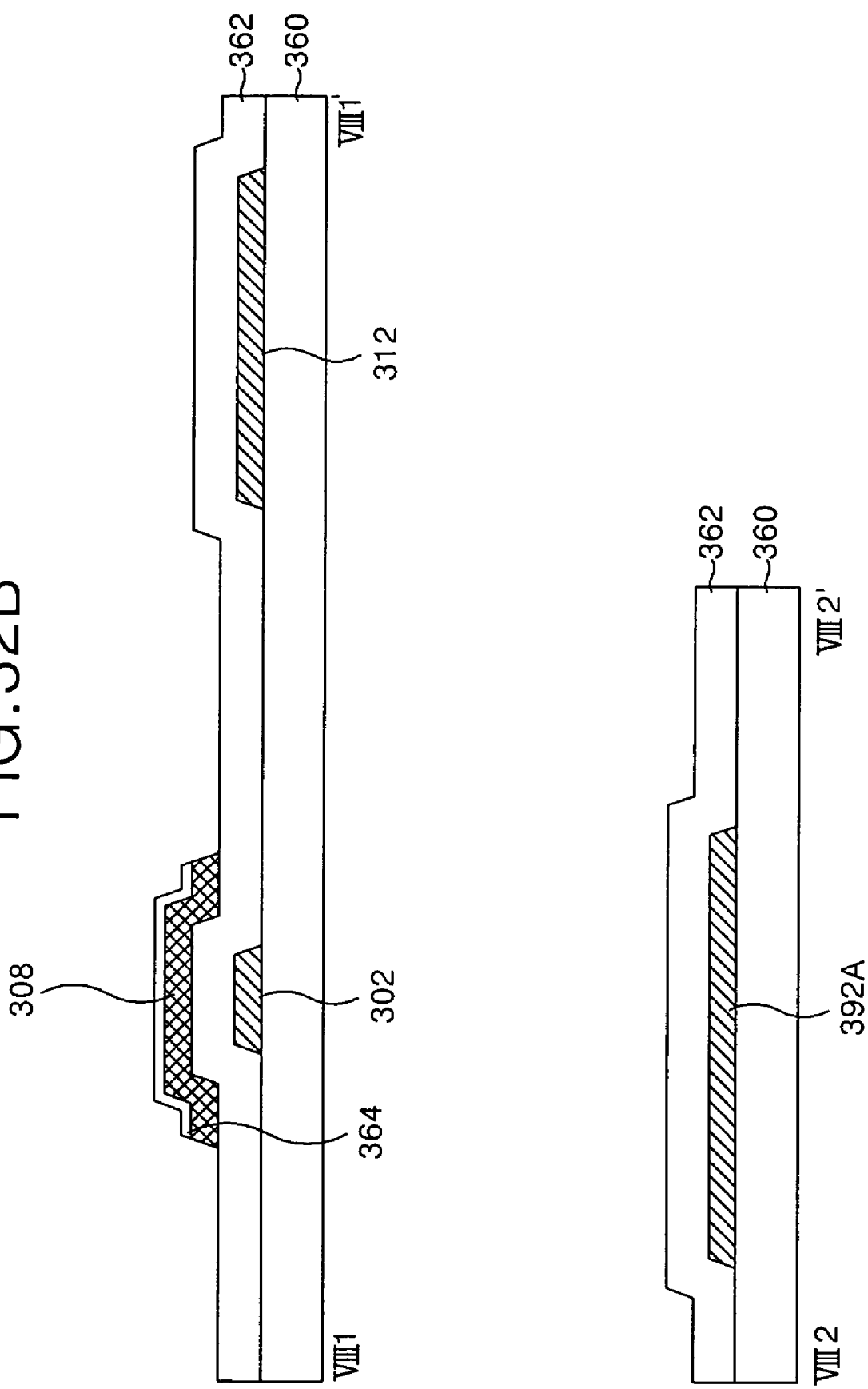

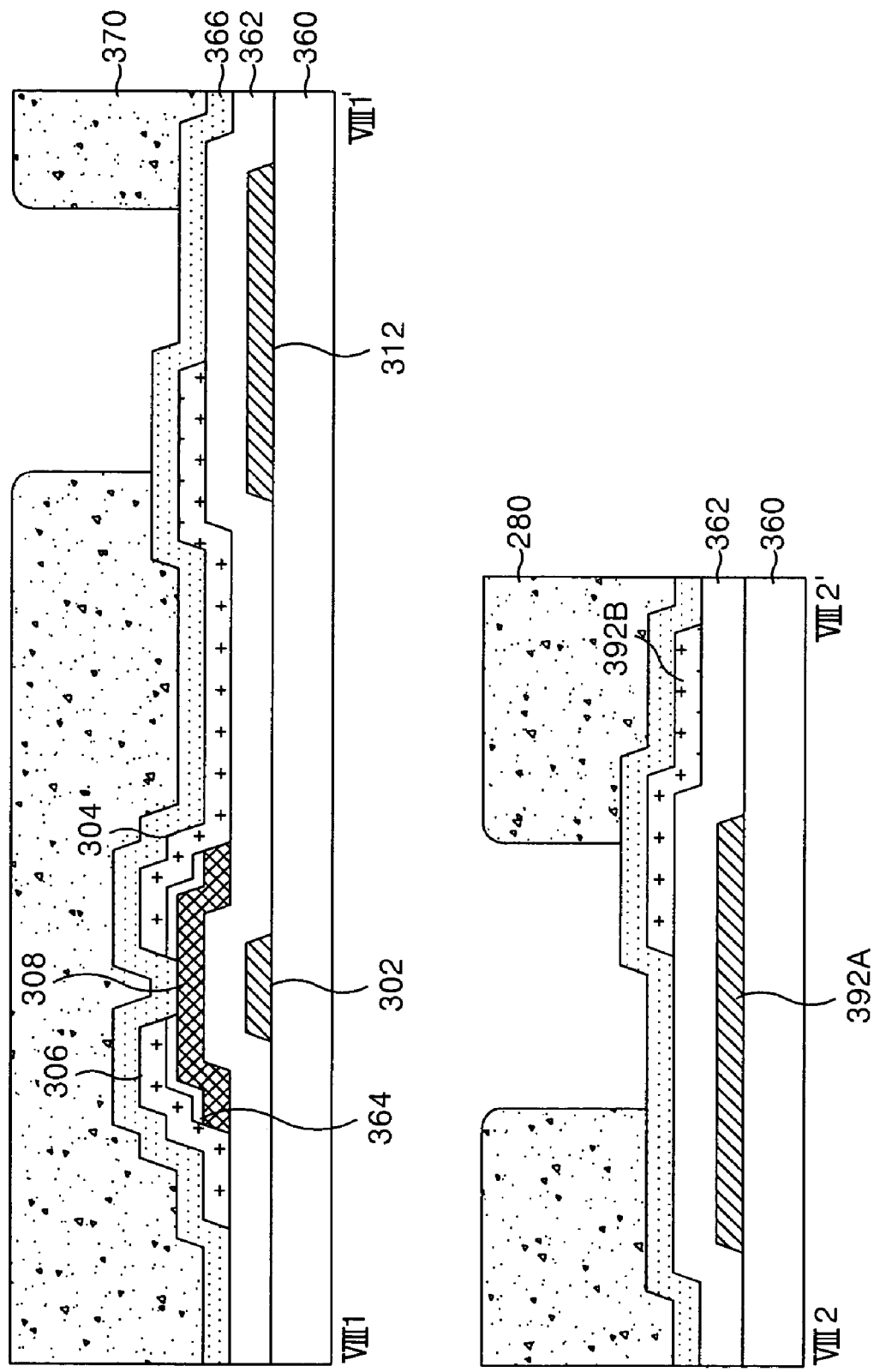

THIN FILM TRANSISTOR ARRAY SUBSTRATE, METHOD OF FABRICATING THE SAME, LIQUID CRYSTAL DISPLAY PANEL HAVING THE SAME AND FABRICATING METHOD THEREOF

This application claims the benefit of Korean Patent Application Nos. P2003-71403 and P2003-77660 filed in Korea on Oct. 14, 2003 and Nov. 4, 2003, which are hereby incorporated by reference.

BACKGROUND

1. Field of the Invention

This invention relates to a liquid crystal display, and more particularly to a thin film transistor array substrate and a fabricating method thereof that are adaptive for simplifying processing as well as assuring reliability. The present invention also is directed to a liquid crystal display panel having the thin film transistor array substrate and a fabricating method thereof.

2. Description of the Related Art

Generally, a liquid crystal display (LCD) controls light transmittance of a liquid crystal using an electric field to thereby display a picture. To this end, the LCD includes a liquid crystal display panel having liquid crystal cells arranged in a matrix type, and a driving circuit for driving the liquid crystal display panel.

The liquid crystal display panel includes a thin film transistor array substrate and a color filter array substrate opposed to each other, a liquid crystal injected between two substrates, and a spacer for keep a cell gap between two substrates.

The thin film transistor array substrate consists of gate lines, data lines, thin film transistors formed as switching devices for each intersection between the gate lines and the data lines, pixel electrodes formed for each liquid crystal cell and connected to the thin film transistor, and alignment films coated thereon. The gate lines and the data lines receive signals from the driving circuits via each pad portion. The thin film transistor applies a pixel signal fed to the data line to the pixel electrode in response to a scanning signal fed to the gate line.

The color filter array substrate consists of color filters formed for each liquid crystal cell, black matrices for dividing color filters and reflecting an external light, common electrodes for commonly applying reference voltages to the liquid crystal cells, and an alignment film coated thereon.

The liquid crystal display panel is completed by preparing the thin film array substrate and the color filter array substrate individually to join them and then injecting a liquid crystal between them and sealing it.

In such a liquid crystal display, the thin film transistor substrate has a complicated fabrication process that is a major factor in increasing the manufacturing cost of the liquid crystal display panel. The fabrication process both involves a semiconductor process and needs a plurality of mask process. In order to decrease the manufacturing cost, a reduction in the number of mask processes when fabricating the thin film transistor substrate is desirable. Each mask process includes a number of individual processes such as thin film deposition, cleaning, photolithography, etching, photo-resist stripping and inspection processes, etc. Until recently, the standard fabrication process involved five mask processes. However, a fabrication process containing four mask processes has been developed.

FIG. 1 is a plan view illustrating a thin film transistor array substrate adopting a four mask process, and FIG. 2 is a section view of the thin film transistor array substrate taken along the I-I' line in FIG. 1.

Referring to FIG. 1 and FIG. 2, the thin film transistor array substrate includes a gate line 2 and a data line 4 provided on a lower substrate 42 to intersect each other with having a gate insulating film 44 therebetween, a thin film transistor 6 provided at each intersection, and a pixel electrode 18 provided at a cell area having a crossing structure. Further, the thin film transistor array substrate includes a storage capacitor 20 provided at an overlapped portion between the pixel electrode 18 and the pre-stage gate line 2, a gate pad portion 26 connected to the gate line 2, and a data pad portion 34 connected to the data line 4.

The thin film transistor 6 allows a pixel signal applied to the data line 4 to be charged into the pixel electrode 18 and kept in response to a scanning signal applied to the gate line 2. To this end, the thin film transistor 6 includes a gate electrode 8 connected to the gate line 2, a source electrode 10 connected to the data line 4, a drain electrode 12 connected to the pixel electrode 18, and an active layer 14 overlapping with the gate electrode 8 and defining a channel between the source electrode 10 and the drain electrode 12.

The active layer 14 overlapping with the source electrode 10 and the drain electrode 12 and having a channel portion between the source electrode 10 and the drain electrode 12 also overlaps with the data line 4, a lower data pad electrode 36 and a storage electrode 22. On the active layer 14, the data line 4, the source electrode 10, the drain electrode 12, the lower data pad electrode 36, the storage electrode 22 and an ohmic contact layer 48 are further provided.

The pixel electrode 18 is connected, via a first contact hole 16 passing through a protective film 50, to the drain electrode 12 of the thin film transistor 6. The pixel electrode 18 generates a potential difference with respect to a common electrode provided at an upper substrate (not shown) by the charged pixel voltage. This potential difference rotates a liquid crystal positioned between the thin film transistor substrate and the upper substrate owing to dielectric anisotropy of the liquid crystal and transmits light inputted, via the pixel electrode 18, from a light source (not shown) toward the upper substrate.

The storage capacitor 20 consists of a pre-stage gate line 2, a storage electrode 22 overlapping with the gate line 2 having the gate insulating film 44, the active layer 14 and the ohmic contact layer 48 therebetween, and a pixel electrode 22 overlapping with the storage electrode 22 having the protective film 50 therebetween and connected via a second contact hole 24 defined at the protective film 50. The storage capacitor 20 allows a pixel signal charged in the pixel electrode 18 to be stably maintained until the next pixel voltage is charged.

The gate line 2 is connected, via the gate pad portion 26, to a gate driver (not shown). The gate pad portion 26 consists of a lower gate pad electrode 28 extended from the gate line 2, and an upper gate pad electrode 32 connected, via a third contact hole 30 passing through the gate insulating film 44 and the protective film 50, to the lower gate pad electrode 28.

The data line 4 is connected, via the data pad portion 34, to the data driver (not shown). The data pad portion 34 consists of a lower data pad electrode 36 extended from the data line 4, and an upper data pad electrode 40 connected, via a fourth contact hole 38 passing through the protective film 50, to the lower data pad electrode 36.

Hereinafter, a method of fabricating the thin film transistor substrate having the above-mentioned structure adopting the four mask process will be described in detail with reference to FIG. 3A to FIG. 3D.

Referring to FIG. 3A, gate metal patterns including the gate line 2, the gate electrode 8 and the lower gate pad electrode 28 are provided on the lower substrate 42 by the first mask process.

More specifically, a gate metal layer is formed on the lower substrate 42 by a deposition technique such as sputtering. Then, the gate metal layer is patterned by photolithography and etching using a first mask to thereby form gate metal patterns including the gate line 2, the gate electrode 8 and the lower gate pad electrode 28. The gate metal layer has a single-layer or double-layer structure of chrome (Cr), molybdenum (Mo) or an aluminum group metal, etc.

Referring to FIG. 3B, the gate insulating film 44 is coated onto the lower substrate 42 provided with the gate metal patterns. Further, a semiconductor pattern including the active layer 14 and the ohmic contact layer 48 and source/drain metal patterns including the data line 4, the source electrode 10, the drain electrode 12, the lower data pad electrode 36 and the upper storage electrode 22 are provided on the gate insulating film 44 by the second mask process.

More specifically, the gate insulating film 44, an amorphous silicon layer, a $n^+$ amorphous silicon layer and a source/drain metal layer are sequentially provided on the lower substrate 42 provided with the gate metal patterns by deposition techniques such as plasma enhanced chemical vapor deposition (PECVD) and sputtering, etc. Herein, the gate insulating film 44 is formed from an inorganic insulating material such as silicon nitride ($SiN_x$) or silicon oxide ($SiO_x$). The source/drain metal is selected from molybdenum (Mo), titanium (Ti), tantalum (Ta) or a molybdenum alloy, etc.

Then, a photo-resist pattern is formed on the source/drain metal layer by photolithography using a second mask. In this case, a diffractive exposure mask having a diffractive exposing part at a channel portion of the thin film transistor is used as a second mask, thereby allowing a photo-resist pattern in the channel portion to have a lower height than the photo-resist pattern in the source/drain pattern portions.

Subsequently, the source/drain metal layer is patterned by wet etching using the photo-resist pattern to thereby provide the source/drain metal patterns including the data line 4, the source electrode 10, the drain electrode 12 being integral to the source electrode 10 and the storage electrode 22.

Next, the $n^+$ amorphous silicon layer and the amorphous silicon layer are patterned at the same time by dry etching using the same photo-resist pattern to thereby provide the ohmic contact layer 48 and the active layer 14.

The photo-resist pattern having a relatively low height is removed from the channel portion by ashing and thereafter the source/drain metal pattern and the ohmic contact layer 48 of the channel portion are dry etched. Thus, the active layer 14 of the channel portion is exposed to disconnect the source electrode 10 from the drain electrode 12.

Then, the photo-resist pattern left on the source/drain metal pattern group is removed by stripping.

Referring to FIG. 3C, the protective film 50 including the first and fourth contact holes 16, 24, 30 and 38 are formed on the gate insulating film 44 provided with the source/drain metal patterns.

More specifically, the protective film 50 is formed on the entire gate insulating film 44 provided with the source/drain metal patterns by a deposition technique such as PECVD.

Then, the protective film 50 is patterned by photolithography and etching using a third mask to thereby define the first to fourth contact holes 16, 24, 30 and 38. The first contact hole 16 passes through the protective film 50 and exposes the drain electrode 12, whereas the second contact hole 24 passes through the protective film 50 and exposes the storage electrode 22. The third contact hole 30 passes through the protective film 50 and the gate insulating film 44 and exposes the lower gate pad electrode 28. The fourth contact hole 38 passes through the protective film 50 and exposes the upper data pad electrode 36.

The protective film 50 is made from an inorganic insulating material identical to the gate insulating film 44, or an organic insulating material such as an acrylic organic compound having a small dielectric constant, BCB (benzocyclobutene) or PFCB (perfluorocyclobutane), etc.

Referring to FIG. 3D, transparent conductive film patterns including the pixel electrode 18, the upper gate pad electrode 32 and the upper data pad electrode 40 are provided on the protective film 50 by the fourth mask process.

A transparent conductive film is deposited over the entire protective film 50 by a deposition technique such as sputtering, etc. Then, the transparent conductive film is patterned by photolithography and etching using a fourth mask to thereby provide the transparent conductive film patterns including the pixel electrode 18, the upper gate pad electrode 32 and the upper data pad electrode 40. The pixel electrode 18 is electrically connected, via the first contact hole 16, to the drain electrode 12 while being electrically connected, via the second contact hole 24, to the storage electrode 22 overlapping with the pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. Herein, the transparent conductive film is formed from indium-tin-oxide (ITO), tin-oxide (TO) or indium-zinc-oxide (IZO).

As described above, the conventional thin film transistor array substrate and the fabricating method thereof as mentioned above uses four mask processes, thereby reducing the number of fabricating processes and hence a manufacturing cost in comparison with fabrication techniques using a five mask process. However, since the four mask process still has a complicated fabricating process which limits the cost reduction, it is desirable to simplify the fabricating process to further reduce the manufacturing cost.

SUMMARY

A liquid crystal display panel according to one aspect of the present invention includes a color filter array substrate having a color filter array formed on an upper substrate; and a thin film transistor array substrate having a gate line and a data line intersecting each other on a lower substrate with having a gate insulating film therebetween, a thin film transistor provided at an intersection between the gate line and the data line, a pixel electrode connected to the thin film transistor, a pad connected, via a contact hole, to a signal line including the gate line and/or the data line and formed from a transparent conductive film and a protective film provided at an area overlapping with the color filter array substrate to expose the transparent conductive film included in the pad, and joined in opposition to the color filter array substrate, wherein the contact hole is formed to expose the end of the pad and/or the signal line as well as an area adjacent thereto.

In the liquid crystal display panel, the pad includes a gate pad connected to the gate line and a data pad connected to the data line.

Herein, the gate pad and/or the data pad includes the transparent conductive film and a gate metal film formed on the transparent conductive film to expose at least a portion of the transparent conductive film.

Herein, the gate metal film contains molybdenum (Mo), copper (Cu), titanium (Ti) and/or tantalum (Ta).

The liquid crystal display panel further includes a storage capacitor including the gate line and a storage electrode overlapping with the gate line in such a manner to be insulated from the gate line and connected to the pixel electrode.

The liquid crystal display panel further includes a semiconductor pattern provided under the data line, the storage electrode and the source and drain electrodes of the thin film transistor.

The contact hole passes through the semiconductor pattern, the gate insulating film and the gate metal film to expose the transparent conductive film of the data pad and a portion of the lower substrate.

The liquid crystal display panel further includes a common electrode for making an electric field along with the pixel electrode; a common pad for supplying the common electrode with a reference voltage; a common voltage supply line made from a metal different from the common pad; and a common contact hole for connecting the common voltage pad with the common voltage supply line and exposing the end of the common voltage pad and/or the common voltage supply line and an area adjacent thereto.

The liquid crystal display panel further includes a first shorting pattern connected to each signal line; a second shorting pattern connected to the first shorting patterns; and a shorting contact hole for exposing the end of the first and/or second shorting patterns and an area adjacent thereto to electrically connect the first shorting pattern with the second shorting pattern.

The liquid crystal display panel further includes an alignment film formed on the protective film in the same pattern as the protective film.

A thin film transistor array substrate according to another aspect of the present invention includes a static electricity proof device including a plurality of thin film transistors each connected to a signal line at a non-display area, wherein each of the plurality of thin film transistors includes a gate electrode formed from a first conductive layer; source and drain electrodes formed from a second conductive layer; a semiconductor layer defining a channel between the source electrode and the drain electrode; a contact hole for simultaneously exposing the first conductive layer of the corresponding thin film transistor and an adjacent portion of the second conductive layer of another thin film transistor; and a contact electrode, of a third conductive layer, formed within the contact hole to connect the exposed first conductive layer with the exposed second conductive layer.

Herein, each of the plurality of thin film transistor further includes another contact hole for simultaneously exposing adjacent portions of the first conductive layer and the second conductive layer of the corresponding thin film transistor; and another contact electrode, of the third conductive layer, formed within the other contact hole to connect the exposed first conductive layer with the exposed second conductive layer.

The thin film transistor array substrate further includes first and second shorting bars for testing the signal line at the non-display area, wherein each of the first and second shorting bars includes a plurality of first and second shorting patterns formed from the first and/or second conductive layers connected to the signal line; a first common shorting pattern formed from a conductive layer identical to the plurality of first shorting patterns to be commonly connected; a second common shorting pattern formed from a conductive layer different from the plurality of second shorting patterns to cross the first shorting pattern; another contact hole for simultaneously exposing adjacent portions of the second shorting pattern and the second common shorting pattern; and another contact electrode, of the third conductive layer, formed within another contact hole to connect the exposed second shorting pattern with the exposed common shorting pattern.

Herein, each of the contact holes passes through a gate insulating film on the first conductive layer and a protective film on the second conductive layer, and each of the contact electrodes contacts the protective film within the corresponding contact hole.

The semiconductor layer is extended along the second conductive layer.

Each of the contact holes further exposes a portion of the semiconductor under the second conductive layer.

The signal line includes the gate line and/or the data line.

A thin film transistor array substrate according to still another aspect of the present invention includes a first conductive layer formed on a substrate; a first insulating layer formed on the first conductive layer; a contact hole passing through the first insulating layer to simultaneously expose the first conductive layer and an adjacent area of the first conductive layer; and a second conductive layer connected, via the contact hole, to the first conductive layer.

Herein, the first conductive layer is signal line of a gate line and/or a data line, and the second conductive layer is a pad connected to the signal line.

The thin film transistor array substrate further includes a third conductive layer formed on the first insulating layer and connected, via the contact hole, to the second conductive layer; and a second insulating layer formed on the third conductive layer and exposed through the contact hole along with an adjacent portion of the third conductive layer.

Herein, the second conductive layer is formed within a contact hole defined by the first and second insulating layers.

A method of fabricating a liquid crystal display panel according to still another aspect of the present invention includes providing a color filter array substrate; and providing a thin film transistor array substrate opposed to the color filter array substrate and having a gate line and a data line intersecting each other on a lower substrate with having a gate insulating film therebetween, a thin film transistor provided at an intersection between the gate line and the data line, a pixel electrode connected to the thin film transistor, a pad connected, via a contact hole, to a signal line including the gate line and/or the data line and formed from a transparent conductive film and a protective film provided at an area overlapping with the color filter array substrate to expose the transparent conductive film; joining the thin film transistor array substrate with the color filter array substrate by a sealant to expose a pad area including a gate pad and a data pad; and removing the protective film using the color filter array substrate as a mask to expose a transparent conductive film of the pad area, wherein the contact hole is formed to expose the end of the pad and/or the signal line and an area adjacent thereto.

The method further includes providing a common electrode for making an electric field along with the pixel electrode; providing a common voltage pad for supplying the common electrode with a driving voltage; providing a common voltage supply line made from a metal different from the common pad; and providing a common contact hole for connecting the common voltage pad with the common voltage supply line and exposing the end of any one of the common voltage pad and the common voltage supply line and an area adjacent thereto.

The method further includes providing a first shorting pattern connected to the signal line; providing a second shorting pattern commonly connected to the plurality of shorting patterns; and providing a shorting contact hole for exposing the end of the first and/or second shorting patterns and an area adjacent thereto to electrically connect the first shorting pattern with the second shorting pattern.

Providing the thin film transistor array substrate comprises forming gate patterns including a gate line, a gate electrode, a gate pad and data pad, each of which includes a transparent conductive film, and a pixel electrode on the substrate; forming a semiconductor pattern having the contact hole exposing the end of the data pad and an area adjacent thereto and a gate insulating pattern on the substrate provided with the gate patterns and the pixel electrode and exposing the transparent conductive films included in the data pad, the gate pad and the pixel electrode; forming a data pattern including a data line, a source electrode and a drain electrode connected, via the contact hole, to the data pad on the substrate provided with the semiconductor pattern and the gate insulating pattern; and forming a protective film on the substrate provided with the data pattern.

Herein, the gate pad and/or the data pad includes the transparent conductive film; and a gate metal film formed on the transparent conductive film to expose at least a portion of the transparent conductive film.

Herein, the gate metal film contains molybdenum (Mo), copper (Cu), titanium (Ti) and/or tantalum (Ta).

A method of fabricating a thin film transistor array substrate according to still another aspect of the present invention includes providing gate patterns including a gate line, a gate electrode, a gate pad and data pad, each of which includes a transparent conductive film, and a pixel electrode on the substrate; providing a semiconductor pattern and a gate insulating pattern on the substrate provided with the gate patterns and the pixel electrode and exposing at least portion of the transparent conductive films included in the data pad, the gate pad and the pixel electrode; providing a data pattern including a data line, a source electrode and a drain electrode connected, via the contact hole, to the data pad on the substrate provided with the semiconductor pattern and the gate insulating pattern; providing a protective film on the entire substrate to protect the thin film transistor; providing an alignment film on the protective film at the remaining area other than a pad area including the gate pad and the data pad; and removing the protective film formed to cover the pad area using the alignment film as a mask, thereby exposing the transparent conductive film included in the pad area, wherein the contact hole is formed to expose the end of the data pad and/or the data line and an area adjacent thereto.

The method further includes providing a common electrode for making an electric field along with the pixel electrode; providing a common voltage pad for supplying the common electrode with a driving voltage; providing a common voltage supply line made from a metal different from the common pad; and providing a common contact hole for connecting the common voltage pad with the common voltage supply line and exposing the end of any one of the common voltage pad and the common voltage supply line and an area adjacent thereto.

The method further includes providing a first shorting pattern connected to the signal line; providing a second shorting pattern commonly connected to the plurality of shorting patterns; and providing a shorting contact hole for exposing the end of the first and/or second shorting patterns and an area adjacent thereto to electrically connect the first shorting pattern with the second shorting pattern.

Herein, the gate pad and/or the data pad includes the transparent conductive film; and a gate metal film formed on the transparent conductive film to expose at least portion of the transparent conductive film.

Herein, the gate metal film contains molybdenum (Mo), copper (Cu), titanium (Ti) and/or tantalum (Ta).

A method of fabricating a thin film transistor array substrate, including a static electricity proof device including a plurality of thin film transistors each connected to a signal line at a non-display area, according to still another aspect of the present invention includes providing first and second conductive layers having a gate insulating film therebetween and a thin film transistor including a semiconductor layer, along with the signal line, on a substrate; providing a protective film covering the plurality of thin film transistor; providing a contact hole for passing through the protective film and the gate insulating film to simultaneously expose the first conductive layer of the corresponding thin film transistor and an adjacent portion of the second conductive layer of other thin film transistor; and providing a contact electrode, of a third conductive layer, within the contact hole to connect the exposed first conductive layer with the exposed second conductive layer.

The method further includes providing another contact hole for simultaneously exposing adjacent portions of the first conductive layer and the second conductive layer of the corresponding thin film transistor; and providing another contact electrode, of the third conductive layer, within the other contact hole to connect the exposed first conductive layer with the exposed second conductive layer.

The method further includes forming first and second shorting patterns of first and second shorting bars from the first and/or second conductive layers to be connected to the signal line at the non-display area; forming a common shorting pattern of the first shorting bar from a conductive layer identical to the plurality of first shorting patterns to be commonly connected; forming a common shorting pattern of the second shorting bar crossing the first shorting pattern from a conductive layer different from the plurality of second shorting patterns; forming another contact hole for passing the protective film and the gate insulating film to simultaneously expose adjacent portions of the second shorting pattern and the common shorting pattern of the second shorting bar; and forming another contact electrode, of the third conductive layer, within another contact hole to connect the exposed second shorting pattern with the exposed common shorting pattern of the second shorting bar.

Herein, forming the corresponding contact hole and the corresponding contact electrode includes forming a photo-resist pattern on the protective film; etching the protective film and the gate insulating film exposed through the photo-resist pattern; forming the third conductive layer on the substrate provided with the photo-resist pattern; and removing the photo-resist pattern along with the third conductive layer thereon.

Providing the plurality of thin film transistors includes forming a gate electrode of the thin film transistor from the first conductive layer; forming the gate insulating film;

forming the semiconductor layer; and forming the source and drain electrodes of the thin film transistor from the second conductive layer.

Herein, the semiconductor layer and the source and drain electrodes are formed by the same mask, and the semiconductor layer is extended along the second conductive layer.

Herein, each of the contact holes further exposes a portion of the semiconductor under the second conductive layer.

Forming the signal line includes forming a gate line of the first conductive layer along with the gate electrode; and forming a data line of the second conductive layer along with the source and drain electrodes.

A method of fabricating a thin film transistor array substrate according to still another aspect of the present invention includes providing a first conductive layer on a substrate; providing a first insulating layer on the first conductive layer; providing a contact hole passing through the first insulating layer to simultaneously expose the first conductive layer and an adjacent portion of the first conductive layer; and providing a second conductive layer connected, via the contact hole, to the first conductive layer.

Herein, providing the first conductive layer on the substrate includes forming at least one signal line of a gate line and a data line on the substrate, and wherein providing the second conductive layer connected to the first conductive layer includes a pad connected to the signal line.

The method further includes providing a third conductive layer formed on the first insulating film and connected, via the contact hole, to the second conductive layer; and providing a second insulating formed on the third conductive layer and exposed through the contact hole along with an adjacent portion of the third conductive layer.

Herein, the second conductive layer is formed within the contact hole defined by the first and second insulating layers.

BRIEF DESCRIPTION OF THE DRAWINGS

The following detailed description of the embodiments of the present invention refers to the accompanying drawings, in which:

FIG. 5 is a section view of the thin film transistor array substrate taken along the II-II' line in FIG. 4;

FIG. 6A to FIG. 6C are section views illustrating a method of fabricating the thin film transistor array substrate shown in FIG. 5;

FIG. 7 is a section view for explaining an under-cut phenomenon of the contact hole area for connecting the data pad with the data line shown in FIG. 6B;

FIG. 24A and FIG. 24B are a plan view and a section view for explaining a first mask process, respectively, in a method of fabricating the thin film transistor array substrates shown in FIG. 22 and FIG. 23;

FIG. 26A to FIG. 26D are section views for explaining the second mask process in detail;

FIG. 27A and FIG. 27B are a plan view and a section view for explaining a third mask process, respectively, in a method of fabricating the thin film transistor array substrates shown in FIG. 22 and FIG. 23;

FIG. 28A to FIG. 28D are section views for explaining the third mask process in detail;

FIG. 31A and FIG. 31B are a plan view and a section view for explaining a first mask process, respectively, in a method of fabricating the thin film transistor array substrates shown in FIG. 29 and FIG. 30;

FIG. 32A and FIG. 32B are a plan view and a section view for explaining a second mask process, respectively, in a method of fabricating the thin film transistor array substrates shown in FIG. 29 and FIG. 30;

FIG. 35A to FIG. 35D are section views for explaining the fourth mask process in detail.

DETAILED DESCRIPTION

Reference will now be made in detail to the embodiments of the present invention, examples of which are illustrated in the accompanying drawings.

Hereinafter, embodiments of the present invention will be described in detail with reference to FIGS. 4 to 35D.

Figure 1:
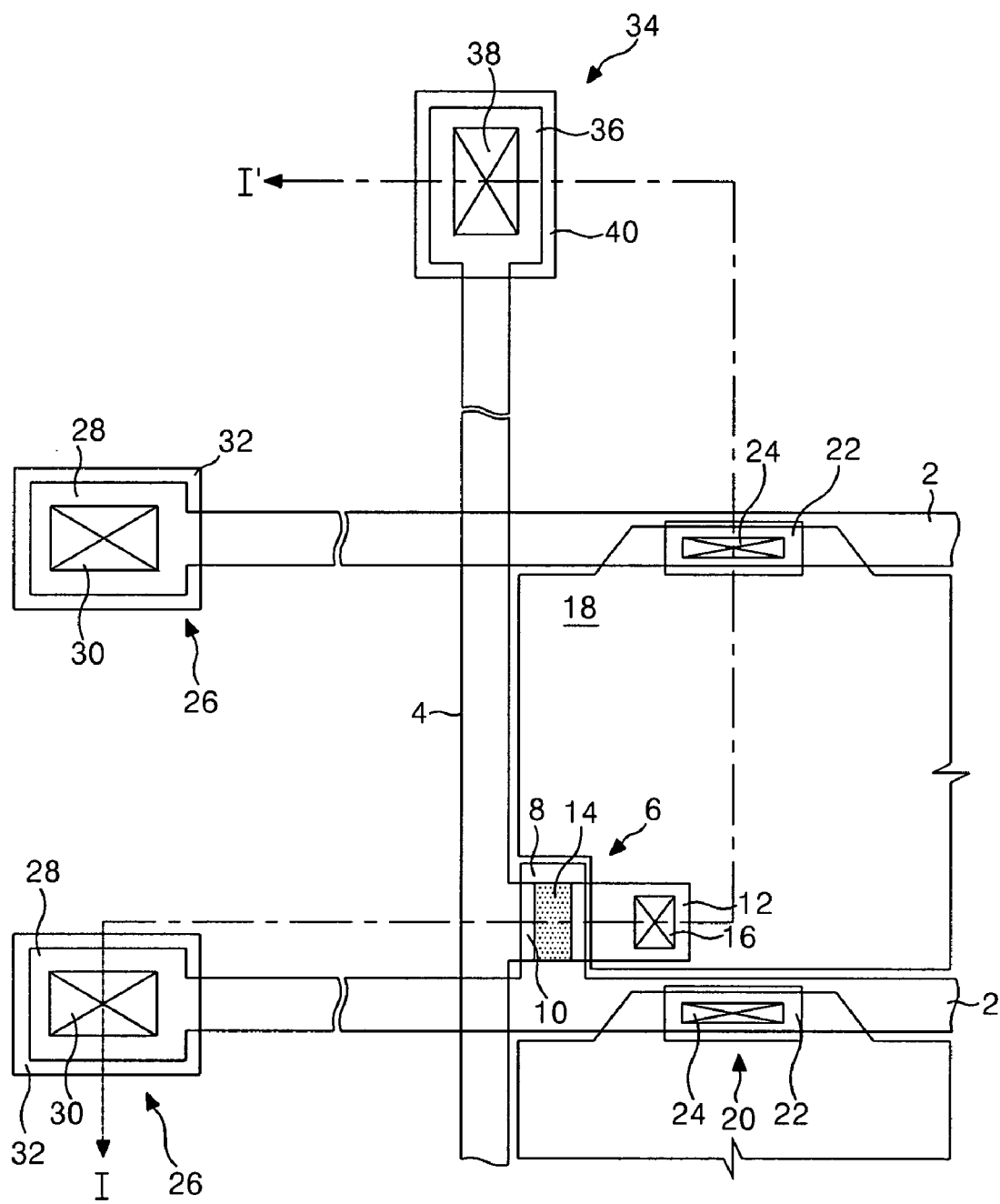
FIG. 1 is a plan view showing a portion of a conventional thin film transistor array substrate.
Figure 2:
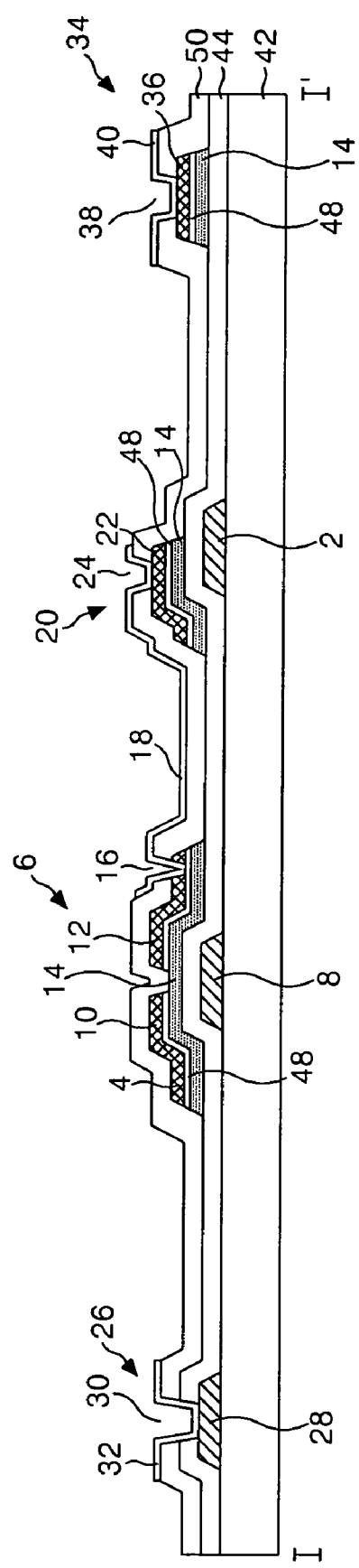
FIG. 2 is a section view of the thin film transistor array substrate taken along the I-I' line in FIG. 1.
Figure 3A:
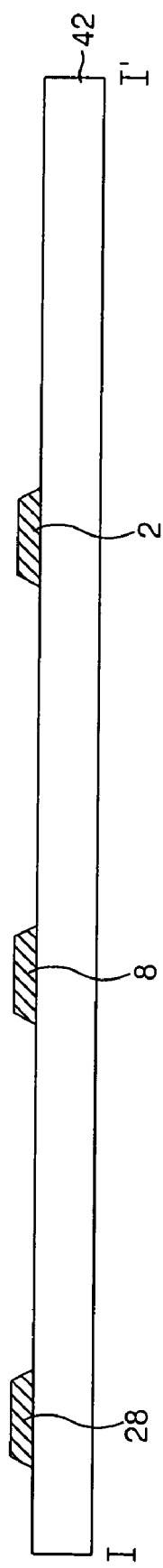
FIG. 3A to FIG. 3D are section views illustrating a method of fabricating the thin film transistor array substrate shown in FIG. 2.
Figure 3B:
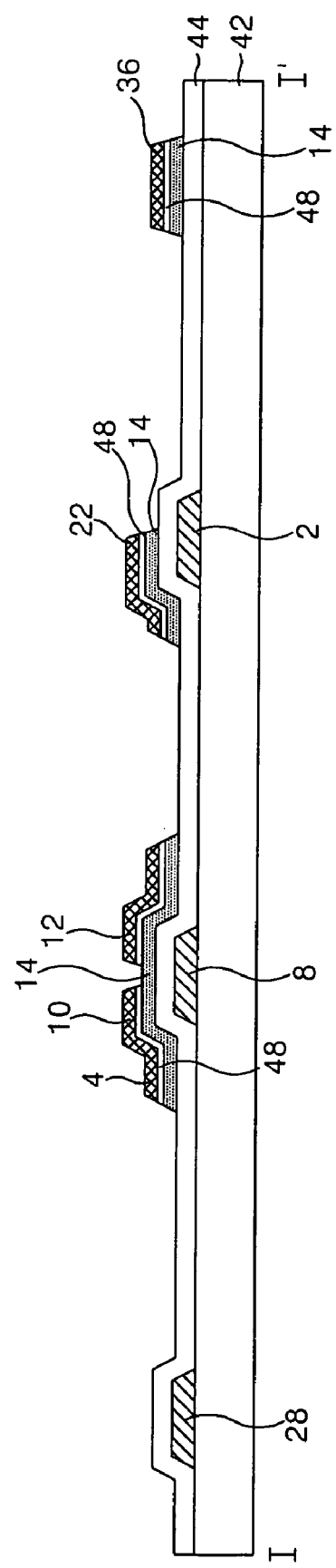
Figure 3C:
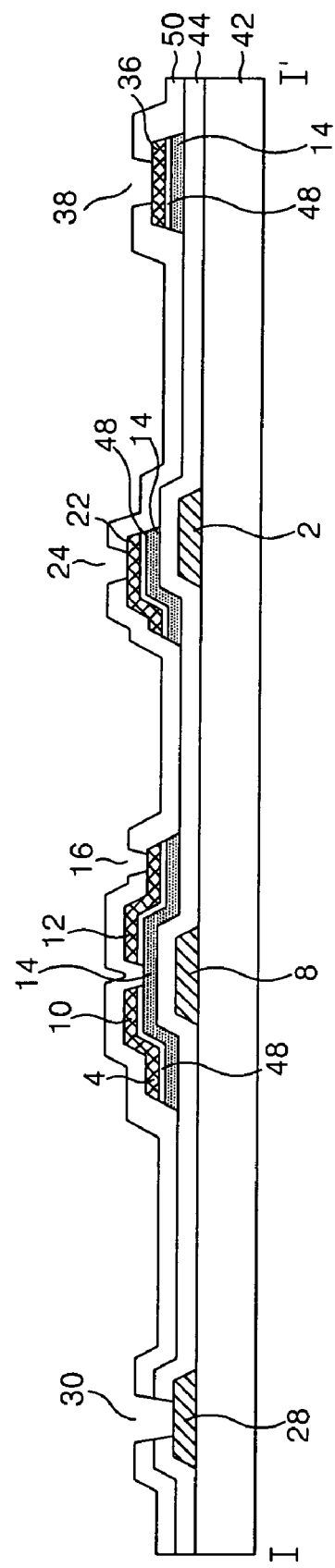
Figure 3D:
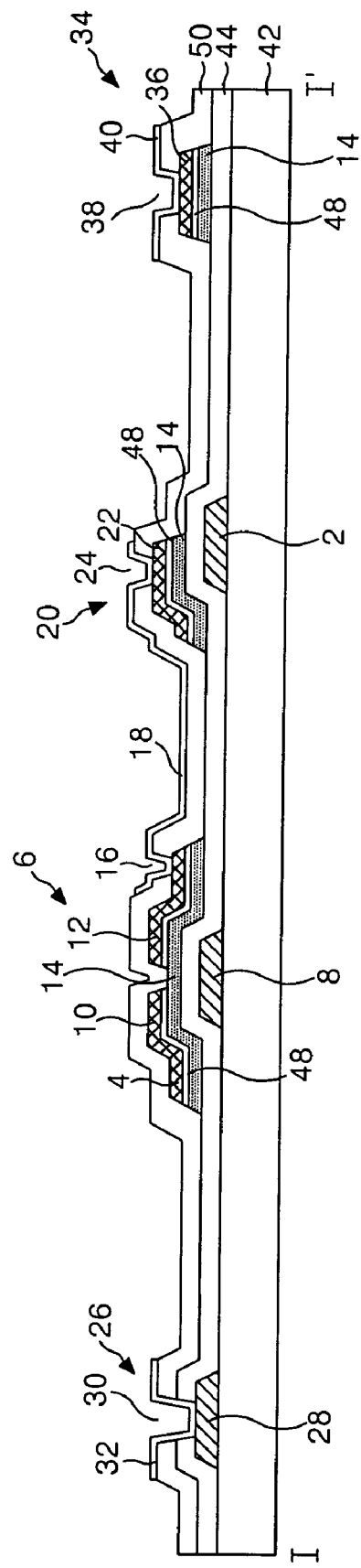
Figure 4:
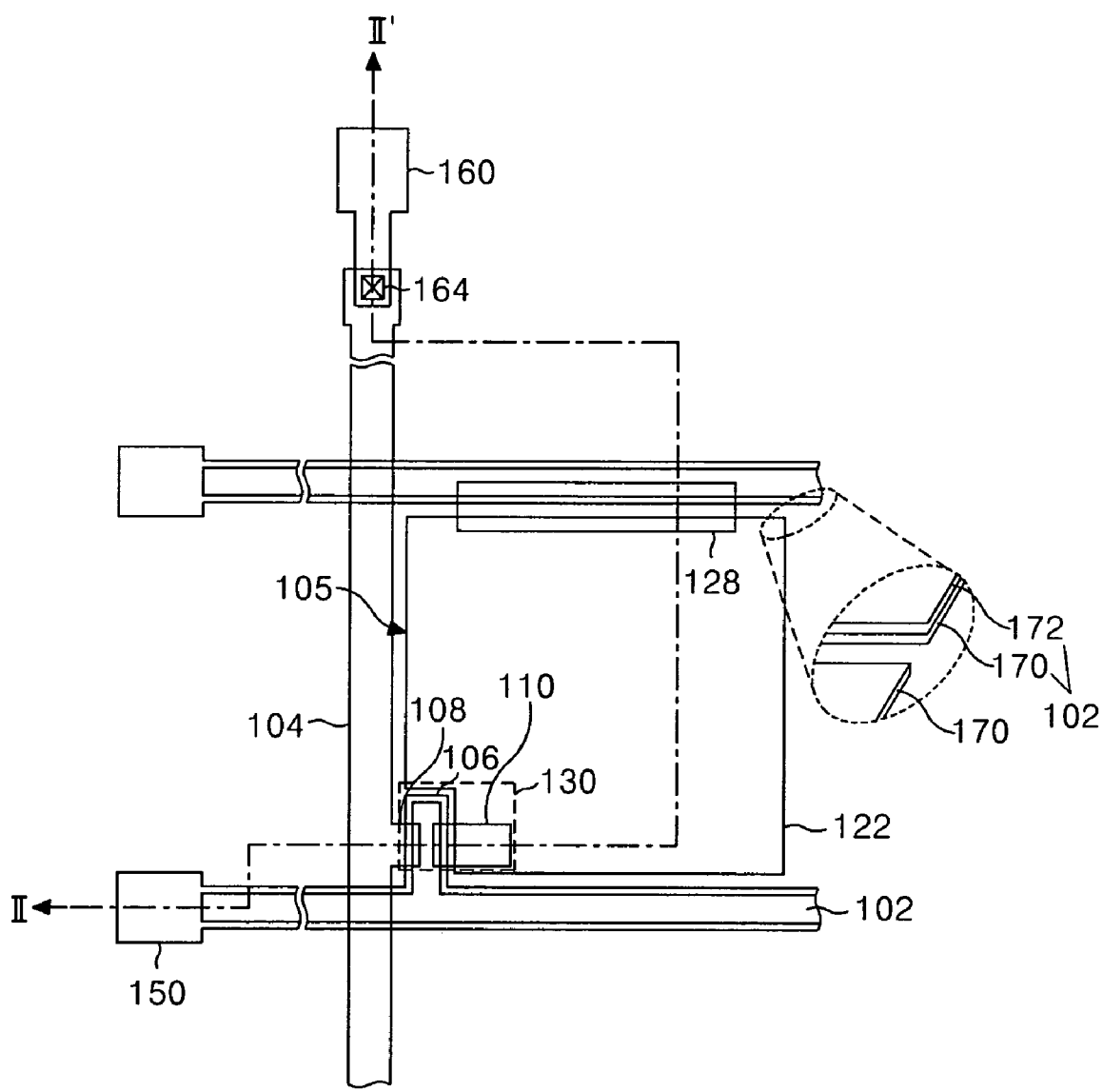
FIG. 4 is a plan view showing a structure of a thin film transistor array substrate according to a first embodiment of the present invention.

FIG. 4 is a plan view illustrating a thin film transistor array substrate according to a first embodiment of the present invention, and FIG. 5 is a section view of the thin film transistor array substrate taken along the II-II' line in FIG. 4.

Referring to FIG. 4 and FIG. 5, the thin film transistor array substrate includes a gate line 102 and a data line 104 provided on a lower substrate 101 to intersect each other with having a gate insulating film 112 therebetween, a thin film transistor 130 provided at each intersection, and a pixel electrode 122 provided at a pixel area 105 having a crossing structure, a storage capacitor 140 provided at an overlapped portion between the pixel electrode 122 and the gate line 102, a gate pad 150 extended from the gate line 102, and a data pad 160 extended from the data line 104.

The thin film transistor 130 allows a pixel signal on the data line 104 to be charged into the pixel electrode 122 and be kept in response to a scanning signal on the gate line 102. To this end, the thin film transistor 130 includes a gate electrode 106 connected to the gate line 102, a source electrode 108 connected to the data line 104, and a drain electrode 110 connected to the pixel electrode 122. Further, the thin film transistor 130 includes semiconductor patterns 114 and 116 overlapping with the gate electrode 106 with having a gate insulating pattern 112 therebetween and defining a channel between the source electrode 108 and the drain electrode 110.

The gate pattern including the gate electrode 106 and the gate line 102 has a transparent conductive film 170 and a structure in which a gate metal film 172 is disposed on the transparent conductive film 170.

The semiconductor pattern forms a channel between the source electrode 108 and the drain electrode 110, and includes an active layer 114 partially overlapping with the gate pattern with having the gate insulating film 112 therebetween. Further, the semiconductor pattern is formed on the active layer 114, and includes the data line 104, the storage electrode 128, the source electrode 108 and the drain electrode 110 and an ohmic contact layer 116. Such a semiconductor pattern is formed separately between the cells to thereby prevent signal interference between the cells caused by the semiconductor pattern.

The pixel electrode 122 is formed in the pixel area 105 by the transparent conductive film 170 to be directly connected to the drain electrode 110 of the thin film transistor 130.

Accordingly, a vertical electric field is formed between the pixel electrode 122 to which a pixel signal is applied via the thin film transistor 130 and a common electrode (not shown) supplied with a reference voltage. Such an electric field rotates liquid crystal molecules between the color filter array substrate and the thin film transistor array substrate owing to dielectric anisotropy of the liquid crystal molecules. Transmittance of light transmitted through the pixel area 105 is differentiated depending upon the extent of rotation of the liquid crystal molecules, thereby implementing a gray level scale.

The storage capacitor 140 consists of the gate line 102 and a storage electrode 128 overlapping with the gate line 102 with the gate insulating film 112, the active layer 114 and the ohmic contact layer 116 therebetween and directly connected to the pixel electrode 122. The storage capacitor 140 allows a pixel signal charged in the pixel electrode 122 to be stably maintained until the next pixel voltage is charged.

The gate pad 150 is connected to a gate driver (not shown) to apply a gate signal generated from the gate driver to the gate line 120. The gate pad 150 has a structure in which the transparent conductive film 170 extended from the gate line 102 is exposed.

The data pad 160 is connected to a data driver (not shown) to apply a data signal generated from the data driver to the data line 104. To this end, the data pad 160 is electrically connected, via a data contact hole 164, to the data line 104 formed from a data metal layer. Herein, the data pad 160 consists of the transparent conductive film 150, and the gate metal film 172 formed on the transparent conductive film 170 in an area overlapping with the data line 104. The data contact hole 164 has a narrower width than the data pad 160, and passes through the ohmic contact layer 116, the active layer 114, the gate insulating pattern 112 and the gate metal film 172 of the data pad 160 to expose the transparent conductive film 170 of the data pad 160.

Figure 6B:
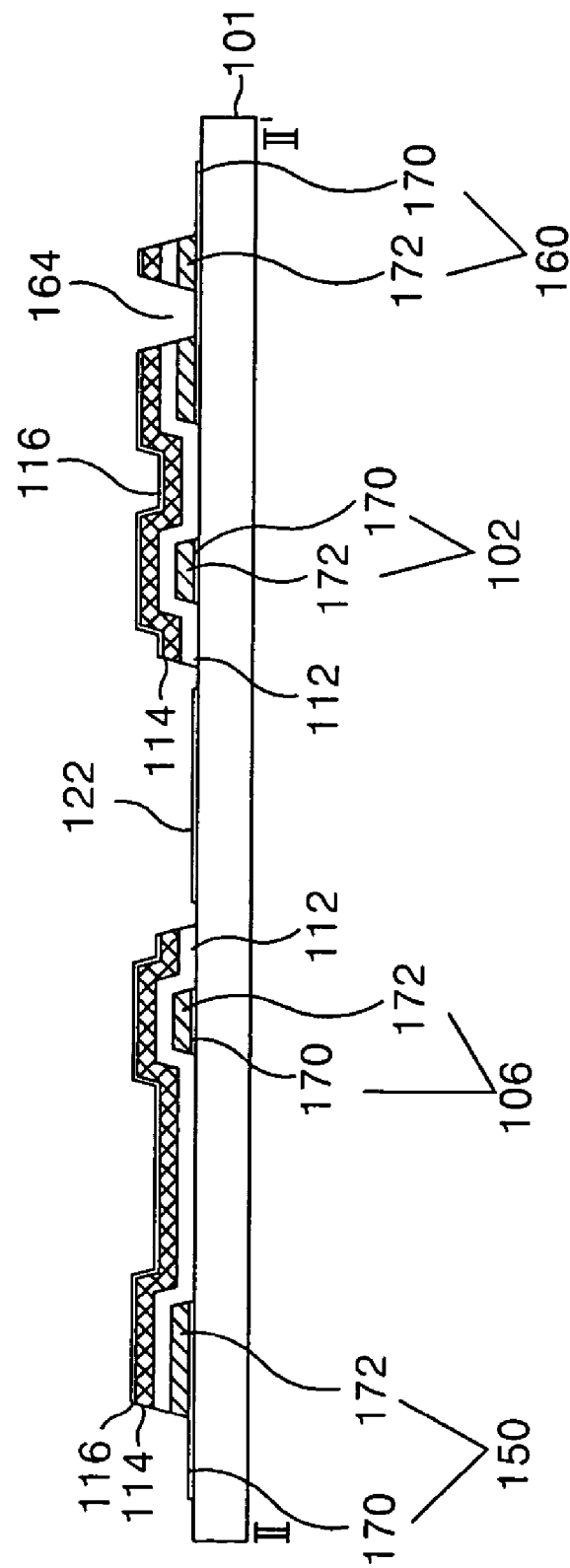
Figure 6C:
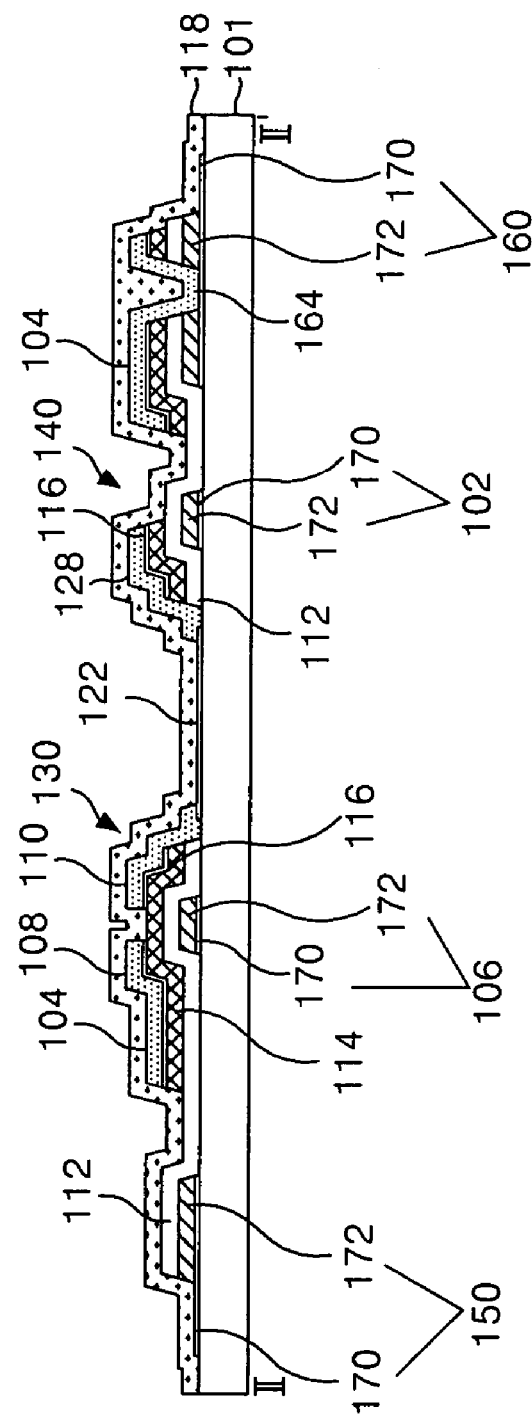

FIG. 6A to FIG. 6C are section views illustrating a method of fabricating the thin film transistor array substrate according to the first embodiment of the present invention.

Referring to FIG. 6A, the pixel electrode 122 and a gate pattern including the gate line 102, the gate electrode 106, the gate pad 150 and the data pad 160, each of which has a double-layer structure, are formed on the lower substrate 101 by the first mask process.

More specifically, the transparent conductive film 170 and the gate metal film 172 are sequentially formed by a deposition technique such as sputtering. Herein, the transparent conductive film 170 is made from a transparent conductive material such as ITO, TO, ITZO, IZO or the like while the gate metal film 172 is made from a metal such as an aluminum group metal including aluminum/neodymium (AlNd), molybdenum (Mo), copper (Cu), chrome (Cr), tantalum (Ta), titanium (Ti) or the like. Then, the transparent conductive film 170 and the gate metal layer 172 are patterned by photolithography and etching using a first mask to thereby provide the gate line 102, the gate electrode 106, the gate pad 150 and the data pad 160, each of which has a double-layer structure, and the pixel electrode 122 including the gate metal film 172.

Referring to FIG. 6B, a gate insulating pattern 112 and a semiconductor pattern including the active layer 114 and the ohmic contact layer 116 are formed on the lower substrate 101 provided with the gate pattern by the second mask process. The gate metal films 172 included in the data pad 160, the gate pad 150 and the pixel electrode 122 are removed to thereby expose the transparent conductive film 170. Further, the gate insulating pattern 112, the semiconductor patterns 114 and 116 and the data contact hole 164 passing through the gate metal film 172 of the data pad 160 are provided.

More specifically, the gate insulating film and the first and second semiconductor layers are sequentially formed on the lower substrate 101 provided with the gate pattern by a deposition technique such as PEVCD, sputtering or the like. Herein, the gate insulating film is formed from an inorganic insulating material such as silicon nitride ($SiN_x$) or silicon oxide ($SiO_x$). The first semiconductor layer is formed from amorphous silicon that is unintentionally doped (i.e. undoped) while the second semiconductor layer is formed from amorphous silicon doped with an N-type or P-type impurity. Then, the gate insulating film and the first and second semiconductor layers are patterned by photolithography and etching using a second mask to thereby provide a semiconductor pattern including the active layer 114 and the ohmic contact layer 116 and the gate insulating pattern 112 having the same pattern as the semiconductor pattern. In this case, the semiconductor pattern and the gate insulating pattern 112 are formed to expose the pixel electrode 122, the gate pad 150 and the data pad 160.

Subsequently, the gate insulating pattern 112 and the semiconductor patterns 114 and 116 are used as a mask to remove the exposed gate metal film 172 by wet etching. In other words, the gate metal films 172 included in the gate pad 150, the data pad 160 and the pixel electrode 122 are removed to expose the transparent conductive films 170. Further, the data contact hole 164 for exposing the transparent conductive film 170 included in the data pad 160 in an area to be connected to the data line 104 is provided.

Referring to FIG. 6C, a data pattern including the data line 104, the source electrode 108, the drain electrode 110 and the storage electrode 128 is formed on the lower substrate 101 provided with the gate insulating pattern 112 and the semiconductor patterns 114 and 116 by the third mask process.

More specifically, a data metal layer is sequentially formed on the lower substrate 101 provided with the semiconductor pattern by a deposition technique such as sputtering, etc. Herein, the data metal layer is formed from a metal such as molybdenum (Mo), copper (Cu) or the like. Then, the data metal layer is patterned by wet etching using a photo-resist pattern formed to have step coverage by photolithography employing a third mask as a mask, to thereby provide a data pattern including the storage electrode 128, the data line 104, the source electrode 108 connected to the data line 104 and the drain electrode 110. Further, the active layer 114 and the ohmic contact layer 116 are formed along the data pattern by dry etching using the photo-resist pattern. At this time, the active layer 114 and the ohmic contact layer 116 positioned in the remaining area (the area other than the area in which the active layer 114 and the ohmic contact layer 116 overlapping with the data pattern are present) are removed. This mitigates or prevents shorting between the cells caused by the semiconductor pattern including the active layer 114 and the ohmic contact layer 116.

Then, the data metal layer and the ohmic contact layer 116 provided in a channel portion of the thin film transistor are removed with the aid of the photo-resist pattern having a height lowered by ashing, to thereby disconnect the drain electrode 110 from the source electrode 108. Further, the photo-resist pattern left on the data pattern is removed by stripping.

Subsequently, a protective film 118 is formed at the front face of the substrate 101 provided with the data pattern. The protective film 118 is made from an inorganic insulating material identical to the gate insulating film 112, or an organic insulating material such as an acrylic organic compound having a small dielectric constant, BCB (benzocyclobutene) or PFCB (perfluorocyclobutane), etc.

Meanwhile, in a second mask process of the method of fabricating the thin film transistor array substrate according to the first embodiment of the present invention, the gate insulating film and the first and second semiconductor layers is patterned by dry etching and thereafter the gate metal film exposed by the gate insulating pattern and the semiconductor pattern is removed by wet etching. At this time, the gate insulating pattern 112, the data contact hole 164 passing through the gate insulating pattern 112, the semiconductor patterns 114 and 116 and the gate metal film 172 of the data pad 160 connect the data line 104 to the data pad 160. In this case, the gate insulating pattern 112 and the semiconductor patterns 114 and 116 have etching characteristics different from that of the gate metal film. Thus, as shown in FIG. 7, undercut occurs in which a first width w1 of the data contact hole 164 passing through the gate insulating pattern 112 and the semiconductor patterns 114 and 116 is narrower than a second width w2 of the data contact hole 164 passing through the gate metal film 172. Since this undercut causes the data line 104 to be shorted in the neighborhood of the gate metal film 172 of the data contact hole 164, the data line 104 fails to be electrically connected to the data pad 160. Accordingly, a data signal from the data pad 160 cannot be applied to the data line 104.

Figure 8:
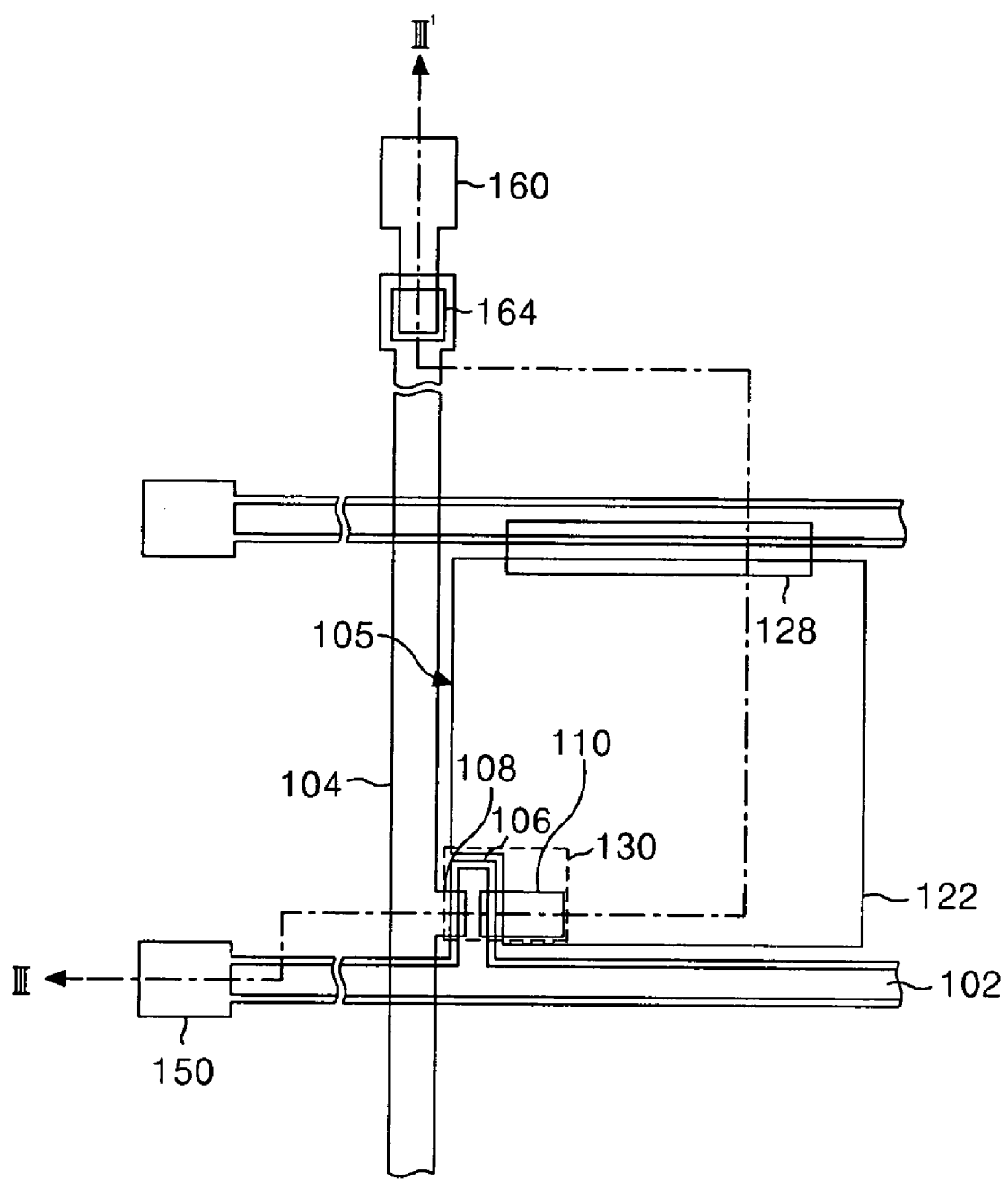
FIG. 8 is a plan view showing a structure of a thin film transistor array substrate according to a second embodiment of the present invention.
Figure 9:
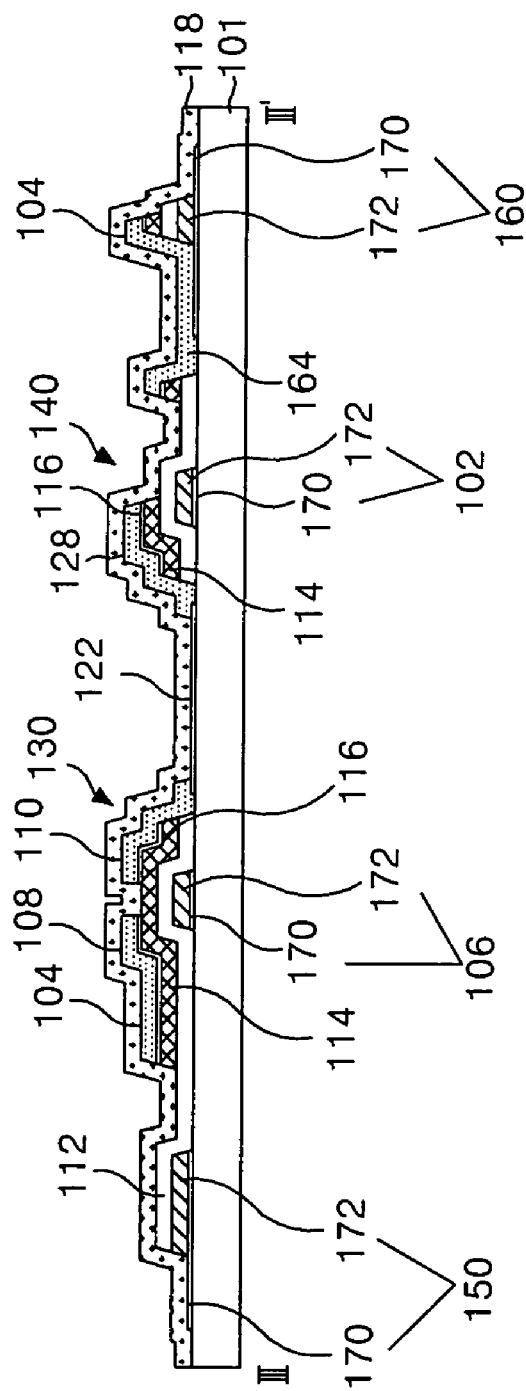
FIG. 9 is a section view of the thin film transistor array substrate taken along the III-III' line in FIG. 8.

FIG. 8 is a plan view illustrating a thin film transistor array substrate according to a second embodiment of the present invention, and FIG. 9 is a section view of the thin film transistor array substrate taken along the III-III' line in FIG. 8.

The thin film transistor array substrate shown in FIG. 8 and FIG. 9 has the same elements as that shown in FIG. 4 and FIG. 5 except that the data contact hole 164 is provided to expose the end of the data pad 160 and a portion of the lower substrate 101. Therefore, a detailed explanation as to the same elements will be omitted.

A data pad 160 is connected to a data driver (not shown) to apply a data signal generated from the data driver to a data line 104. To this end, the data pad 160 is electrically connected, via a data contact hole 164, to the data line 104 formed from a data metal layer. Herein, the data pad 160 consists of a transparent conductive film 150, and a gate metal film 172 formed on the transparent conductive film 170 in an area overlapping with the data line 104. The data contact hole 164 passes through an ohmic contact layer 116, an active layer 114, a gate insulating pattern 112 and a gate metal film 172 of the data pad 160 to expose the end of a transparent conductive film 170 of the data pad 160 and an area adjacent thereto.

Accordingly, the data line 104 is connected to the end of the data pad 160 exposed through the data contact hole 164 even though a second width of the data contact hole 164 is larger than a first width of the data contact hole 164 passing through the gate insulating pattern 112, the active layer 114 and the ohmic contact layer 116 to thereby generate undercut, so that it becomes possible to prevent breakage of the data line 104.

Figure 10A:
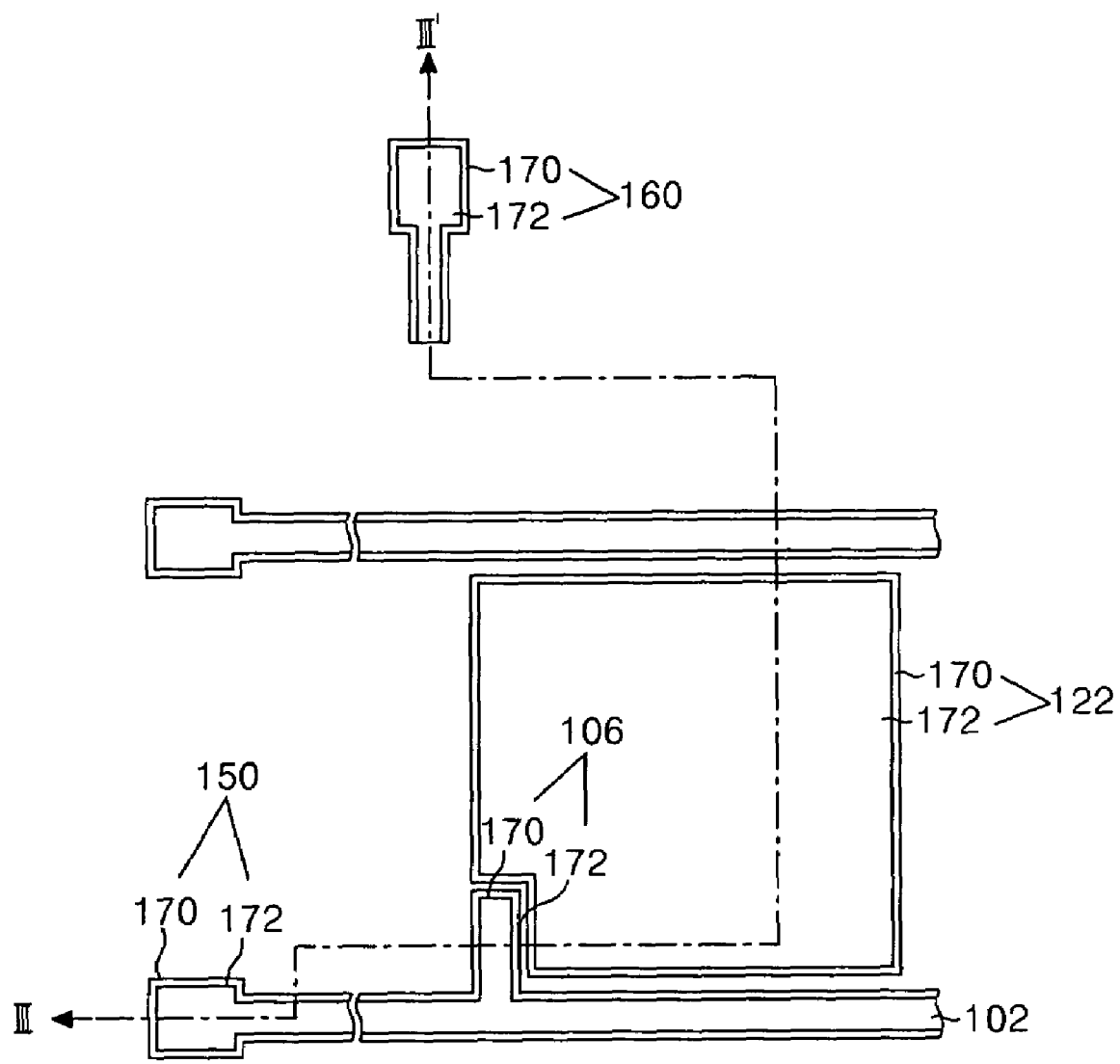
FIG. 10A and FIG. 10B are a plan view and a section view for explaining a first mask process, respectively, in a method of fabricating the thin film transistor array substrate according to the second embodiment of the present invention.
Figure 10B:
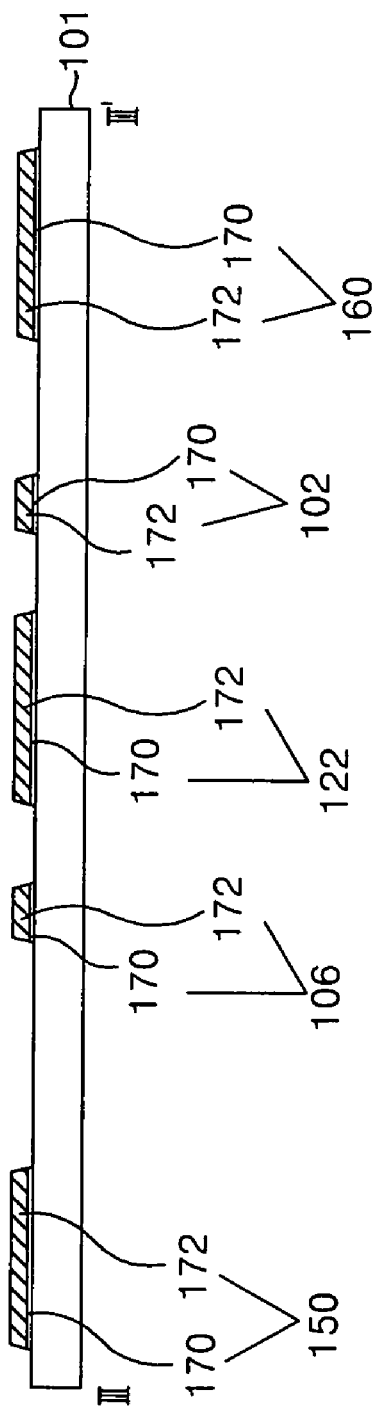

FIG. 10A and FIG. 10B are a plan view and a section view for explaining a first mask process, respectively, in a method of fabricating the thin film transistor array substrate according to the second embodiment of the present invention.

As shown in FIG. 10A and FIG. 10B, the pixel electrode 122 and a gate pattern including the gate line 102, the gate electrode 106, the gate pad 150 and the data pad 160, each of which has a double-layer structure, are formed on the lower substrate 101 by the first mask process.

More specifically, the transparent conductive film 170 and the gate metal film 172 are sequentially formed by a deposition technique such as sputtering. Herein, the transparent conductive film 170 is made from a transparent conductive material such as ITO, TO, ITZO, IZO or the like while the gate metal film 172 is made from a metal such as an aluminum group metal including aluminum/neodymium (AlNd), molybdenum (Mo), copper (Cu), chrome (Cr), tantalum (Ta), titanium (Ti) or the like. Then, the transparent conductive film 170 and the gate metal layer 172 are patterned by photolithography and etching using a first mask to thereby provide the gate pattern including the gate line 102, the gate electrode 106, the gate pad 150 and the data pad 160, each of which has a double-layer structure, and the pixel electrode 122 including the gate metal film 172.

Figure 11A:
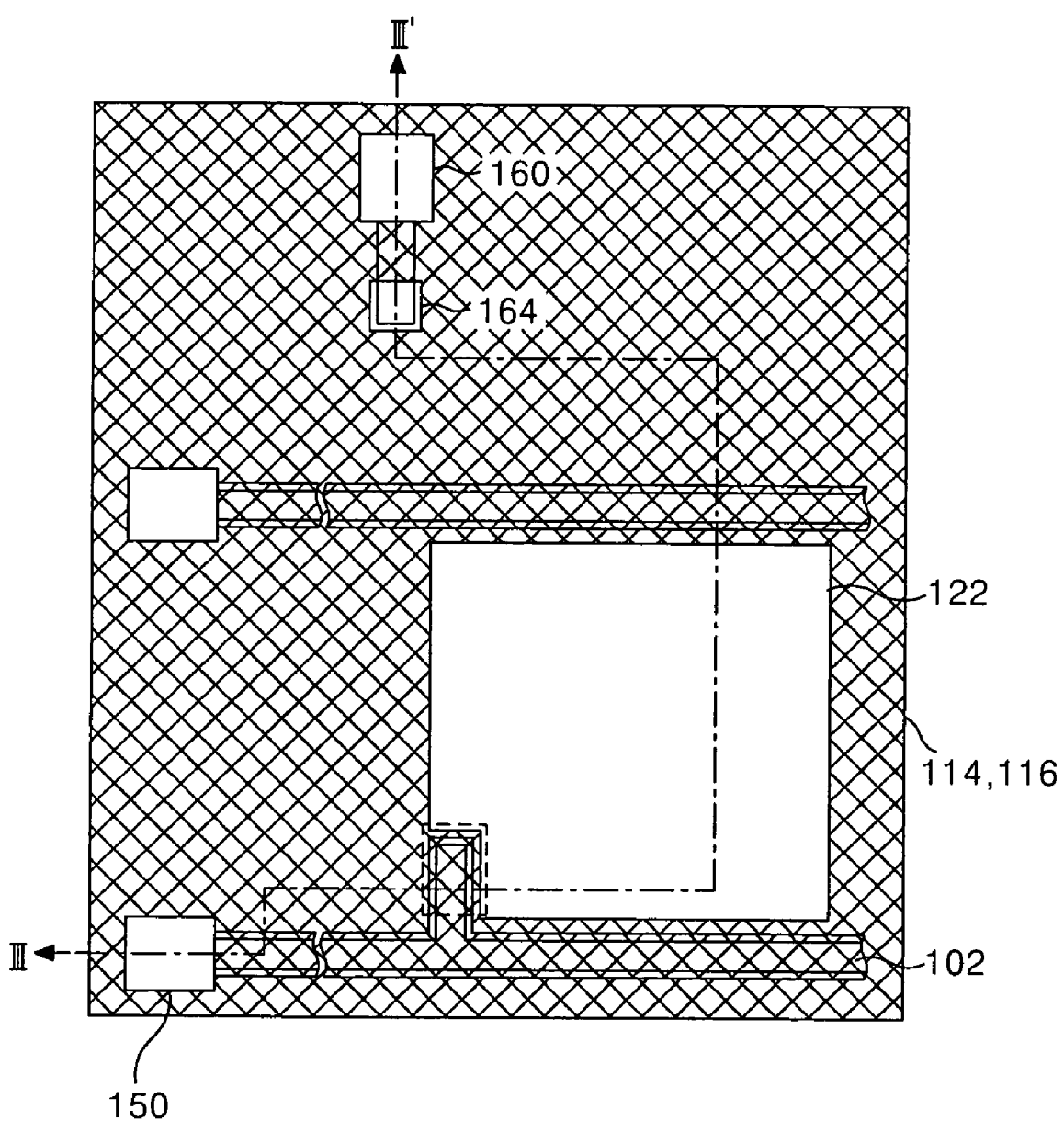
FIG. 11A and FIG. 11B are a plan view and a section view for explaining a second mask process, respectively, in a method of fabricating the thin film transistor array substrate according to the second embodiment of the present invention.
Figure 11B:
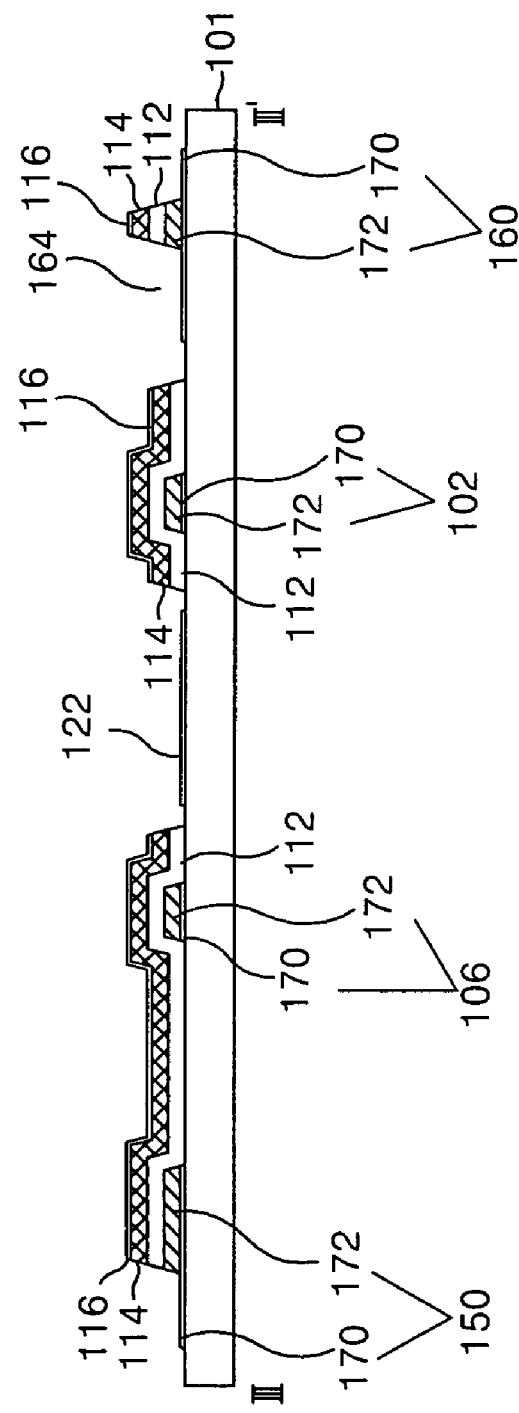

FIG. 11A and FIG. 11B are a plan view and a section view for explaining a second mask process, respectively, in a method of fabricating the thin film transistor array substrate according to the second embodiment of the present invention.

As shown in FIG. 11A and FIG. 11B, a gate insulating pattern 112 and a semiconductor pattern including the active layer 114 and the ohmic contact layer 116 are formed on the lower substrate 101 provided with the gate pattern by the second mask process. The gate metal films 172 included in the data pad 160, the gate pad 150 and the pixel electrode 122 are removed to thereby expose the transparent conductive film 170.

More specifically, the gate insulating film and the first and second semiconductor layers are sequentially formed on the lower substrate 101 provided with the gate pattern by a deposition technique such as PEVCD, sputtering or the like. Herein, the gate insulating film is formed from an inorganic insulating material such as silicon nitride ($SiN_x$) or silicon oxide ($SiO_x$). The first semiconductor layer is formed from undoped amorphous silicon while the second semiconductor layer is formed from amorphous silicon doped with an N-type or P-type impurity. Then, the gate insulating film and the first and second semiconductor layers are patterned by photolithography and etching using a second mask to thereby provide a gate insulating pattern 112 formed in the remaining area excluding the pixel electrode 122, the gate pad 150 and the data pad 160 and a semiconductor pattern including the active layer 114 and the ohmic contact layer 116 and having the same pattern as the gate insulating pattern 112. Thus, the pixel electrode 122, the gate pad 150 and the data pad 160 are formed to be exposed by the gate insulating pattern 112 and the semiconductor patterns 114 and 116. The exposed gate metal films 172 of the pixel electrode 122, the gate pad 150 and the data pad are removed by using the gate insulating film 112 as a mask to thereby expose the transparent conductive films 170 included in the data pad 160, the gate pad 150 and the pixel electrode 122.

Figure 12A:
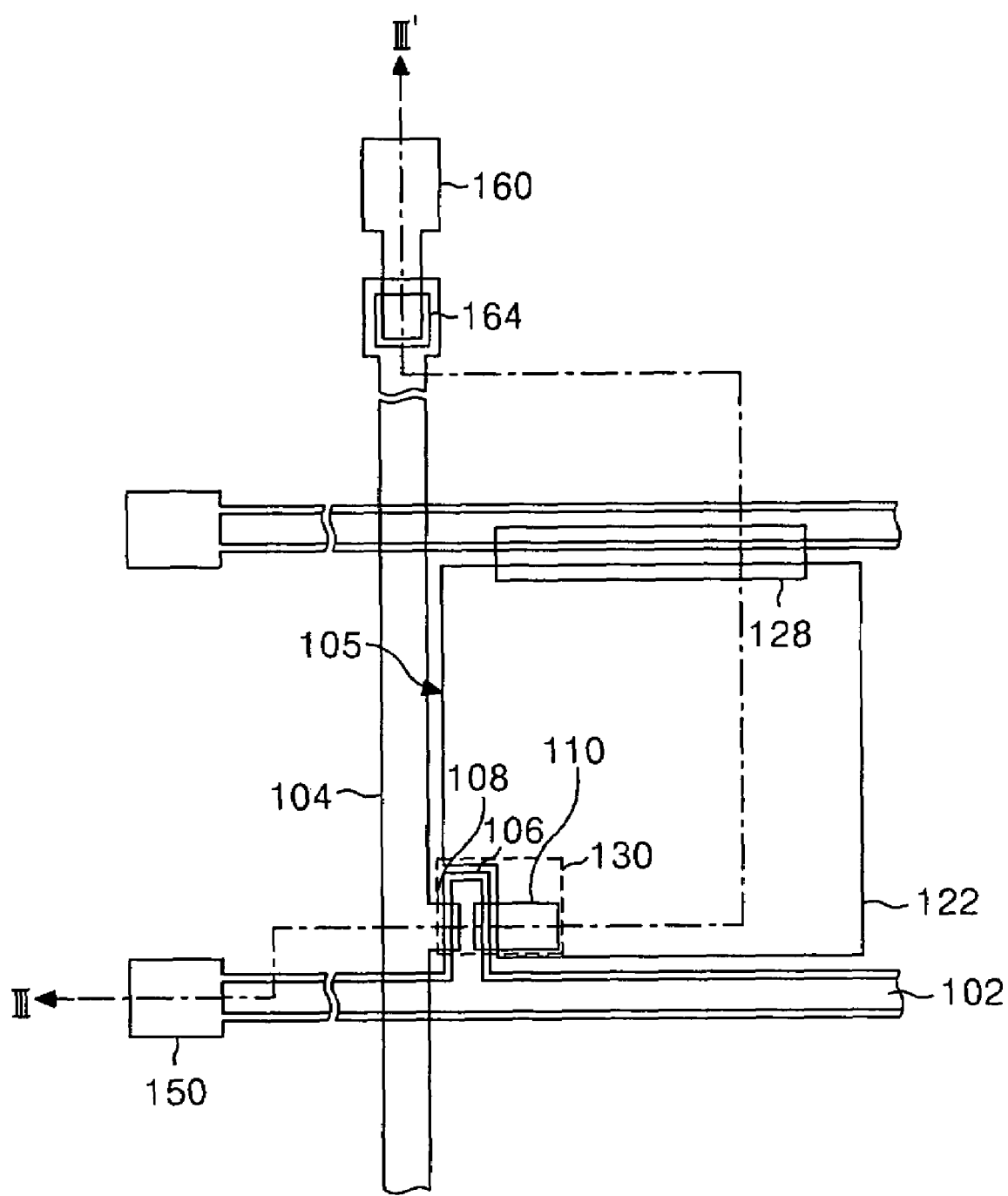
FIG. 12A and FIG. 12B are a plan view and a section view for explaining a third mask process, respectively, in a method of fabricating the thin film transistor array substrate according to the second embodiment of the present invention.
Figure 12B:
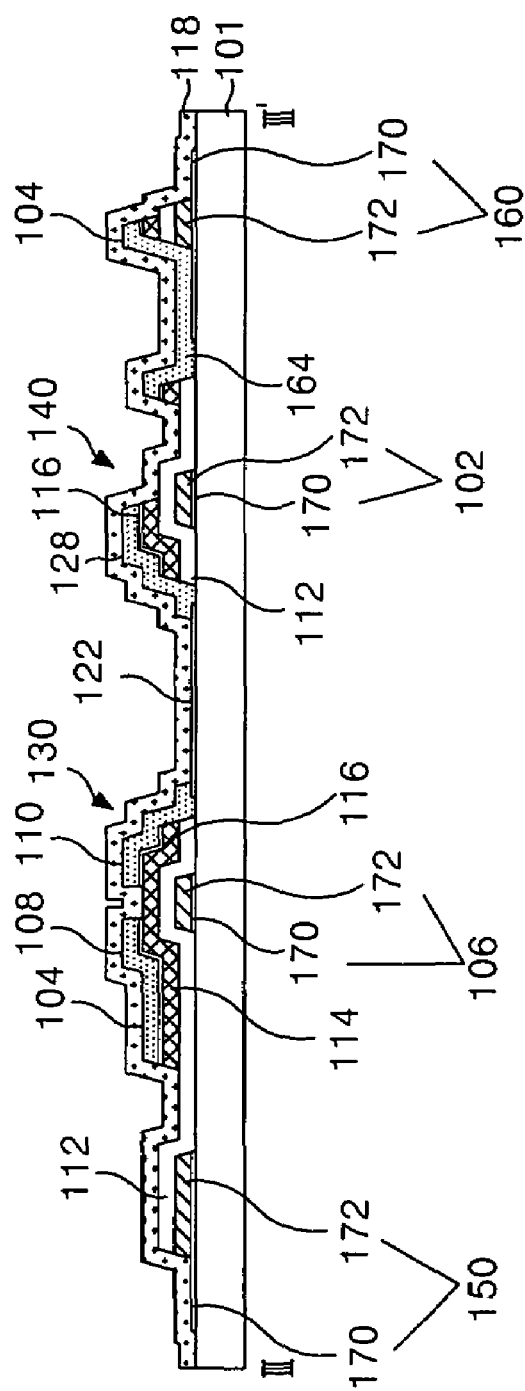

FIG. 12A and FIG. 12B are a plan view and a section view for explaining a third mask process, respectively, in a method of fabricating the thin film transistor array substrate according to the second embodiment of the present invention.

As shown in FIG. 12A and FIG. 12B, a data pattern including the data line 104, the source electrode 108, the drain electrode 110 and the storage electrode 128 is formed on the lower substrate 101 provided with the gate insulating pattern 112 and the semiconductor patterns 114 and 116 by the third mask process. Further, the semiconductor patterns 114 and 116 are formed along the data line 104, the source electrode 108, the drain electrode 110 and the storage electrode 128 at the lower portion thereof.

Such a third mask process will be described in detail with reference to FIG. 13A to FIG. 13E below.

Figure 13A:
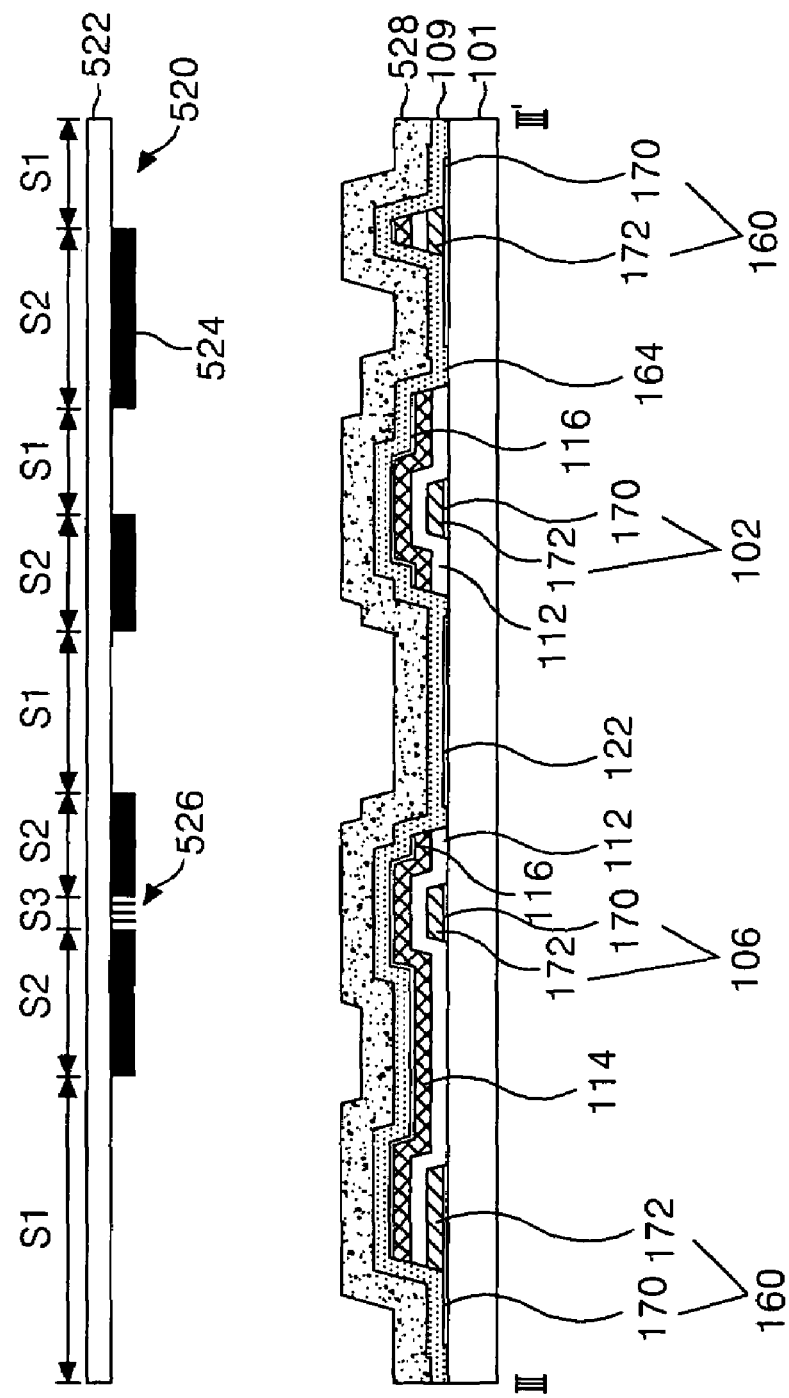
FIG. 13A to FIG. 13E are section views for explaining the third mask process shown in FIG. 12A and FIG. 12B in detail.

As shown in FIG. 13A, a data metal layer 109 and a photo-resist film 528 are sequentially formed on the lower substrate 101 provided with the semiconductor pattern by a deposition technique such as sputtering, etc. Herein, the data metal layer 109 is formed from a metal such as molybdenum (Mo), copper (Cu) or the like.

Figure 13B:
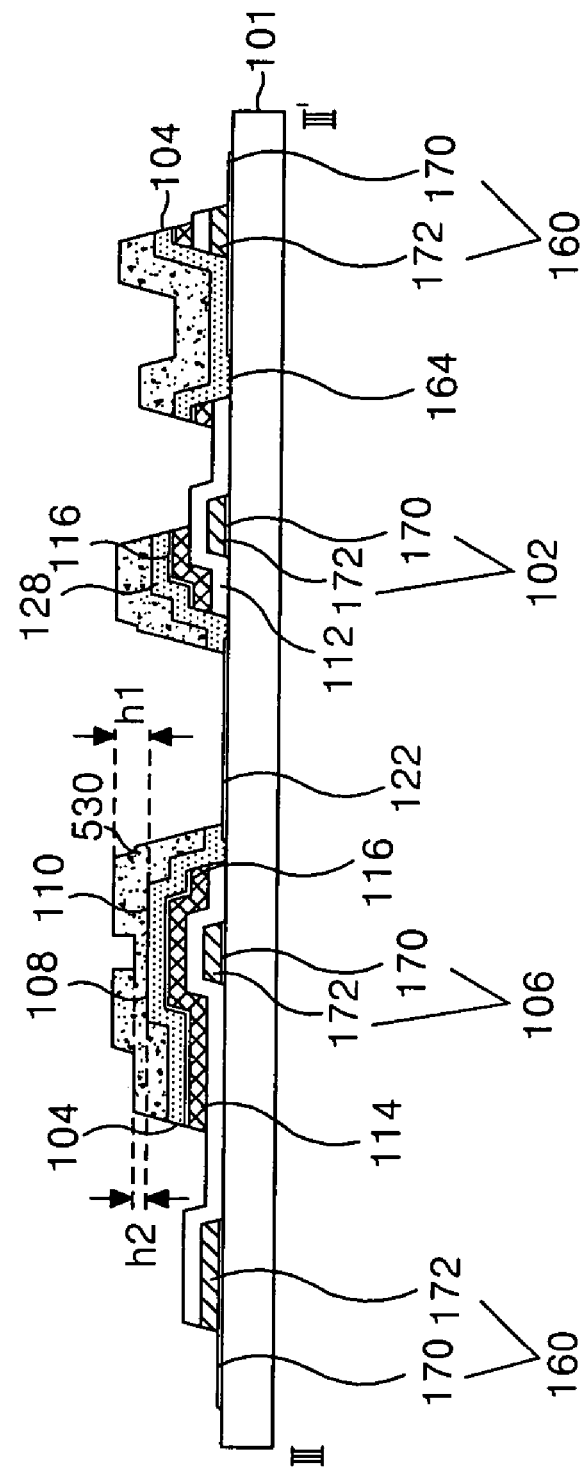

Then, a third mask 520 that is a partial exposure mask is aligned at the upper portion of the lower substrate 101. The third mask 520 includes a mask substrate 522 made from a transparent material, a shielding part 524 provided at a shielding area S2 of the mask substrate 522, and a diffractive exposure part (or semi-transmitting part) 526 provided at a partial exposure area S3 of the mask substrate 522. Herein, the exposed area of the mask substrate 522 is the exposure area S1. A photo-resist film 528 is exposed by using the third mask 520 and then developed, thereby providing a photo-resist pattern 530 having a step coverage at the shielding area S2 and the partial exposure area S3 in correspondence with the shielding part 524 and the diffractive exposure part 526 of the third mask 520 as shown in FIG. 13B. In other words, the photo-resist pattern 530 provided at the partial exposure area S2 has a second height h2 lower than a first height h1 of the photo-resist pattern 530 provided at the shielding area S2.

The data metal layer 109 is patterned by wet etching using the photo-resist pattern 530 as a mask, to thereby provide a data pattern including the storage electrode 128, the data line 104, the source electrode 108 connected to the data line 104 and the drain electrode 110.

Next, the active layer 114 and the ohmic contact layer 116 are formed along the data pattern by dry etching using the photo-resist pattern 530 as a mask. At this time, the active layer 114 and the ohmic contact layer 116 positioned in the remaining area (other than the active layer 114 and the ohmic contact layer 116 overlapping with the data pattern) are removed.

Figure 13C:
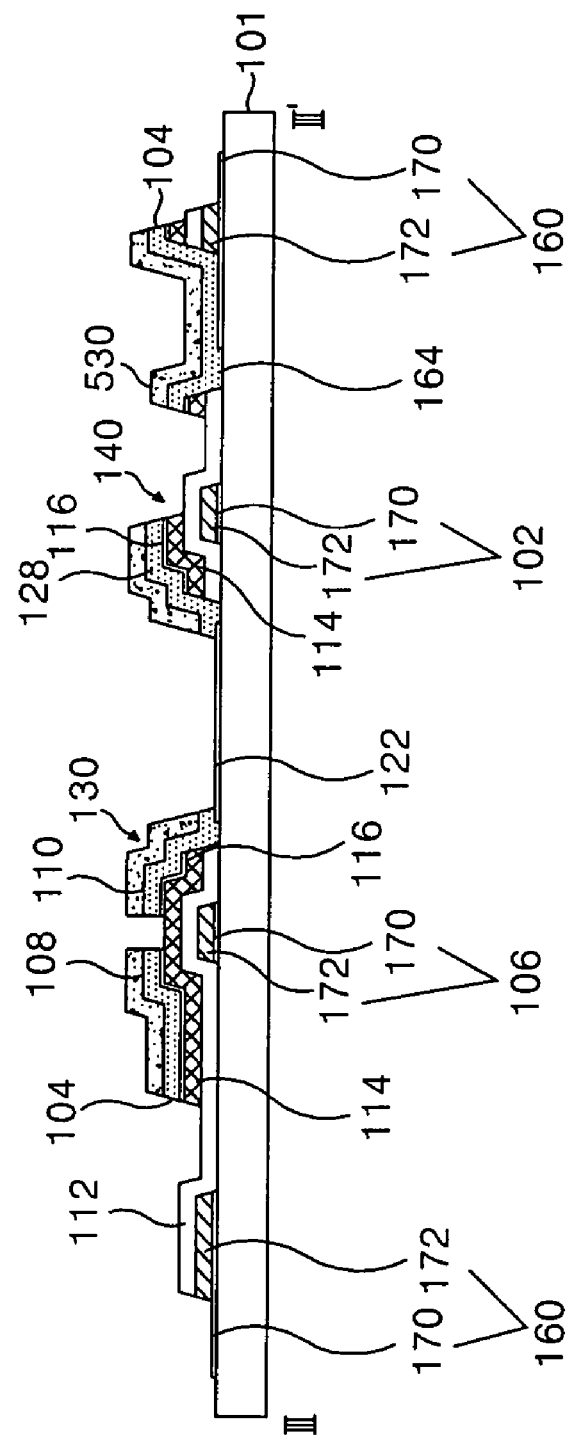
Figure 13D:
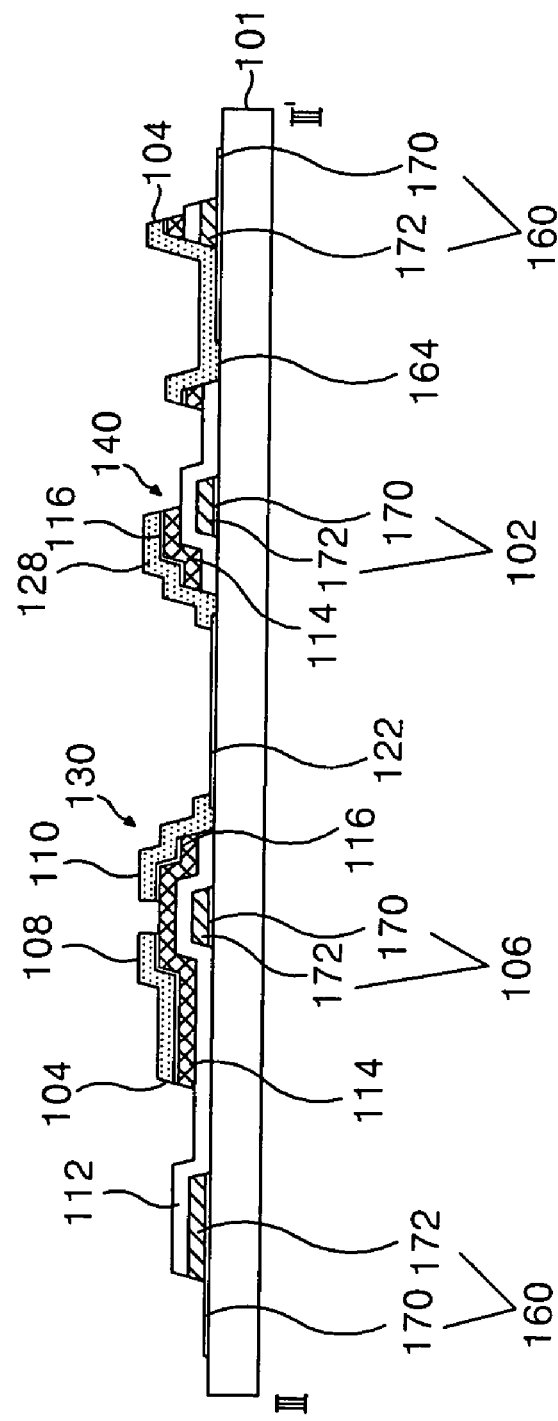

Then, the photo-resist pattern 530 having the second height h2 at the partial exposure area S3 is removed as shown in FIG. 13C by ashing using an oxygen ($O_2$) plasma, and the photo-resist pattern 530 which had the first height h1 at the shielding area S2 is partially removed, leaving a photo-resist pattern 530 with a lower height. The data metal layer and the ohmic contact layer 116 provided at the partial exposure area S3, that is, at the channel portion of the thin film transistor are removed by etching using the photo-resist pattern 530, thereby disconnecting the drain electrode 110 from the source electrode. The photo-resist pattern 530 left on the data pattern is then removed by stripping as shown in FIG. 13D.

Figure 13E:
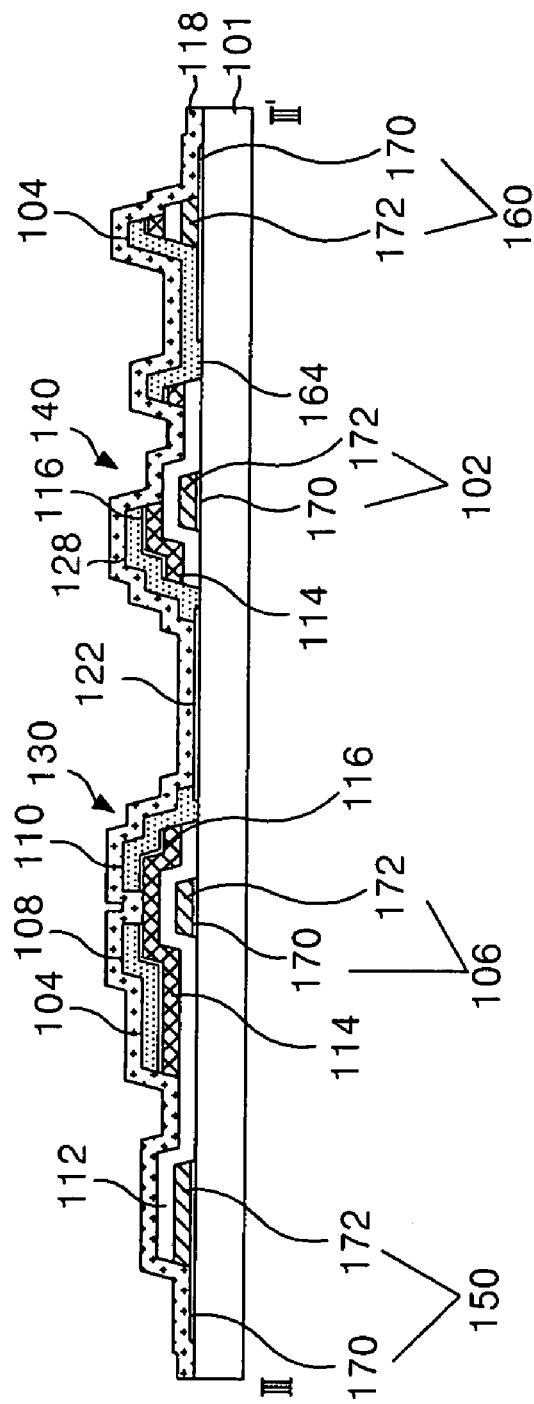

Subsequently, a protective film 118 is formed at the front face of the substrate 101 provided with the data pattern as shown in FIG. 13E. The protective film 118 is made from an inorganic insulating material identical to the gate insulating pattern 112, or an organic insulating material such as an acrylic organic compound having a small dielectric constant, BCB (benzocyclobutene) or PFCB (perfluorocyclobutane), etc.

Figure 14:
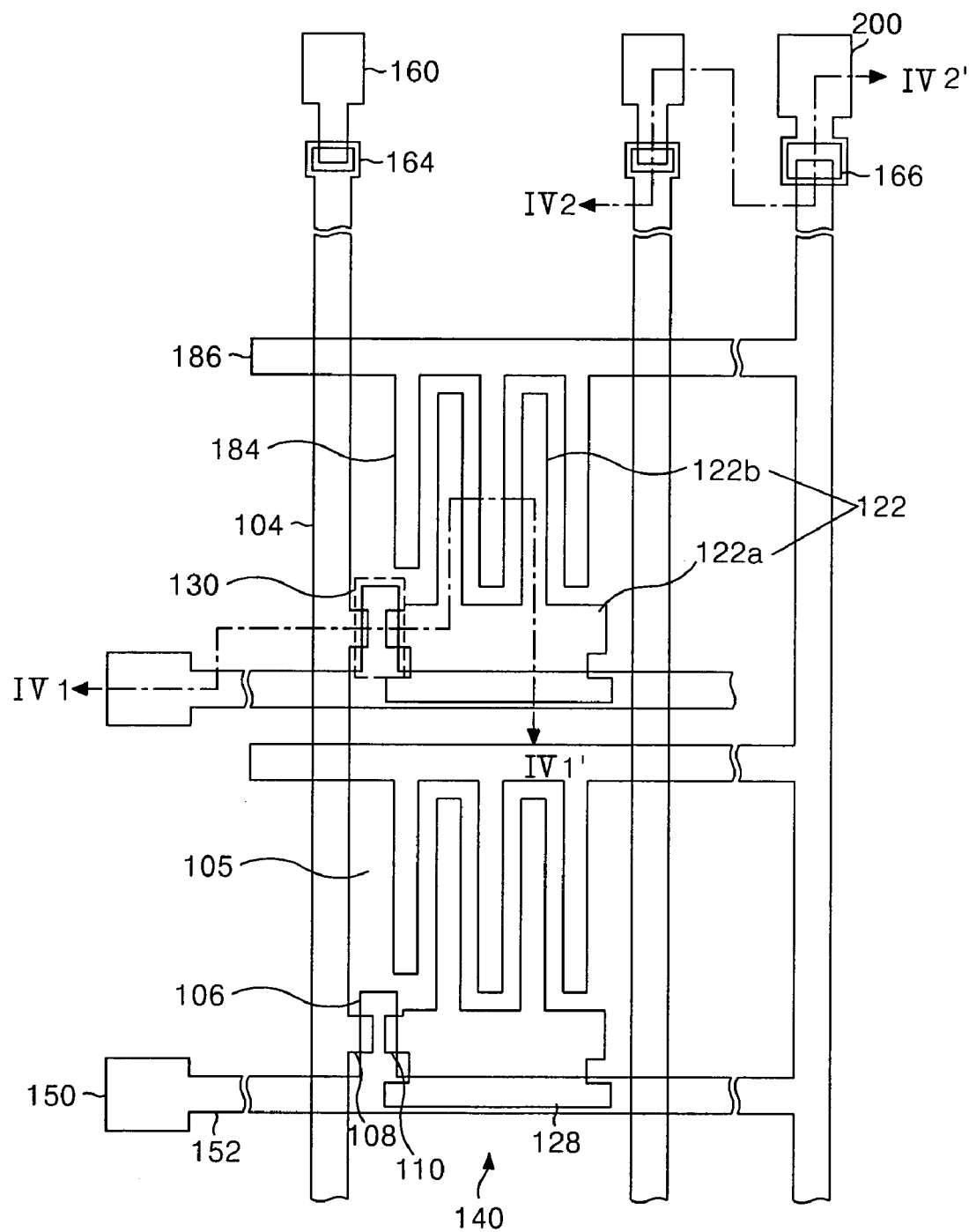
FIG. 14 is a plan view showing a structure of a thin film transistor array substrate according to a third embodiment of the present invention.
Figure 15:
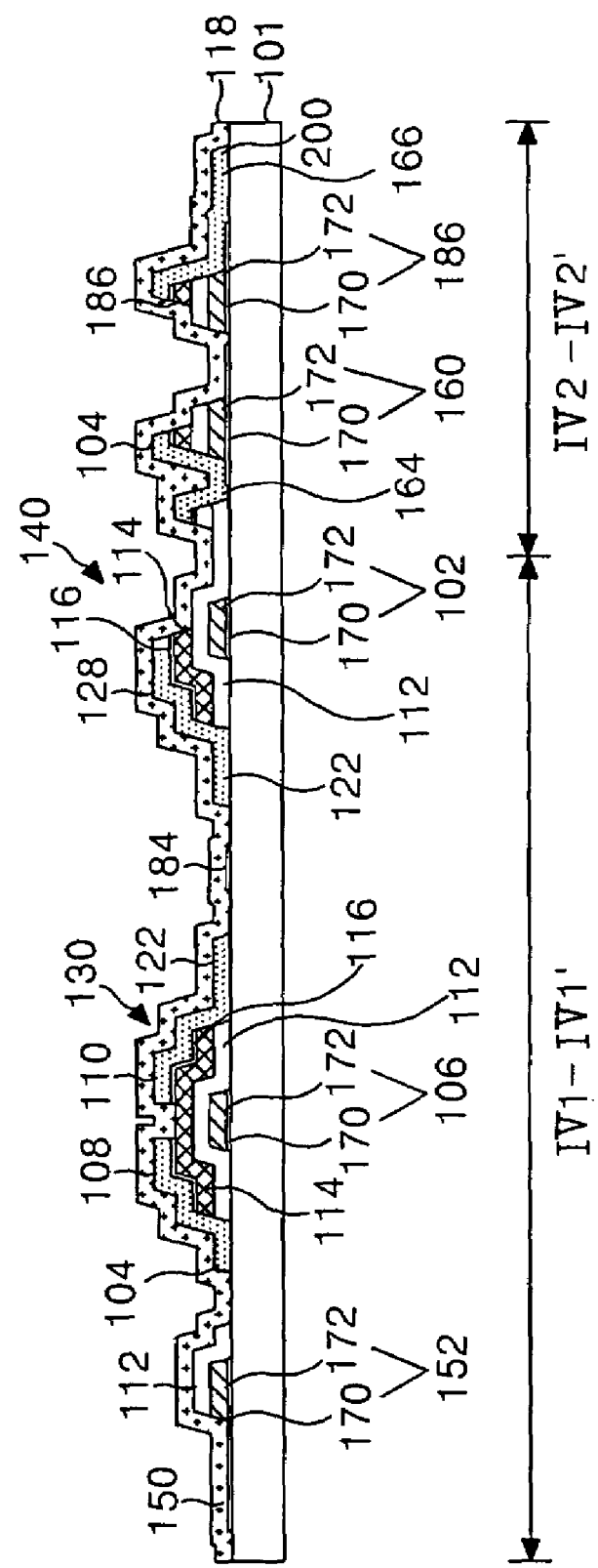
FIG. 15 is a section view of the thin film transistor array substrate taken along the IV1-IV1' and IV2-IV2' lines in FIG. 14.

FIG. 14 and FIG. 15 are a plan view and a section view illustrating a thin film transistor array substrate according to a third embodiment of the present invention.

The thin film transistor array substrate shown in FIG. 14 and FIG. 15 has the same elements as that shown in FIG. 8 and FIG. 9 except that the common electrode and the pixel electrode are provided on the lower substrate to make a horizontal electric field. Therefore, a detailed explanation as to the same elements will be omitted.

A common electrode 184 is connected to a common line 186 for applying a reference voltage for driving the liquid crystal and is formed at a pixel area. Particularly, the common electrode 184 is formed in parallel to a finger part 122b of a pixel electrode 122 at the pixel area.

The pixel electrode 122 is connected to a drain electrode 110 thereby forming a horizontal electric field with the common electrode 184 when a voltage potential exists between the two. The pixel electrode 122 includes a horizontal part 122a extended in parallel to the gate line 102, and a finger part 122b extended in the vertical direction from the horizontal part 122a.

Accordingly, a horizontal electric field is formed between the pixel electrode 122 to which a pixel signal is applied via the thin film transistor and the common electrode 184 to which a reference voltage is applied via the common line 186. This horizontal electric field rotates liquid crystal molecules arranged in the horizontal direction between the lower array substrate and the upper array substrate owing to the dielectric anisotropy of the liquid crystals. Further, transmission of light through the pixel area depends on the extent of rotation of the liquid crystal molecules, thereby implementing a picture.

A common pad 200 applies a reference voltage generated from an external reference voltage source (not shown) to the common line 186.

If the common pad 200 is formed from a data metal identical to the data line 104, then it is connected, via a common contact hole 166 exposing the end of the common pad 200, to the common line 186. The common line 186 consists of a transparent conductive film 170, and a gate metal film 172 formed on the transparent conductive film 170. The common contact hole 166 passes through the ohmic contact layer 116, the active layer 114, the gate insulating pattern 112 and the gate metal film 172 of the common line 186 to thereby expose the end of the transparent conductive film 170 of the common line 186 and an area adjacent thereto.

If the common pad 200 consists of the transparent conductive film 170 and the gate metal film 172 exposing at least portion of the transparent conductive film 170, then it is connected, via the common contact hole 166 exposing the end of the common pad 200 and an area adjacent thereto, to the common line 186. The common line 186 includes a first common line connected, via the common contact hole 166, to the common pad 200 and formed from the same metal as the data line 104, and a second common line connected, via a separate contact hole, to the first common line and formed from the same metal as the gate line 102.

As mentioned above, the common contact hole 166 for connecting the common line 186 with the common pad 200 exposes the end of the transparent conductive film 170 included in the common pad 200 and/or the common line 186. Thus, the common line (or the common pad) is connected to the end of the common pad (or the common line) exposed through the common contact hole 166 even though a second width of the common contact hole 166 passing through the gate metal film 172 is larger than a first width of the common contact hole 166 passing through the gate insulating pattern 112, the active layer 114 and the ohmic contact layer 116 thereby possibly causing undercut or a breakage of the common line (or the common pad) to occur.

The common contact hole for connecting the common line with the common pad is applicable to a thin film transistor array substrate of horizontal electric field applying type as well as the thin film transistor array substrate of vertical electric field applying type shown in FIG. 4. In other words, the common voltage supply line is electrically connected, via a contact hole exposing the end of the common voltage supply line connected, via a silver dot, to the common electrode and/or the common pad applying a common voltage to the common voltage supply line, to the common pad.

Figure 18:
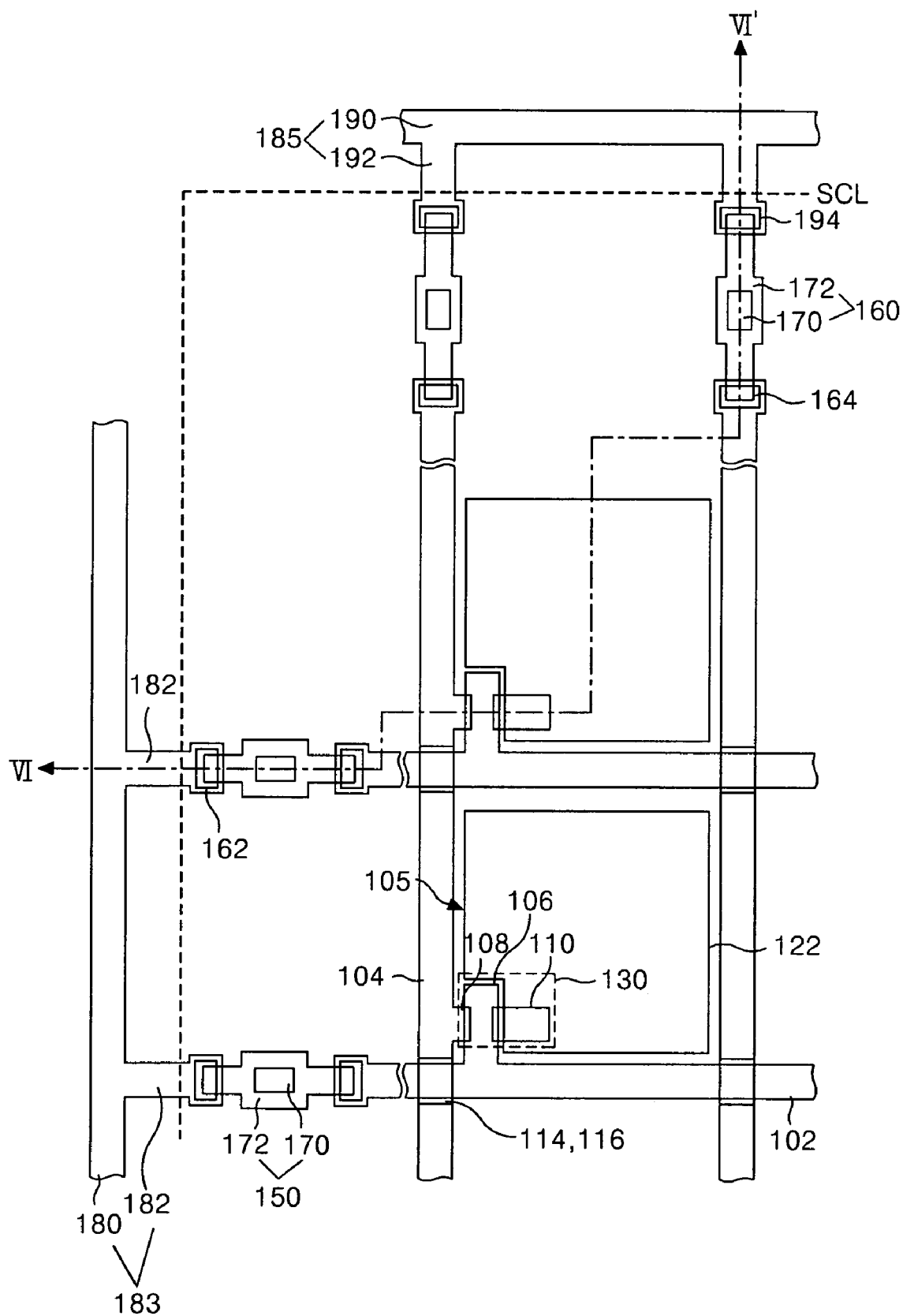
FIG. 18 is a plan view showing a structure of a thin film transistor array substrate according to a fourth embodiment of the present invention.
Figure 19:
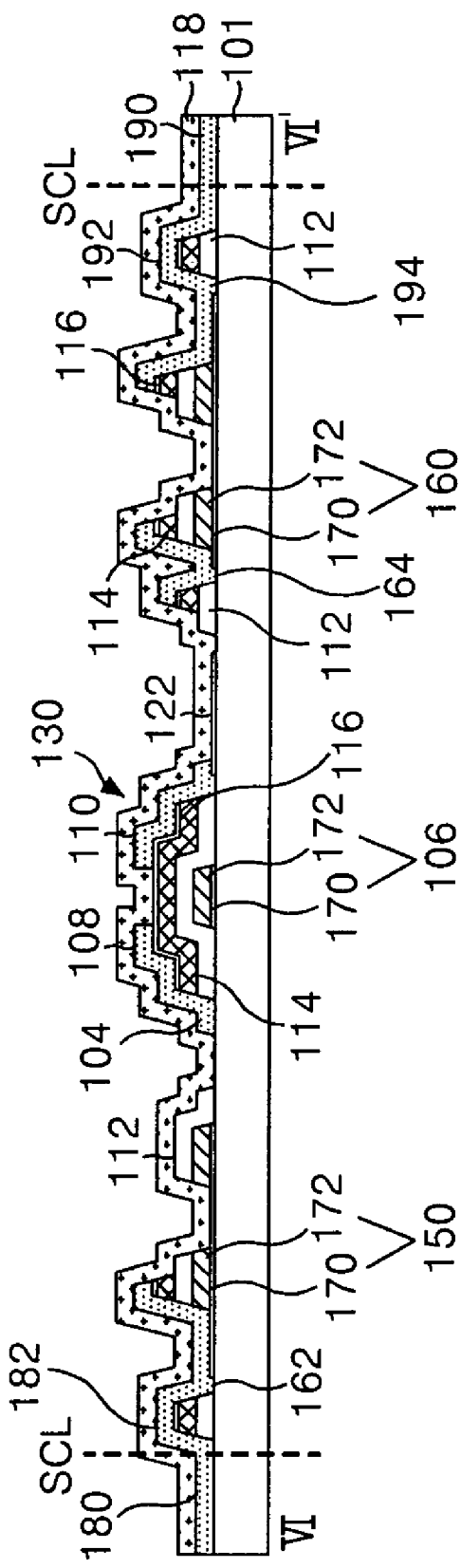
FIG. 19 is a section view of the thin film transistor array substrate taken along the VI-VI' line in FIG. 18.

FIG. 18 is a plan view showing a structure of a thin film transistor array substrate according to a fourth embodiment of the present invention, and FIG. 19 is a section view of the thin film transistor array substrate taken along the VI-VI' line in FIG. 18.

Firstly, prior to a description of the fourth embodiment of the present invention shown in FIG. 18 and FIG. 19, a static electricity proof device and a shorting bar structure in the existent four mask process to be compared with the fourth embodiment of the present invention will be described as an example below.

Figure 16:
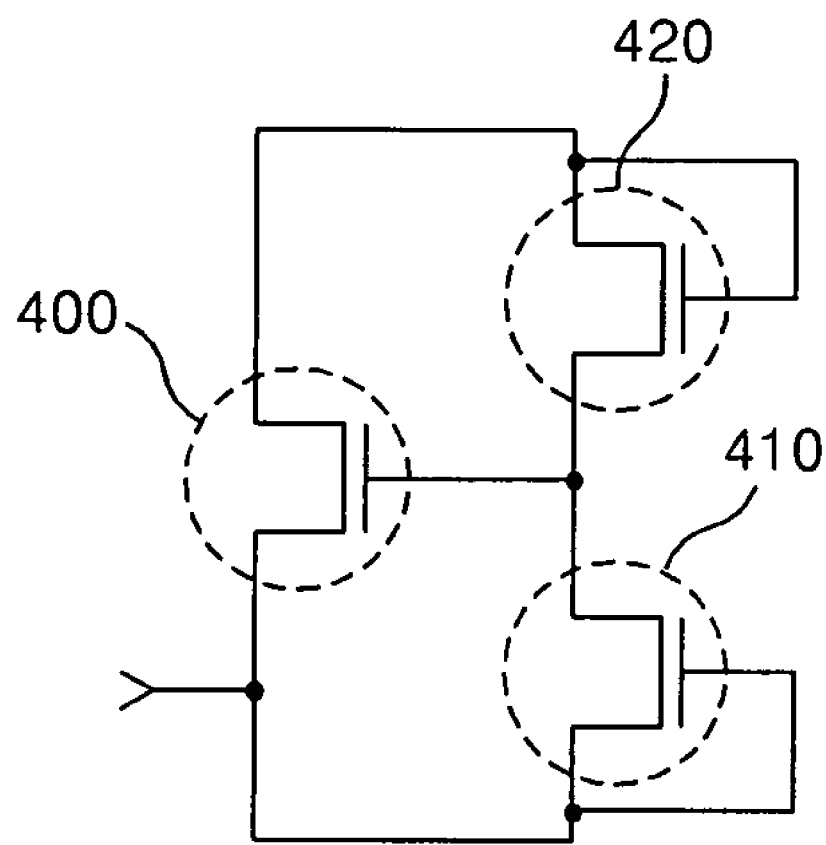
FIG. 16 is an equivalent circuit diagram of a static electricity proof device.

Typically, the thin film transistor array substrate includes a static electricity proof device for discharging static electricity formed at the non-display area and inputted to the display area. For instance, the static electricity proof device consists of a plurality of thin film transistors 400, 410 and 420 connected to the data line or the gate line at the non-display area and having a mutual connection relationship as shown in FIG. 16. The static electricity proof device has a low impedance at a high voltage area that permits static electricity, etc. to discharge excessive current, thereby preventing input of the static electricity, whereas it has a high impedance (i.e., tens of MΩ) under a normal driving environment, thereby having no effect to a driving signal supplied via the data line or the gate line. Examples of a detailed configuration of the static electricity proof device are shown in FIG. 17A and FIG. 17B.

Figure 17A:
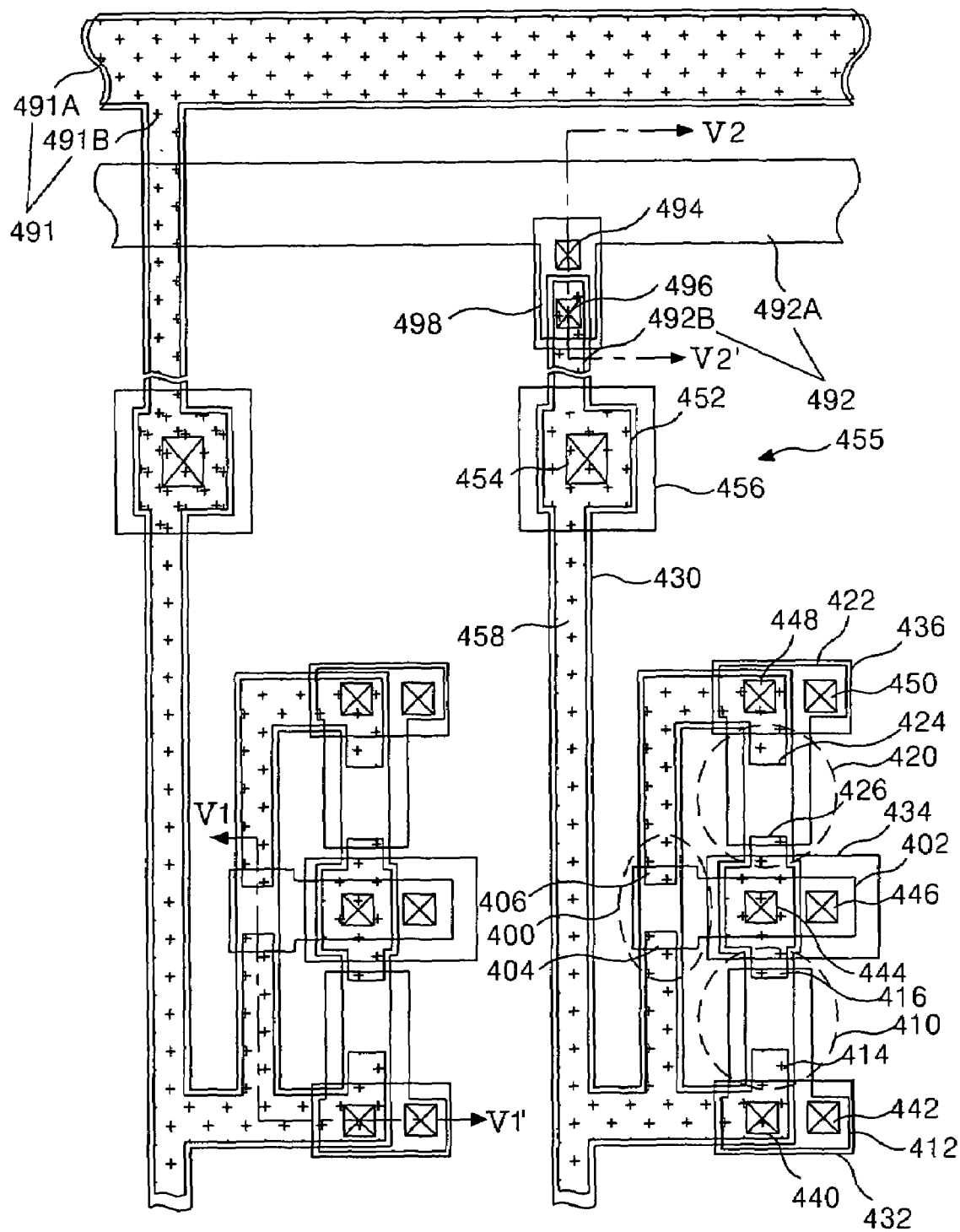
FIG. 17A and FIG. 17B are a plan view and a section view showing the static electricity proof device and the shorting bar area of the thin film transistor array substrate, respectively.
Figure 17B:
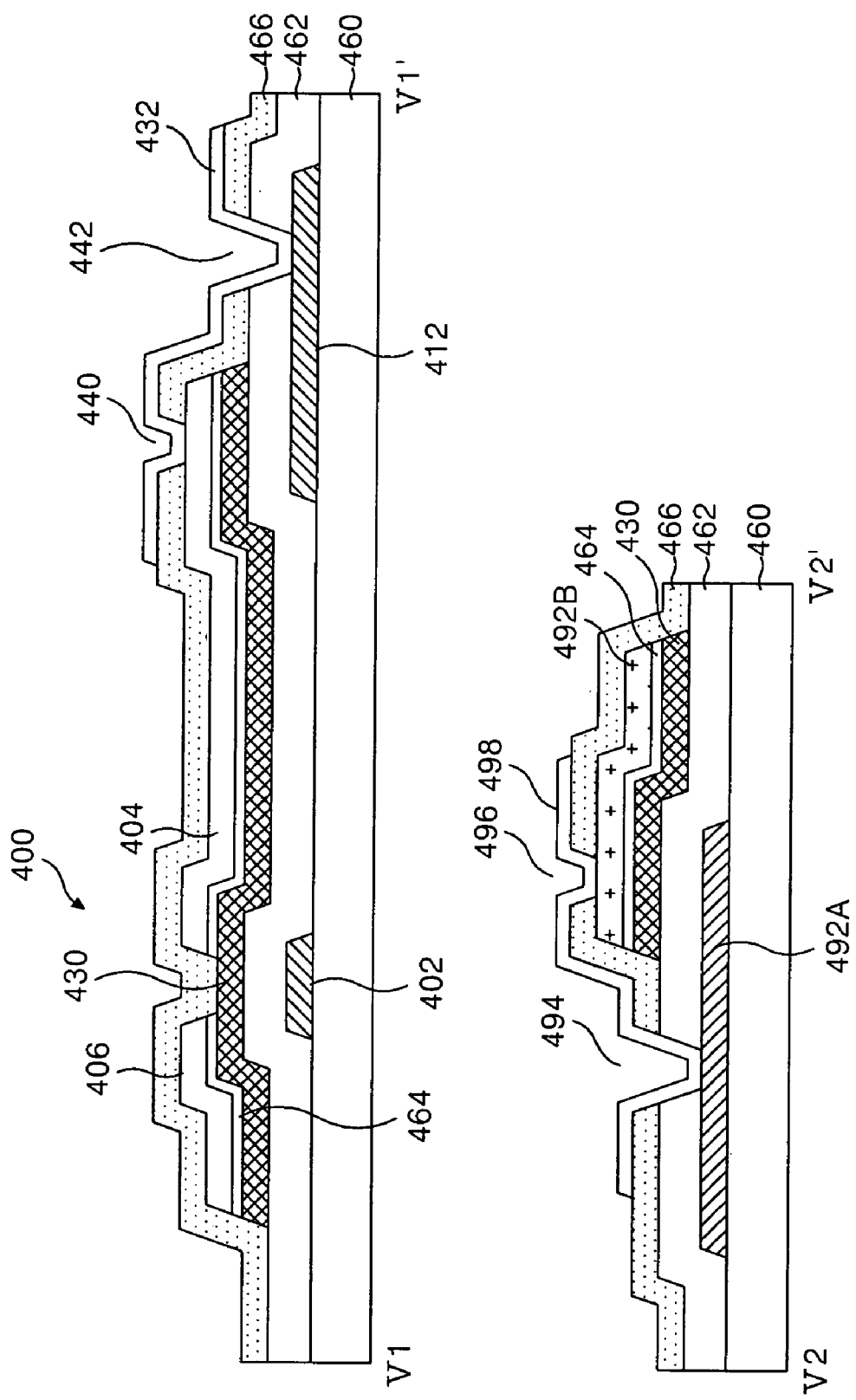

Referring to FIG. 17A and FIG. 17B, the static electricity proof device includes first to third thin film transistors 400, 410 and 420 connected to a data link 458 for coupling the data pad 455 with the data line.

The first thin film transistor 400 includes a first source electrode 404 connected to the data link 458, a first drain electrode 406 opposed to the first source electrode 404, and a first gate electrode 402 overlapping with the first source and drain electrodes 404 and 406 having semiconductor layers 430 and 464 and a gate insulating film 462 therebetween.

The second thin film transistor 410 includes a second source electrode 414 connected to the first source electrode 404, a second drain electrode 416 opposed to the second source electrode 414, and a second gate electrode 412 overlapping with the second source and drain electrodes 414 and 416 with the semiconductor layers 430 and 464 and the gate insulating film 462 therebetween. Herein, the second gate electrode 412 is connected, via a first contact electrode 432 formed over first and second contact holes 440 and 442, to the second source electrode 414. In other words, the first contact electrode 432 is provided over the first contact hole 440 passing through a protective film 466 to expose a portion of the second source electrode 414 and the second contact hole 442 passing through the protective film 466 and the gate insulating film 462 to expose a portion of the second gate electrode 412, thereby connecting the second gate electrode 412 with the second source electrode 414.

The third thin film transistor 420 includes a third source electrode 424 connected to the first drain electrode 406, a third drain electrode 426 opposed to the third source electrode 424, and a third gate electrode 422 connected to the third source and drain electrodes 424 and 426 with the semiconductor layers 430 and 464 and the gate insulating film 462 therebetween. Herein, the third drain electrode 426 is connected to the second drain electrode 416 and, at the same time, is connected, via a second contact electrode 434 formed over third and fourth contact holes 444 and 446, to the first gate electrode 402. In other words, the second contact electrode 434 is provided over the third contact hole passing through the protective film 466 to expose a portion of the second drain electrode 416 and the fourth contact hole 446 passing through the protective film 466 and the gate insulating film 462 to expose a portion of the first gate electrode 402, thereby connecting the second drain electrode 416 with the first gate electrode 402. Further, the third gate electrode 412 is connected, via a third contact electrode 436 formed over fifth and sixth contact holes 448 and 450, to the third source electrode 424. In other words, the third contact electrode 436 is provided over the fifth contact hole 448 passing through the protective film 466 to expose a portion of the third source electrode 424 and the sixth contact hole 450 passing through the protective film 466 and the gate insulating film 462 to expose a portion of the third gate electrode 422, thereby connecting the third gate electrode 422 with the third source electrode 424.

In the first to third thin film transistors 400, 410 and 420, the gate electrodes 402, 412 and 422 are formed from a first conductive layer (or gate metal layer) on the substrate 460; the source electrodes 404, 414 and 424 and the drain electrodes 406, 416 and 426 are formed from a second conductive layer (or source/drain metal layer) on the semiconductor layers 430 and 464; and the contact electrodes 432, 434 and 436 are formed from a third conductive layer (or transparent conductive layer or Ti) on the protective film 466.

The data pad 455 includes a lower data pad electrode 452 formed from the second conductive layer on the gate insulating film 462, and an upper data pad electrode 456 connected, via a ninth contact hole 454 passing through the protective film 466, to the lower data pad electrode 452.

Further, the data pad 455 is connected to odd and even shorting bars 491 and 492 formed at the non-display area that permit signal testing after fabricating the thin film transistor array substrate. The odd shorting bar 491 is commonly connected to a plurality of odd data pads 455 while the even shorting bar 492 is commonly connected to a plurality of even data pads 455.

The odd shorting bar 491 consists of a first odd shorting bar 491B connected to a lower odd data pad electrode 452, and a second odd shorting bar 491A commonly connected to a plurality of first odd shorting bars 491B. The odd shorting bar 491 is formed from a second conductive layer identical to the lower data pad electrode 452.

The even shorting bar 492 consists of a first even shorting bar 492B connected to a lower even data pad electrode 452, and a second even shorting bar 492A commonly connected to a plurality of first even shorting bars 492B. Herein, the first even shorting bar 492B is formed from the second conductive layer identical to the lower data pad electrode 452 while the second even shorting bar 492A crossing the first odd shorting bar 491B is formed from the first conductive layer. The first and second even shorting bars 492A and 492B are connected via a fourth contact electrode 498 of a third conductive layer formed over seventh and eighth contact holes 494 and 496. In other words, the fourth contact electrode 498 is provided over the seventh contact hole 496 passing through the protective film 496 to expose a portion of the first even shorting bar 492B and the eighth contact hole 494 passing through the protective film 466 and the gate insulating film 462 to expose a portion of the second even shorting bar 492A, thereby connecting the first even shorting bar 492A with the second even shorting bar 492B.

Herein, the semiconductor layer includes an active layer 430 forming a channel at each of the first to third thin film transistors 400, 410 and 420, and an ohmic contact layer 464 provided on the active layer 430 other than the channel portion for making a ohmic contact with the source electrodes 404, 414 and 424 and the drain electrodes 406, 416 and 426. Further, the active layer 430 and the ohmic contact layer 464 are formed along a second conductive layer including the data link 458, the lower data pad electrode 452, the odd shorting bar 491 and a vertical part 492B of the even shorting bar 492.

The static electricity proof device and the shorting bar having the structure as described above are formed by the conventional four mask process. More specifically, the gate electrodes 402, 412 and 422 and the even shorting bar 492A of the first conductive layer are provided on the substrate 460 by the first mask process. The semiconductor layers 430 and 464 and the source electrodes 404, 414 and 416, the drain electrodes 406, 416 and 426, the data link 458, the lower data pad electrode 452, the odd shorting bar 491 and the first even shorting bar 492B of the second conductive layer are provided on the gate insulating film 462 by the second mask process. The contact holes 440, 442, 444, 446, 448, 450, 454, 494 and 496 passing through the protective film 466 and the gate insulating film 462 are provided by the third mask process, and the contact electrodes 432, 434, 436 and 498 and the upper data pad electrode 456 are provided by the fourth mask process.

Herein, the contact holes 440, 444, 448 and 496 exposing the second conductive layer and the contact holes 442, 446, 450 and 494 exposing the first conductive layer are formed independently from each other to have a different step coverage, thereby increasing a risk of breakages of the contact electrodes 432, 434, 436 and 498.

In order to overcome such a problem, the thin film transistor array substrate according to a fourth embodiment of the present invention provides contact holes that expose a conductive layer and an area adjacent to the conductive layer as shown in FIG. 18 and FIG. 19.

The thin film transistor array substrate shown in FIG. 18 and FIG. 19 has the same elements as the thin film transistor array substrate except that it is removed by a scribing process and further includes a gate shorting bar and a data shorting bar connected to the gate pad and the data pad, respectively. Therefore, a detailed explanation as to the same elements will be omitted.

The gate shorting bar 183 and the data shorting bar 185 prevent static electricity from being transferred onto signal lines 102, 104 of the liquid crystal display panel in the course of the fabrication process by connecting the signal lines to a ground voltage source GND, thereby protecting the thin film transistor 130 from the static electricity.

The gate shorting bar 183 consists of a first gate shorting bar 182 connected to a gate pad 150, and a second gate shorting bar 180 commonly connected to a plurality of first gate shorting bars 182.

The second gate shorting bar 180 is formed from the same metal as the data line 104, for example, a metal having strong corrosion resistance such as molybdenum (Mo), chrome (Cr), titanium (Ti), tantalum (Ta) or MoW. Such a second gate shorting bar 180 is electrically connected, via the first gate shorting bar 182, to the gate pad 150. The first gate shorting bar 182 extends from the first gate shorting bar 180 to cross a scribing line SCL and is connected, via a first shorting contact hole 162, to the gate pad 150. Herein, the first shorting contact hole 162 has a larger width than the gate pad 150, and passes through an ohmic contact layer 116, an active layer 114, a gate insulating pattern 112 and a gate metal film 172 of the gate pad 150 to expose the end of the transparent conductive film 170 of the gate pad and an area adjacent thereto.

The data shorting bar 185 consists of a first data shorting bar 192 connected to the data pad 160, and a second data shorting bar 190 commonly connected to a plurality of first data shorting bars 182.

The second data shorting bar 190 is formed from the same metal as the data line 104, for example, a metal having strong corrosion resistance such as molybdenum (Mo), chrome (Cr), titanium (Ti), tantalum (Ta) or MoW. Such a second data shorting bar 190 is electrically connected, via the first data shorting bar 192, to the data pad 160. The first data shorting bar 192 extends from the first data shorting bar 190 to cross a scribing line SCL and is connected, via a second shorting contact hole 194, to the data pad 160. Herein, the second shorting contact hole 194 has a larger width than the data pad 160, and passes through the ohmic contact layer, the active layer 114, the gate insulating pattern 112 and a gate metal film 172 of the data pad 160 to expose the end of the transparent conductive film 170 of the data pad 160 and an area adjacent thereto.

As described above, the first and second shorting contact holes 162 and 194 that connect the first gate shorting bar 182 to the gate pad 150 and the first data shorting bar 192 to the data pad 160, respectively expose the ends of the transparent conductive films 170 included in the gate pad 150 and the data pad 160. Thus, even though a second width of the shorting contact holes 162 and 194 passing through the gate metal film 172 is larger than a first width of the shorting contact hole including the first and second shorting contact holes 162 and 194 passing through the gate insulating pattern 112, the active layer 114 and the ohmic contact layer 116 to may cause undercut, the first shorting bars 192 and 182 are connected to the ends of the data and gate pads 160 and 150 exposed through the shorting contact holes 194 and 162, so that it is possible to prevent breakages of the first shorting bars 194 and 182.

A method of fabricating such a thin film transistor of the liquid crystal display panel will be described below.

The gate pattern including the gate line 106, the gate electrode 102, the gate pad 150 and the data pad 160 and the pixel electrode 122 including the gate metal film are provided by the first mask process. The gate insulating pattern 112 and the semiconductor patterns 114 and 116 having the first and second shorting holes 162 and 194; and the gate metal films 172 included in the gate pad 150, the data pad 160 and the pixel electrode 122 are removed and the gate metal films 172 exposed through the first and second shorting contact holes 162 and 194 are removed by the second mask process. The data pattern including the second gate shorting bar 180, the second data shorting bar 190, the first gate shorting bar 182 and the first data shorting bar 192, the source electrode 108, the drain electrode 110 and the data line 104 are provided by the third mask process. Then, the protective film that protects the thin film transistor 130 is formed on the entire surface of the lower substrate 101.

Figure 20:
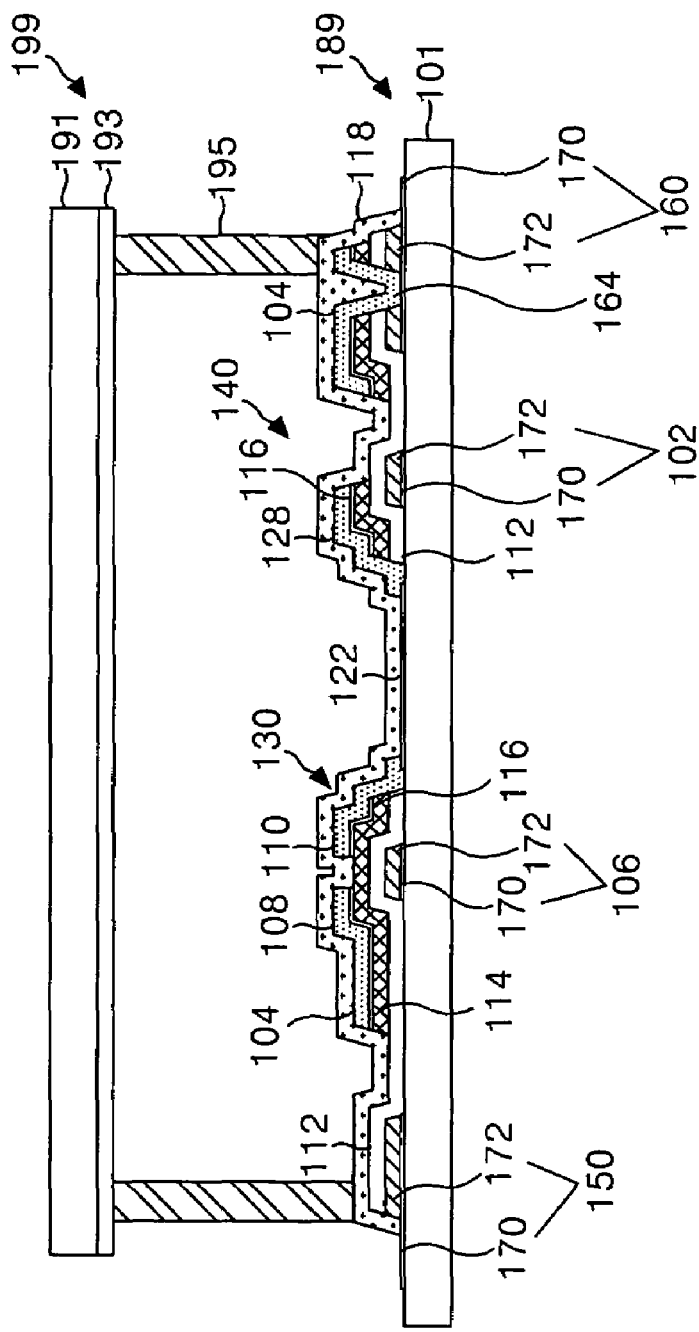
FIG. 20 is a section view of a liquid crystal display panel including the thin film transistor array substrate according to the first to fourth embodiments of the present invention.

FIG. 20 is a section view showing a structure of the thin film transistor array substrates according to the first to fourth embodiments of the present invention.

The liquid crystal display panel shown in FIG. 20 includes a color filter array substrate 199 and a thin film transistor array substrate 189 that are joined to each other by a sealant 195.

The color filter array substrate 199 includes a black matrix (not shown) formed on an upper substrate 191 and an upper array 193 including color filters.

The thin film transistor array substrate 189 is provided such that an area overlapping with the color filter array substrate 199 is protected by a protective film 118 and a transparent conductive film 170 included in a gate pad 150, a data pad 160 and/or a common pad (not shown) at a pad area that is not overlapped with the color filter array substrate 199 is exposed.

A method of fabricating such a liquid crystal display panel will be described below.

Firstly, the color filter array substrate 199 and the thin film transistor array substrate 189 are prepared separately and thereafter they are joined to each other by the sealant 195. Then, the protective film 118 of the thin film transistor array substrate 189 is patterned by a pad opening process using the color filter array substrate 199 as a mask. This exposes the transparent conductive film 170 included in the gate pad 150, the data pad 160 and/or the common pad (not shown) of the pad area.

Meanwhile, the pad opening process sequentially scans sequentially or collectively scans each pad exposed by the color filter array substrate 199 using a plasma generated by an atmospheric plasma generator to thereby expose the transparent conductive films 170 of the gate pad 150, the data pad 160 and the common pad (not shown). Alternatively, a plurality of liquid crystal display panels, each of which has the color filter array substrate 199 joined with the thin film transistor array substrate 189, are inserted into a chamber, and thereafter the protective film 118 of the pad area exposed by the color filter array substrate 199 is etched by a normal-pressure plasma to thereby expose the transparent conductive films 170 of the gate pad 150, the data pad 160 and the common pad (not shown). Otherwise, the entire liquid crystal display panel in which the color filter arrays substrate 199 is joined with the thin film transistor array substrate 189 is immersed into an etching liquid or the pad area including the gate pad 150, the data pad 160 and the common pad (not shown) only is immersed into an etching liquid to thereby expose the transparent conductive films 170 of the gate pad 150, the data pad 160 and the common pad (not shown).

Figure 21:
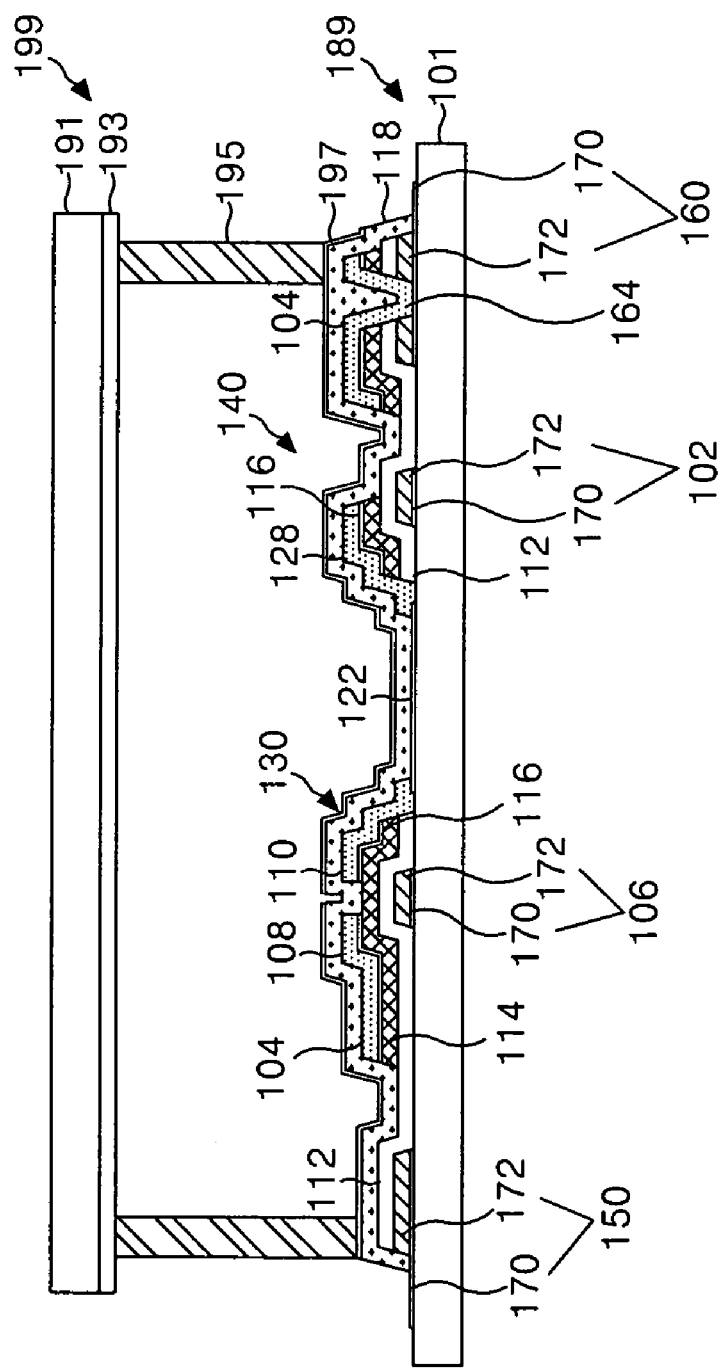
FIG. 21 is a section view of other example of a liquid crystal display panel including the thin film transistor array substrate according to the first to fourth embodiments of the present invention.

FIG. 21 is a section view showing another structure example of a liquid crystal display panel including the thin film transistor array substrates according to the first to fourth embodiment of the present invention.

The liquid crystal display panel shown in FIG. 21 includes a color filter array substrate 199 and a thin film transistor array substrate 189 that are joined to each other by a sealant 189.

In the thin film transistor array substrate 189, a display area confined by an alignment film 197 is protected by a protective film 118 and a transparent conductive film 170 included in a gate pad 150, a data pad 160 and/or a common pad (not shown) at a pad area included in an area that is not overlapped with the alignment film 197 is exposed. In this case, the protective film 118 is patterned and formed by an etching process using the alignment film 197 as a mask.

Figure 22:
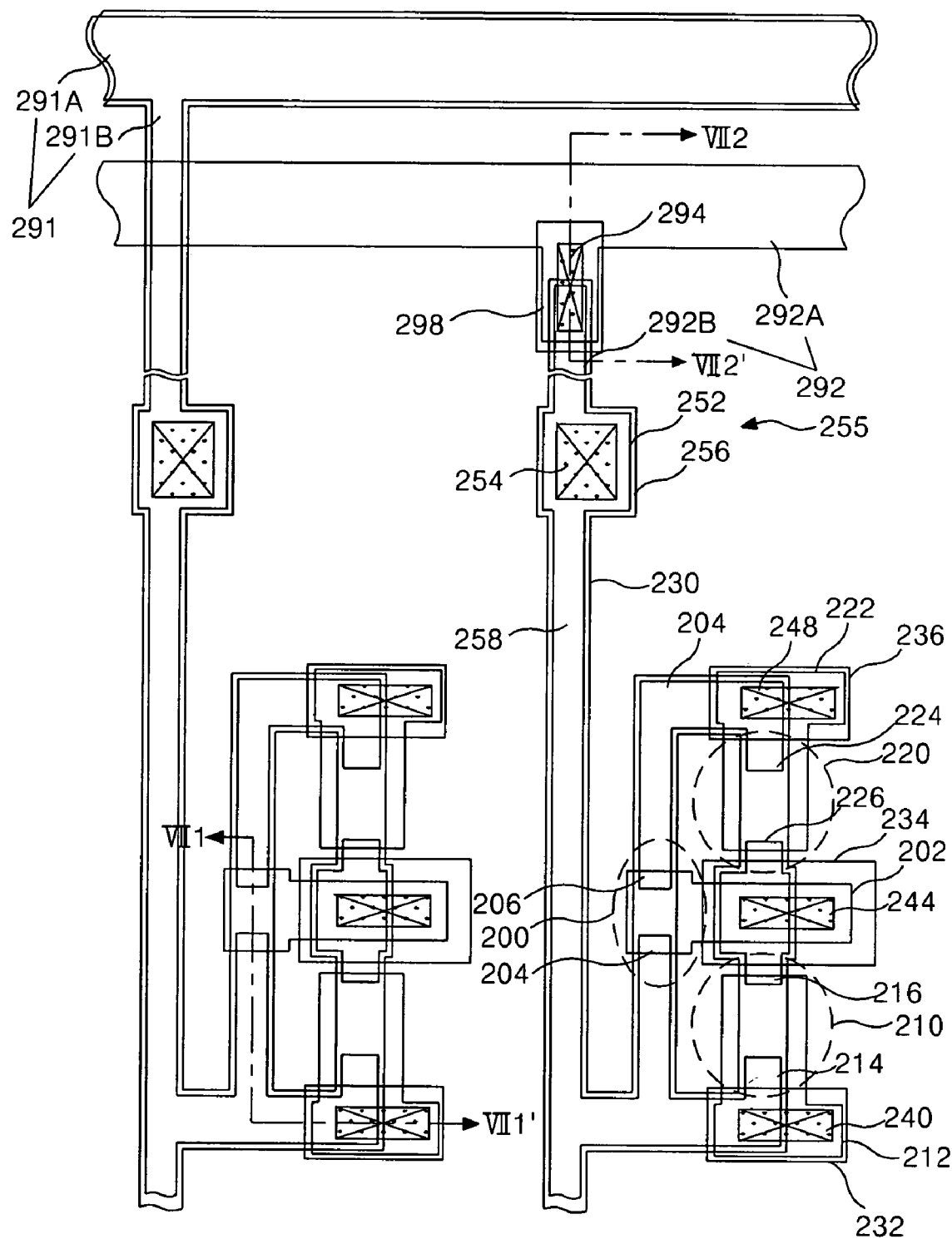
FIG. 22 is a plan view showing a static electricity proof device and a shorting bar area of a thin film transistor array substrate according to a fifth embodiment of the present invention.
Figure 23:
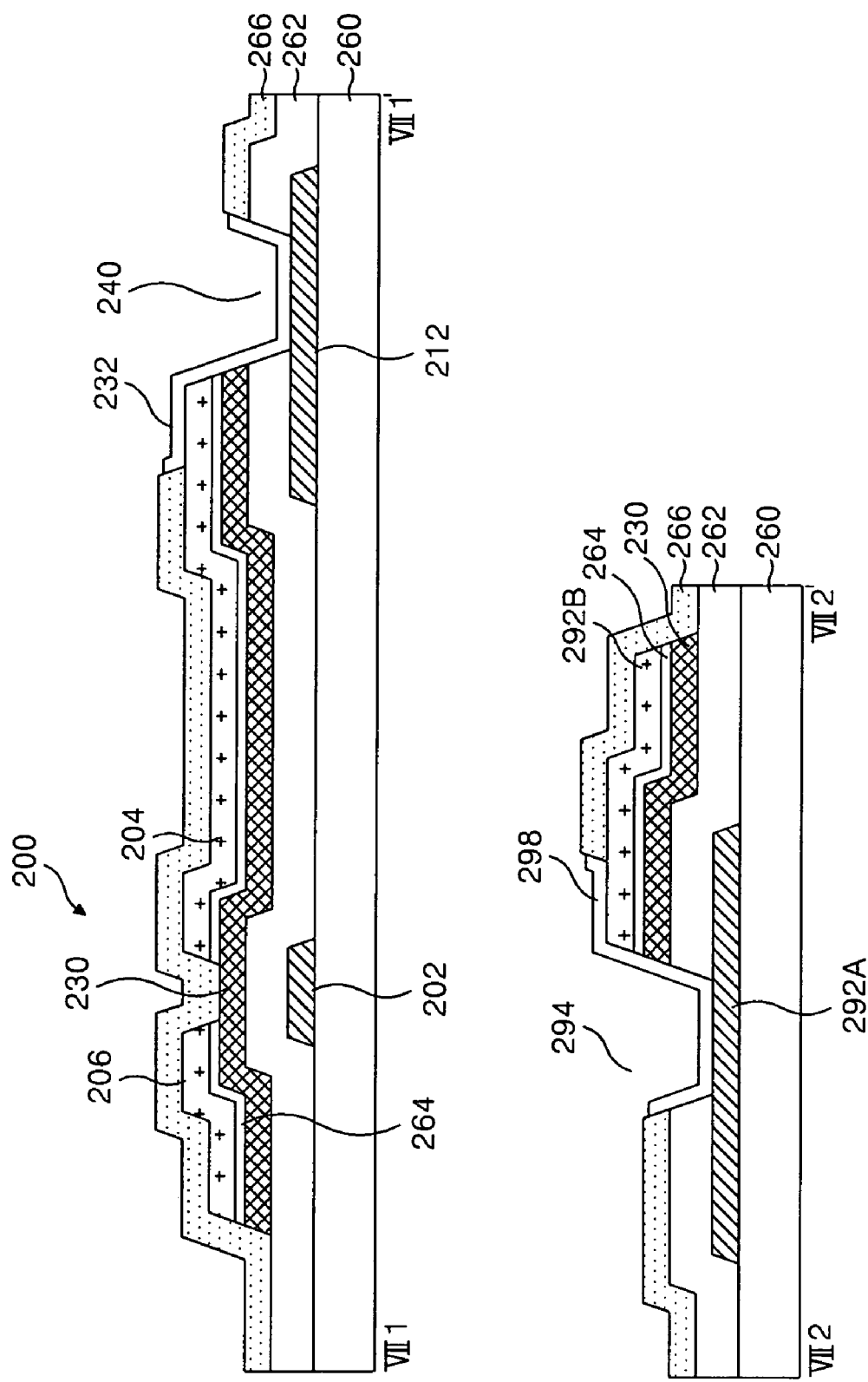
FIG. 23 is a section view of the static electricity proof device and the shorting bar area taken along the VII1-VII1' and VII2-VII2' lines in FIG. 22.

FIG. 22 is a plan view showing a static electricity proof device and a shorting bar area of a thin film transistor array substrate according to a fifth embodiment of the present invention, and FIG. 23 is a section view of the static electricity proof device and the shorting bar area taken along the VII1-VII1' and VII2-VII2' lines in FIG. 22.

Herein, prior to a description of the first embodiment of the present invention, a lift-off process to be applied to the present invention will be described.

Korea Patent Application No. 2002-88323 pre-filed by the applicant (hereinafter, referred to as "the pre-filed invention" and incorporated by reference) has suggested fabricating the thin film transistor array substrate by the three mask process by applying lift-off. The pre-filed invention implements a process of defining holes passing through the protective film and the gate insulating film and a process of patterning the third conductive layer by a single mask process using lift-off, thereby reducing the number of mask processes. Thus, in the pre-filed invention, the patterned third conductive layer is formed only at an area in which the photo-resist pattern that defines holes in the protective film and the gate insulating film, thereby contacting the protective film within the holes. However, when two contact holes for exposing the first and second conductive layers are provided at each of the static electricity proof device and the shorting bar area as shown in FIG. 17A and FIG. 17B, the first conductive layer are not connected to the second conductive layer by the contact electrode.

As an alternative, a thin film transistor array substrate according to a fifth embodiment of the present invention shown in FIG. 22 and FIG. 23 integrally defines contact holes for exposing the first and second conductive layers.

Referring to FIG. 22 and FIG. 23, the static electricity proof device includes first to third thin film transistors 200, 210 and 220 connected to a data link 258 for coupling the data pad 255 with the data line.

The first thin film transistor 200 includes a first source electrode 204 connected to the data link 258, a first drain electrode 206 opposed to the first source electrode 204, and a first gate electrode 202 overlapping with the first source and drain electrodes 204 and 206 with semiconductor layers 230 and 264 and a gate insulating film 262 therebetween.

The second thin film transistor 210 includes a second source electrode 214 connected to the first source electrode 204, a second drain electrode 216 opposed to the second source electrode 214, and a second gate electrode 212 overlapping with the second source and drain electrodes 214 and 216 with the semiconductor layers 230 and 264 and the gate insulating film 262 therebetween. Herein, the second gate electrode 212 is connected, via a first contact electrode 232 formed over first contact hole 240, to the second source electrode 214. In other words, the first contact electrode 232 are provided within the first contact hole 240 passing through a protective film 266 and the gate insulating film 262 to simultaneously expose the second gate electrode and a portion of the second source electrode 214 adjacent to the second gate electrode 212, thereby connecting the second gate electrode 212 with the second source electrode 214.

The third thin film transistor 220 includes a third source electrode 224 connected to the first drain electrode 206, a third drain electrode 226 opposed to the third source electrode 224, and a third gate electrode 222 connected to the third source and drain electrodes 224 and 226 having the semiconductor layers 230 and 264 and the gate insulating film 262 therebetween. Herein, the third drain electrode 226 also is connected to the second drain electrode 216 and, at the same time, is connected, via a second contact electrode 234 formed within a second contact hole 244, to the first gate electrode 202. In other words, the second contact electrode 234 is provided within the second contact hole 244 passing through the protective film 266 and the gate insulating film 262 to simultaneously expose the second drain electrode 226 and a portion of the first gate electrode 202, thereby connecting the second drain electrode 216 with the first gate electrode 202. Further, the third gate electrode 212 is connected, via a third contact electrode 236 formed within a third contact hole 248, to the third source electrode 224. In other words, the third contact electrode 236 is provided within the third contact hole 248 passing through the protective film 266 and the gate insulating film 262 to simultaneously expose the third source electrode 224 and a portion of the third gate electrode 222 adjacent to the third source electrode 224, thereby connecting the third source electrode 224 with the third gate electrode 222.

In the first to third thin film transistors 200, 210 and 220, the gate electrodes 202, 212 and 222 are formed from a first conductive layer (or gate metal layer) on the substrate 260; the source electrodes 204, 214 and 224 and the drain electrodes 206, 216 and 226 are formed from a second conductive layer (or source/drain metal layer) on the semiconductor layers 230 and 264; and the contact electrodes 232, 234 and 236 are formed from a third conductive layer (or transparent conductive layer or Ti) on the protective film 266.

The data pad 255 includes a lower data pad electrode 252 formed from the second conductive layer on the gate insulating film 262, and an upper data pad electrode 254 connected, via a fifth contact hole 256 passing through the protective film 266, to the lower data pad electrode 252.

Further, the data pad 255 is connected to odd and even shorting bars 291 and 292 formed at the non-display area permitting signal testing after fabricating the thin film transistor array substrate. The odd shorting bar 291 is commonly connected to a plurality of odd data pads 255 while the even shorting bar 292 is commonly connected to a plurality of even data pads 255.

The odd shorting bar 291 consists of a first odd shorting bar 291B connected to a lower odd data pad electrode 252, and a second odd shorting bar 291A commonly connected to a plurality of first odd shorting bar 291B. The odd shorting bar 291 is formed from a second conductive layer identical to the lower data pad electrode 252.

The even shorting bar 292 consists of a first even shorting bar 292B connected to a lower even data pad electrode 252, and a second even shorting bar 292A commonly connected to a plurality of first even shorting bars 292B. Herein, the first even shorting bar 292B is formed from the second conductive layer identical to the lower data pad electrode 252 while the second even shorting bar 292A crossing the first odd shorting bar 291B is formed from the first conductive layer. The first and second even shorting bars 292B and 292A are connected via a fourth contact electrode 298 of a third conductive layer formed over a fourth hole 294. In other words, the fourth contact electrode 298 is provided within the fourth contact hole 294 passing through the protective film 266 and the gate insulating film 262 to simultaneously expose the first even shorting bar 292B and a portion of the second even shorting bar 292A adjacent to the first even shorting bar 292B, thereby connecting the first even shorting bar 292B with the second even shorting bar 292A.

Herein, the semiconductor layer includes an active layer 230 forming a channel at each of the first to third thin film transistors 200, 210 and 220, and an ohmic contact layer 264 provided on the active layer 230 other than in the channel portion for making ohmic contact with the source electrodes 204, 214 and 224 and the drain electrodes 206, 216 and 226. Further, the active layer 230 and the ohmic contact layer 264 are formed along a second conductive layer including the data link 258, the lower data pad electrode 252, the odd shorting bar 291 and the first even shorting bar 292B.

In the thin film transistor array substrate according to the fifth embodiment of the present invention, the first to fourth contact holes 240, 244, 248 and 294 simultaneously expose the first and second conductive layers, thereby connecting the first conductive layer with the second conductive layer by the contact electrodes 232, 234 and 236 formed within each of the contact holes 240, 244, 248 and 294. In this case, the first to fourth contact holes 240, 244, 248 and 294 sequentially expose the second conductive layer, the semiconductor layer and the first conductive layer to reduce a step coverage, thereby preventing breakages of the contact electrodes 232, 234 and 236. Such contact electrodes 232, 234 and 236 are fabricated using lift-off by removing the photo-resist pattern used upon patterning of the protective film 266 and the gate insulating film 262 along with the upper data pad electrode 254. Accordingly, the thin film transistor array substrate according to the fifth embodiment of the present invention can be formed by a three mask process as will be described below.

Figure 24B:
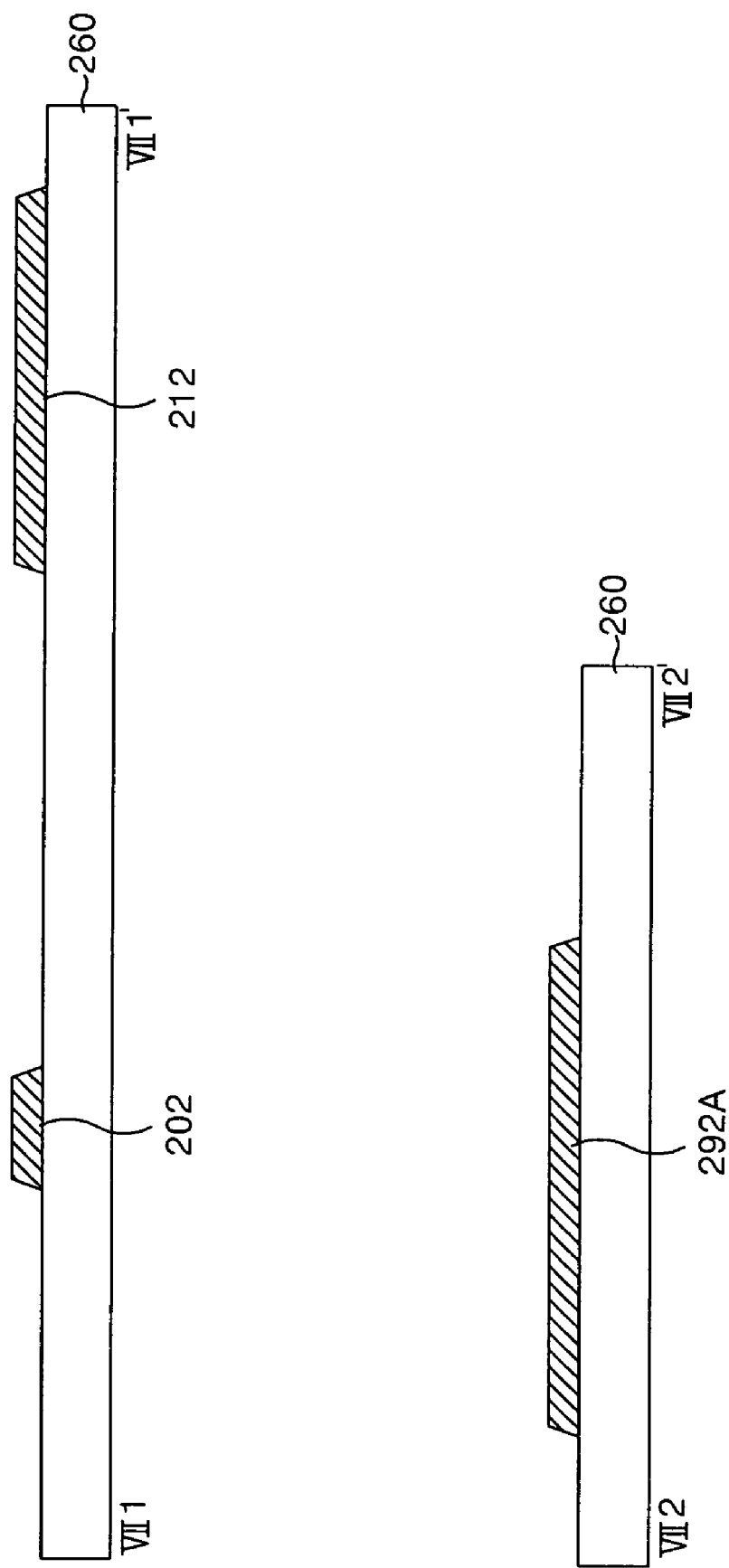

FIG. 24A and FIG. 24B are a plan view and a section view for explaining a first mask process, respectively, in a method of fabricating the thin film transistor array substrates shown according to the fifth embodiment of the present invention.

A first conductive pattern including the gate electrodes 202, 212 and 222 and the second even shorting bar 292A is provided on the lower substrate 260 by the first mask process.

More specifically, a gate metal layer is formed on the lower substrate 260 by a deposition technique such as sputtering, etc. Then, the first conductive layer is patterned by photolithography and etching using a first mask to thereby provide the first conductive pattern including the gate electrodes 202, 212 and 222 and the second even shorting bar 292A. Herein, the first conductive layer is formed from Cr, MoW, Cr/Al, Cu, Al(Nd), Mo/Al, Mo/Al(Nd), Cr/Al(Nd) or the like.

Figure 25A:
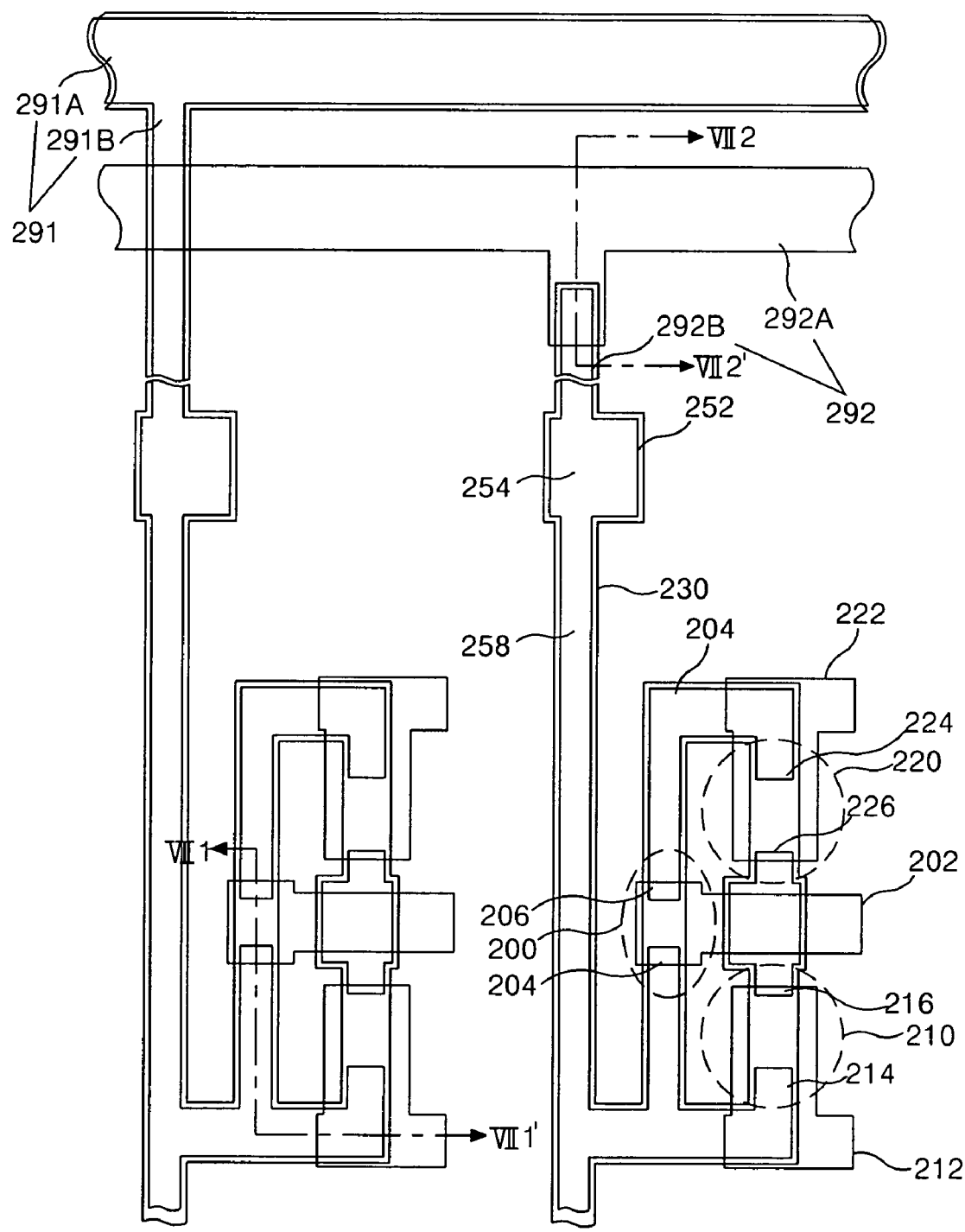
FIG. 25A and FIG. 25B are a plan view and a section view for explaining a second mask process, respectively, in a method of fabricating the thin film transistor array substrates shown in FIG. 22 and FIG. 23.
Figure 25B:
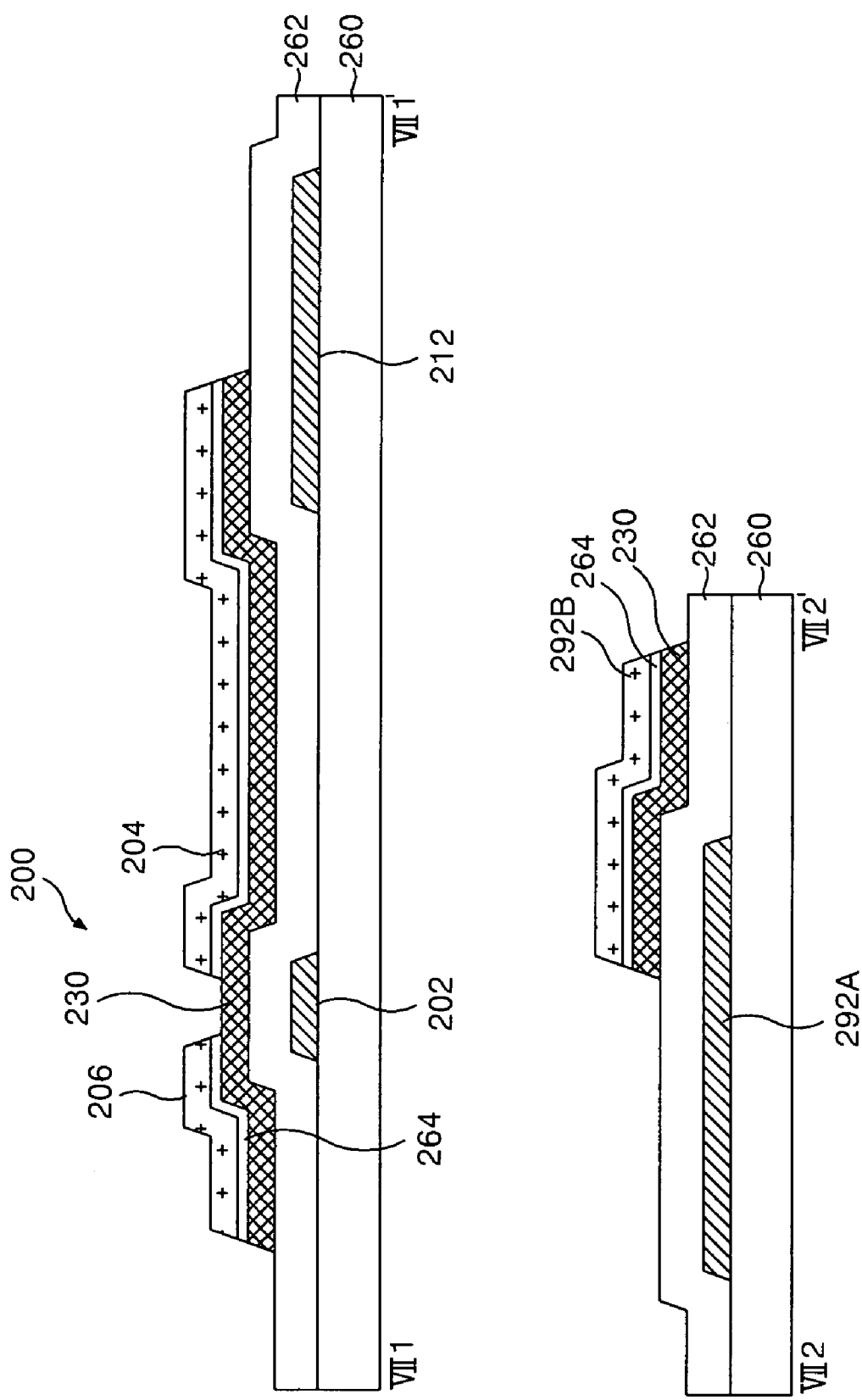

FIG. 25A and FIG. 25B are a plan view and a section view for explaining a second mask process, respectively, in a method of fabricating the thin film transistor array substrates according to the fifth embodiment of the present invention, and FIG. 26A to FIG. 26D are section views for explaining the second mask process in detail.

Firstly, the entire gate insulating film 262 are formed on the lower substrate 260 provided with the first conductive pattern by a deposition technique such as PECVD, sputtering or the like. Herein, the gate insulating film 262 is formed from an inorganic insulating material such as silicon nitride ($SiN_x$) or silicon oxide ($SiO_x$).

Next, a semiconductor pattern including the active layer 230 and the ohmic contact layer 262 disposed on the gate insulating film 262 and a second conductive pattern including the source electrodes 204, 214 and 224, the drain electrodes 206, 216 and 226 and the data link 258, the lower data pad electrode 252, the odd shorting bar 292 and the first even shorting bar 292B are provided by a second mask process.

More specifically, an amorphous silicon layer 230A, a n+ amorphous silicon layer 264A and the second conductive layer 272 are sequentially formed on the gate insulating film 262 as shown in FIG. 26A by a deposition technique such as PECVD, sputtering or the like. The second conductive layer is formed from Cr, MoW, Cr/Al, Cu, Al(Nd), Mo/Al, Mo/Al(Nd), Cr/Al(Nd) or the like. Then, a photo-resist is coated onto the entire second conductive layer 272 and thereafter a photo-resist pattern 270 having a step coverage as shown in FIG. 26A is provided by photolithography using a second mask that is a partial exposure mask. In this case, a partial exposure mask having a diffractive exposure part (or semi-transmitting part) at a portion to be provided with a channel of the thin film transistor is used as a second mask. Thus, the photo-resist pattern 270 corresponding to the diffractive exposure part (or semi-transmitting part) of the second mask has a lower height than the photo-resist pattern 270 corresponding to the transmitting part (or shielding part) of the second mask. In other words, the photo-resist pattern at the channel portion has a lower height than the photo-resist pattern at source/drain metal pattern portion.

The second conductive layer 272 is patterned by wet etching using the photo-resist pattern 270 to thereby provide a second conductive pattern including the source electrodes 204, 214 and 224, the drain electrodes 206, 216 and 226 integral to the source electrodes 204, 214 and 224, the data link 258, the lower data pad electrode 252, the odd shorting bar 291 and the first even shorting bar 292B as shown in FIG. 26B. Further, the n+ amorphous silicon layer 264A and the amorphous silicon layer 230A are simultaneously patterned by dry etching using the same photo-resist pattern 270, so that the ohmic contact layer 264 and the active layer 230 have a structure formed along the second conductive pattern as shown in FIG. 26B.

Next, the photo-resist pattern 270 at the channel portion having a relatively low height is removed while the photo-resist pattern 270 at the source/drain metal pattern portion has a lowered height as shown in FIG. 26C by ashing using an oxygen ($O_2$) plasma. The second conductive layer and the ohmic contact layer 264 are etched from a portion to be provided with the channel as shown in FIG. 26C by dry etching using the remaining photo-resist pattern 270, thereby separating the source electrodes 204, 214 and 224 from the drain electrodes 206, 216 and 226 and exposing the active layer 230. Thus, a channel made by the active layer 230 is defined between each source electrode 204, 214 and 224 and each drain electrode 206, 216 and 226.

Figure 26D:
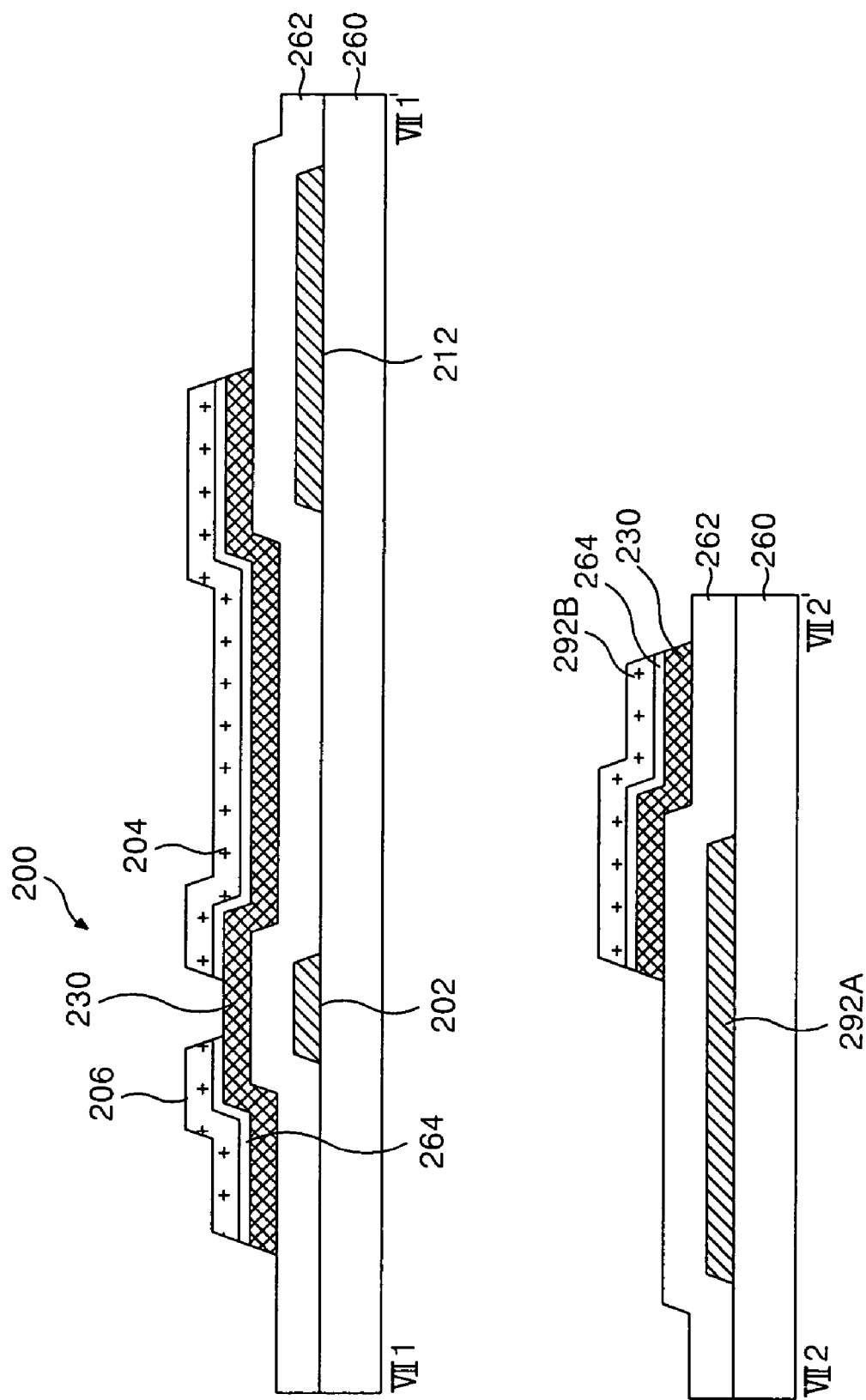

Subsequently, the remaining photo-resist pattern 270 at the second conductive pattern portion is entirely removed by stripping as shown in FIG. 26D.

Figure 27A:
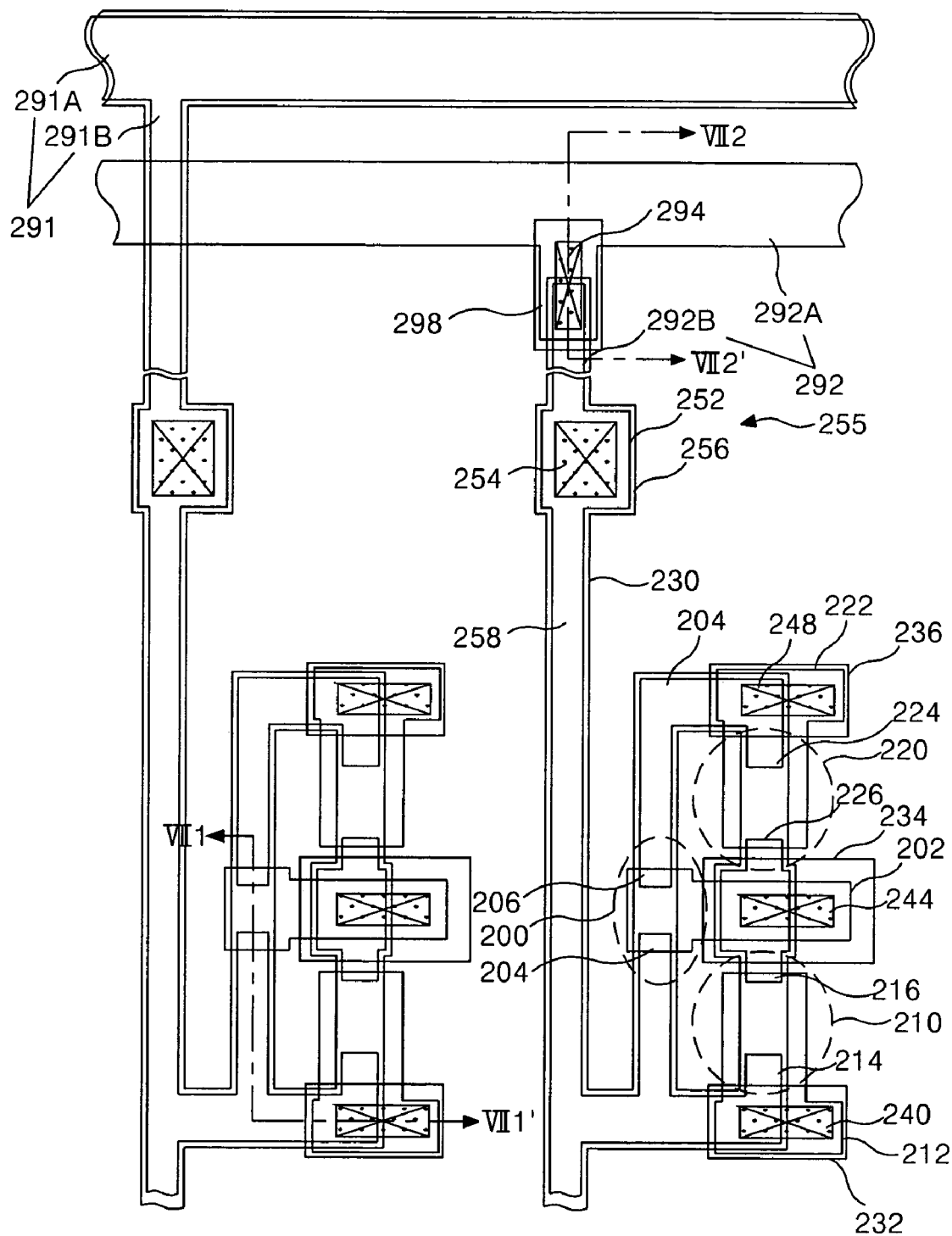

FIG. 27A and FIG. 27B are a plan view and a section view for explaining a third mask process, respectively, in a method of fabricating the thin film transistor array substrates according to the fifth embodiment of the present invention, and FIG. 28A to FIG. 28D are section views for explaining the third mask process in detail.

Using the third mask process, the entire protective film 266 and the gate insulating film 262 are patterned to define the contact holes 240, 244, 248 and 294 and a third conductive pattern including the contact electrodes 232, 234, 236 and 298 is formed along with the upper data pad electrode 254. The third conductive pattern contacts the patterned protective film 266.

More specifically, the protective film 266 is formed on the entire gate insulating film 262 provided with the second conductive pattern as shown in FIG. 28A. The protective film 266 is formed from an inorganic insulating material or an organic insulating material similar to the gate insulating film 262. Further, the photo-resist pattern 280 is provided on the entire protective film 266 at a portion where the protective film 266 exists as shown in FIG. 28A by photolithography using a third mask.

Figure 28B:
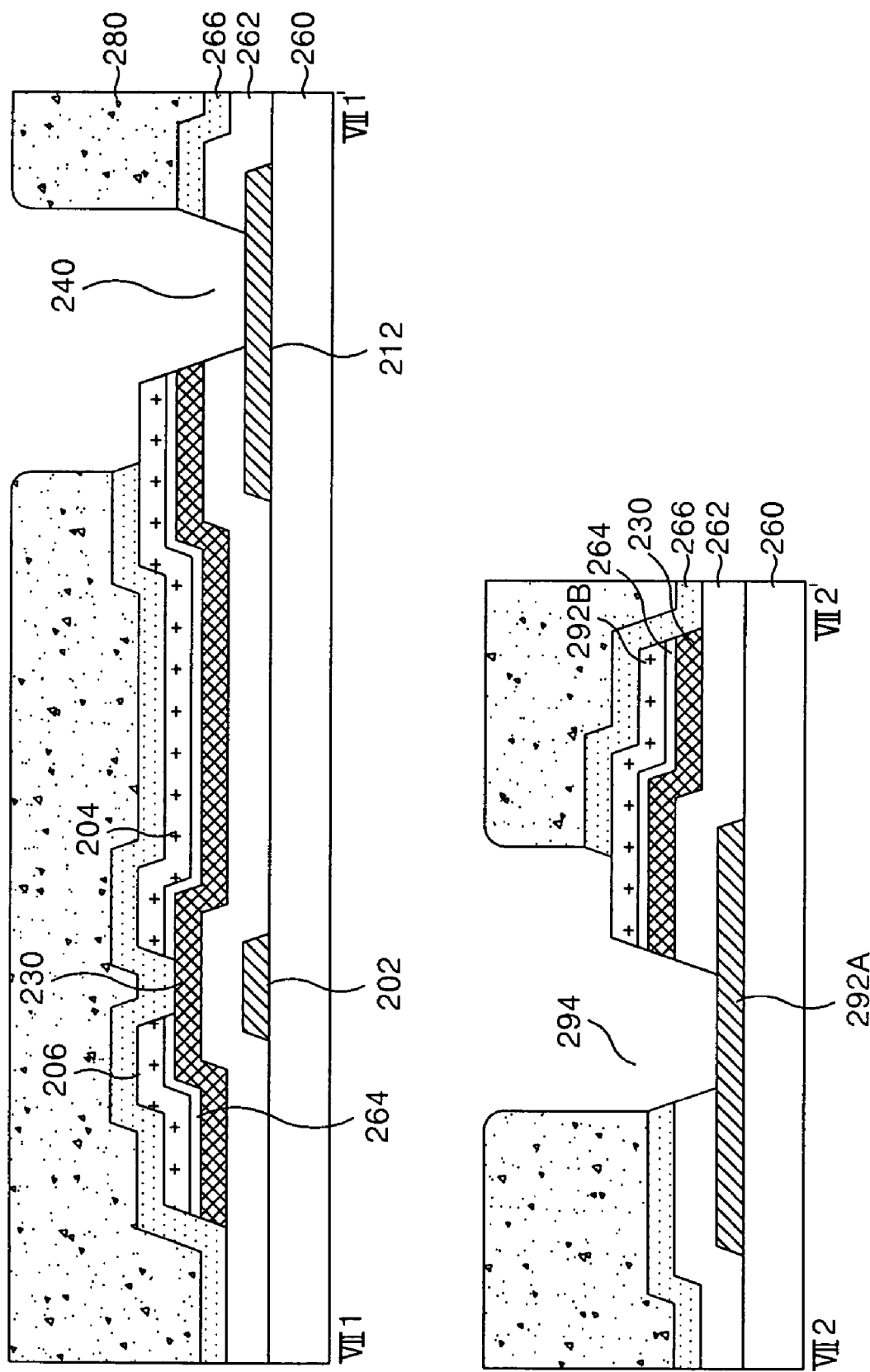

Next, the protective film 266 and the gate insulating film 262 are patterned by etching using the photo-resist pattern 280 to thereby provide the first to fourth contact holes 240, 244, 248 and 294, along with the fifth contact hole, as shown in FIG. 28B. The first contact hole 240 exposes the second source electrode 214 and the gate electrode 212; the second contact hole 244 exposes the third drain electrode 226 and the first gate electrode 202; the third contact hole 248 exposes the third source electrode 224 and the gate electrode 222; the fourth contact hole 294 exposes the first and second even shorting bars 292A and 292B; and the fifth contact hole exposes the lower data pad electrode 252.

Figure 28C:
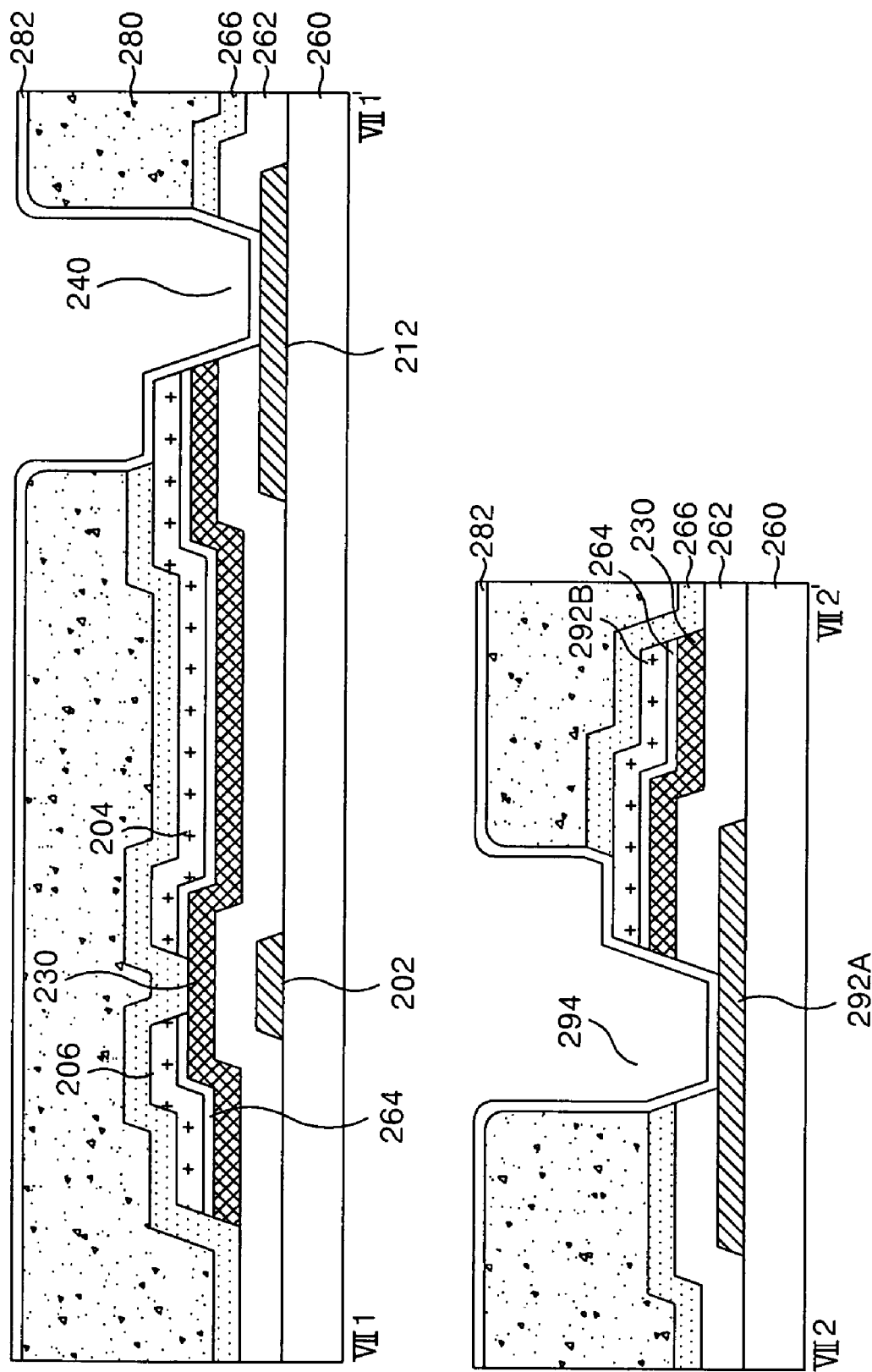

After the photo-resist pattern 280 has been deposited, as shown in FIG. 28C the third conductive layer 282 is formed on the entire thin film transistor array substrate by a deposition technique such as sputtering, etc. The third conductive layer 282 is formed from a transparent conductive layer including ITO, TO, IZO, $S_nO_2$ or the like, or a titanium (Ti) having high corrosion resistance and a high mechanical strength.

Subsequently, the photo-resist pattern 280 and the third conductive layer 282 thereon are simultaneously removed by lift-off to thereby pattern the third conductive layer 282. Thus, the contact electrodes 232, 234, 236 and 298 are provided within the first to fourth contact holes 240, 244, 248 and 294 while the upper data pad electrode 254 is provided within the fifth contact hole as shown in FIG. 28D. Thus, the first contact electrode 232 connects the second source electrode 214 with the gate electrode 212; the second contact electrode 234 connects the third drain electrode 226 with the first gate electrode 202; the third contact electrode 236 connects the third source electrode 224 with the gate electrode 222; the fourth contact electrode 298 connects the first even shorting bar 292B with the second even shorting bar 292A; and the fifth contact hole connects the upper data pad electrode 254 with the lower data pad electrode 252.

Figure 29:
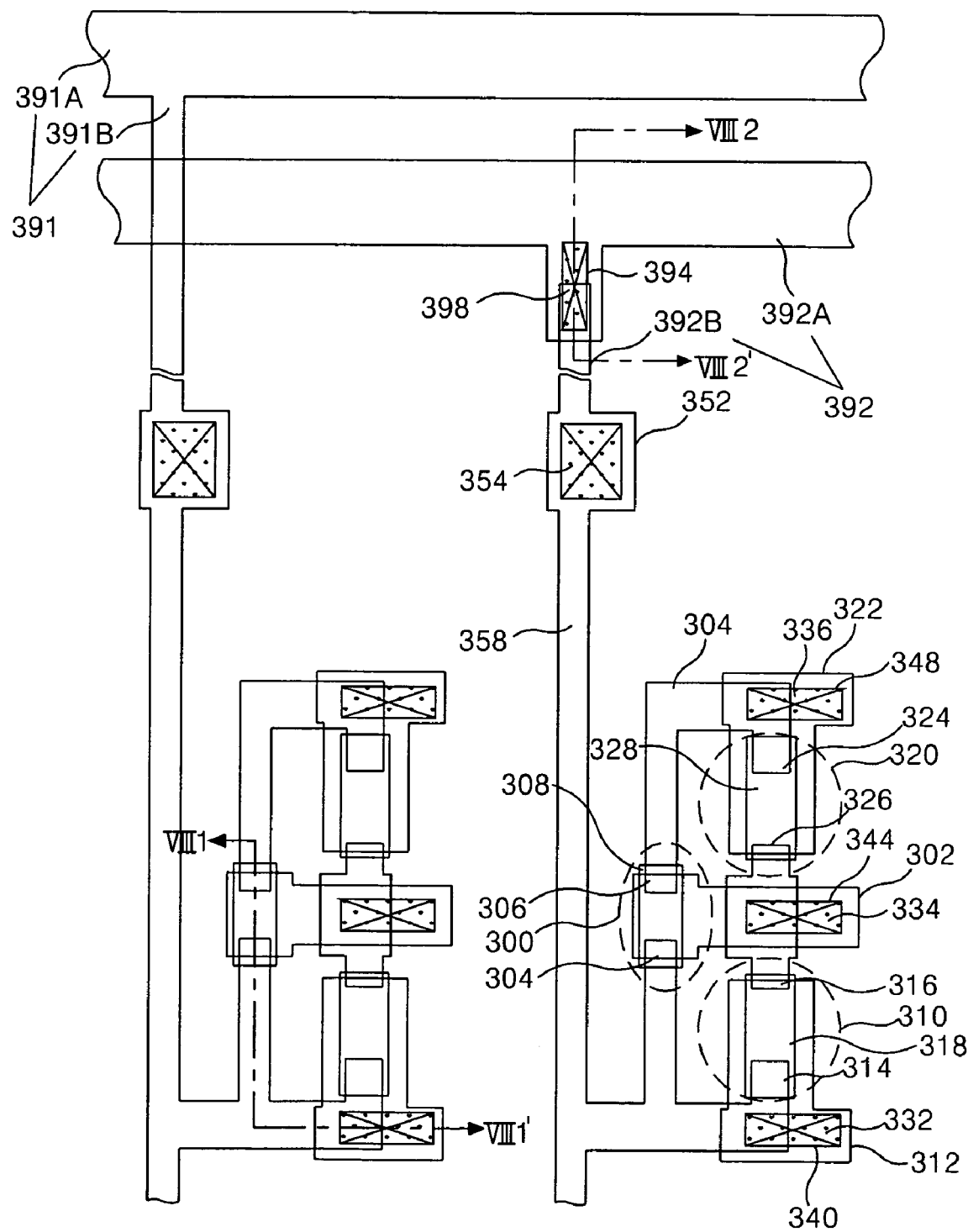
FIG. 29 is a plan view showing a static electricity proof device and a shorting bar area of a thin film transistor array substrate according to a sixth embodiment of the present invention.
Figure 30:
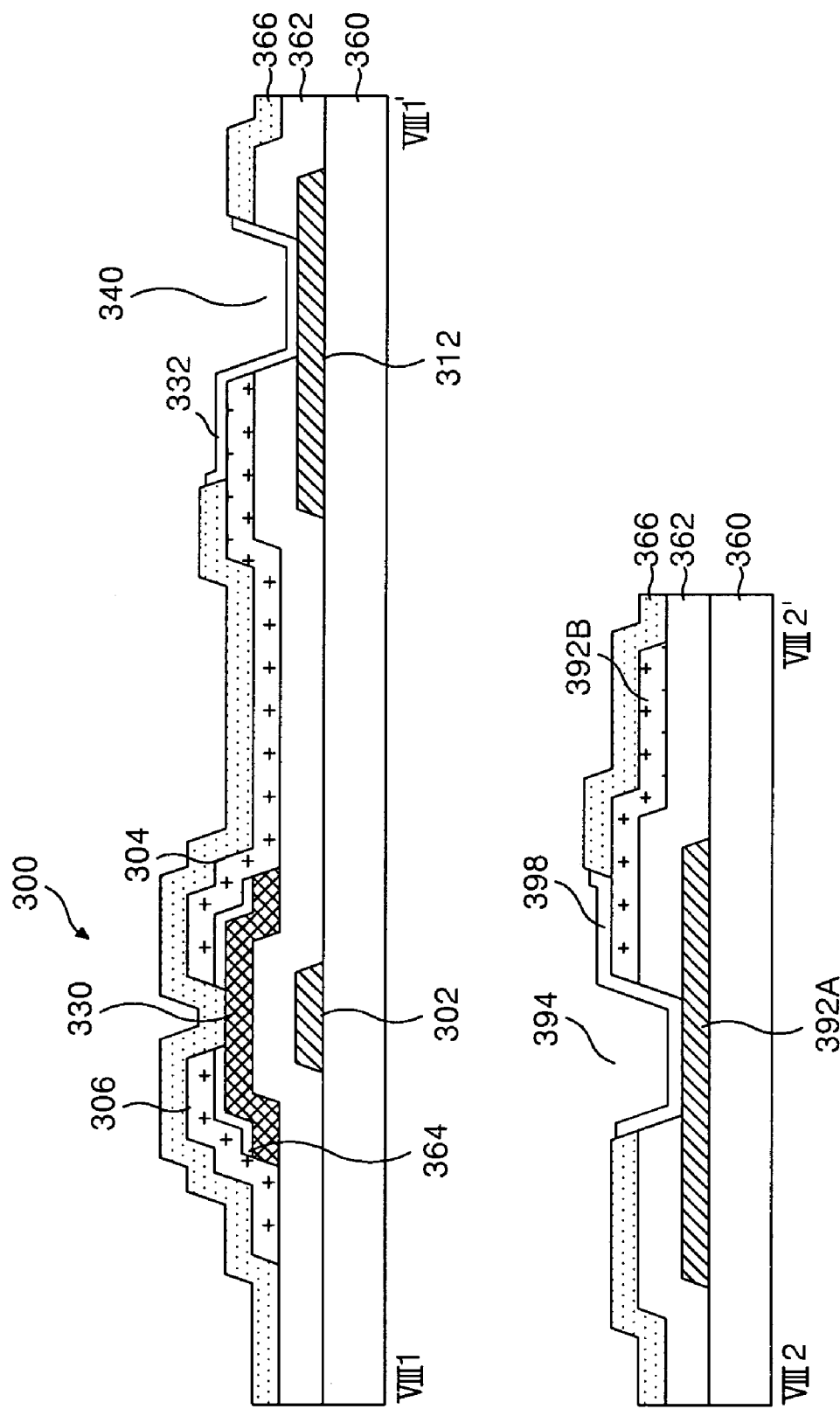
FIG. 30 is a section view of the static electricity proof device and the shorting bar area taken along the VIII1-VIII1' and VIII2-VIII2' lines in FIG. 29.

FIG. 29 is a plan view showing a static electricity proof device and a shorting bar area of a thin film transistor array substrate according to a sixth embodiment of the present invention, and FIG. 30 is a section view of the static electricity proof device and the shorting bar area taken along the VIII1-VIII1' and VIII2-VIII2' lines in FIG. 29.

The thin film transistor array substrate shown in FIG. 29 and FIG. 30 has the same elements as that shown in FIG. 22 and FIG. 23 except that, since it has a structure formed by a four mask process, the semiconductor layers are formed only at the thin film transistor area. Therefore, a detailed explanation as to the same elements will be omitted.

First to third thin film transistor 300, 310 and 320 of a static electricity proof device shown in FIG. 29 and FIG. 30 include active layers 308, 318 and 328 independently, that is, an island type active layer only at the corresponding area for channel formation. An ohmic contact layer is further provided at an overlapping portion among the active layers 308, 318 and 328, the source electrodes 304, 314 and 324 and the drain electrodes 306, 316 and 326.

A first contact electrode 332 is formed within a first contact hole 340 to connect a second gate electrode 312 to a source electrode 314. A second contact electrode 334 is formed within a second contact hole 344 to connect a second drain electrode 326 with a first gate electrode 302. A third contact electrode 336 is formed within a third contact hole 348 to connect a third source electrode 324 to a gate electrode 322. A fourth contact electrode 398 is formed within a fourth contact hole 394 to connect a first even shorting bar 392B to a second even shorting bar 392A. Such contact electrodes 332, 334 and 336 are provided by lift-off of removing the photo-resist pattern used upon patterning of the protective film 366 and the gate insulating film 362 along with an upper data pad electrode 354. Accordingly, the thin film transistor array substrate according to the sixth embodiment of the present invention can be provided by the four mask process as will be described below.

FIG. 31A and FIG. 31B are a plan view and a section view for explaining a first mask process, respectively, in a method of fabricating the thin film transistor array substrates shown according to the sixth embodiment of the present invention.

A first conductive pattern including the gate electrodes 302, 312 and 322 and the second even shorting bar 392A is provided on the lower substrate 360 by the first mask process. More specifically, a first conductive pattern is formed on the lower substrate 360 by a deposition technique such as sputtering, etc. Then, the first conductive layer is patterned by photolithography and etching using a first mask to thereby provide the first conductive pattern including the gate electrodes 302, 312 and 322 and the second even shorting bar 392A.

FIG. 32A and FIG. 32B are a plan view and a section view for explaining a second mask process, respectively, in a method of fabricating the thin film transistor array substrates according to the sixth embodiment of the present invention.

Firstly, the gate insulating film 362 is formed on the entire lower substrate 360, which is provided with the first conductive pattern, by a deposition technique such as PECVD, sputtering or the like. Next, a semiconductor pattern including the first to third active layers 308, 318 and 328 and the ohmic contact layer 364 disposed on the gate insulating film 362 by the second mask process. More specifically, an amorphous silicon layer and a n+ amorphous silicon layer are disposed on the gate insulating film 362 by a deposition technique such as PECVD, sputtering or the like. The semiconductor pattern is patterned by photolithography and etching using a second mask to thereby provide a semiconductor pattern, the first to third active layers 308, 318 and 328 and the ohmic contact layer 364 at the corresponding thin film transistor area.

Figure 33A:
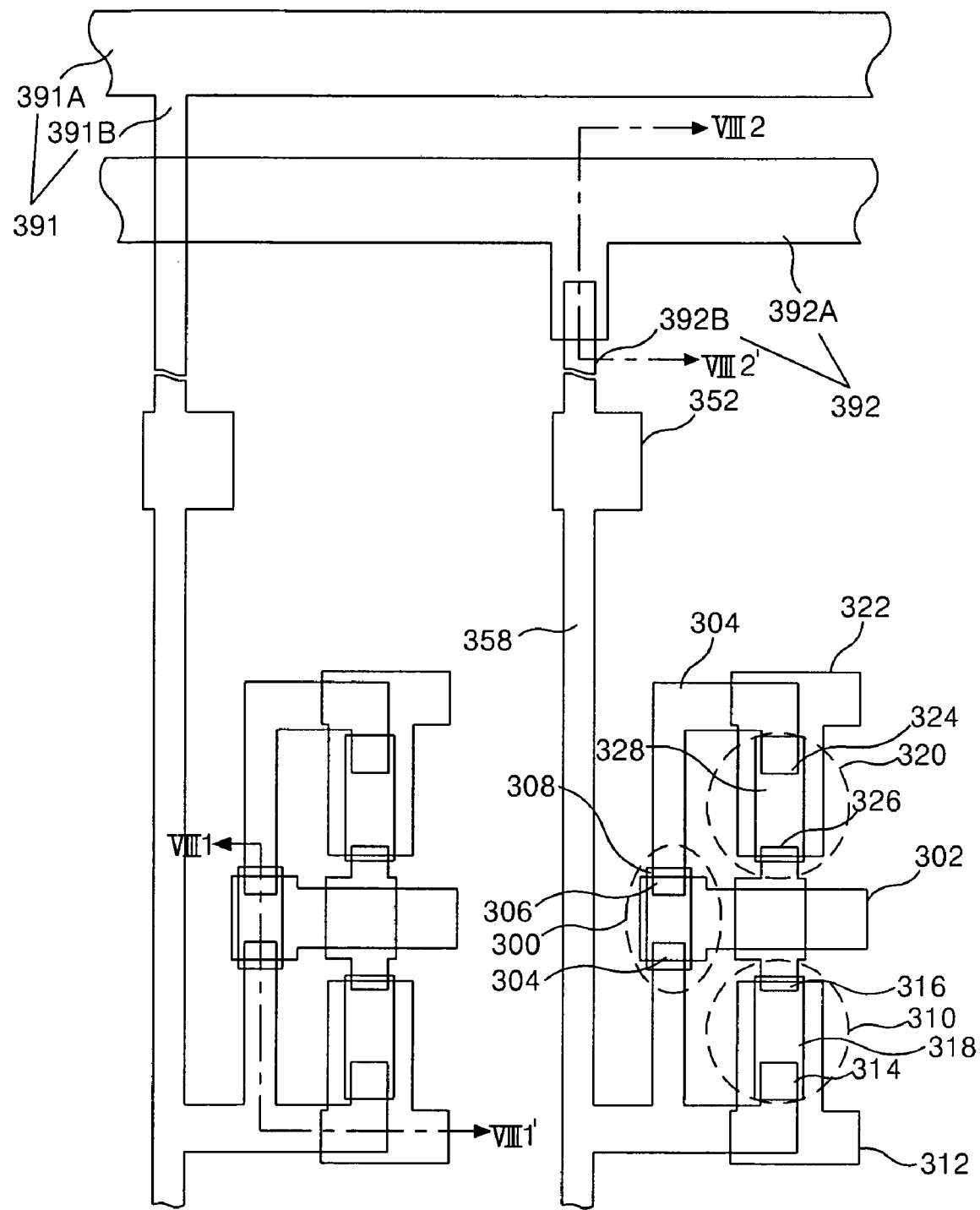
FIG. 33A and FIG. 33B are a plan view and a section view for explaining a third mask process, respectively, in a method of fabricating the thin film transistor array substrates shown in FIG. 29 and FIG. 30.
Figure 33B:
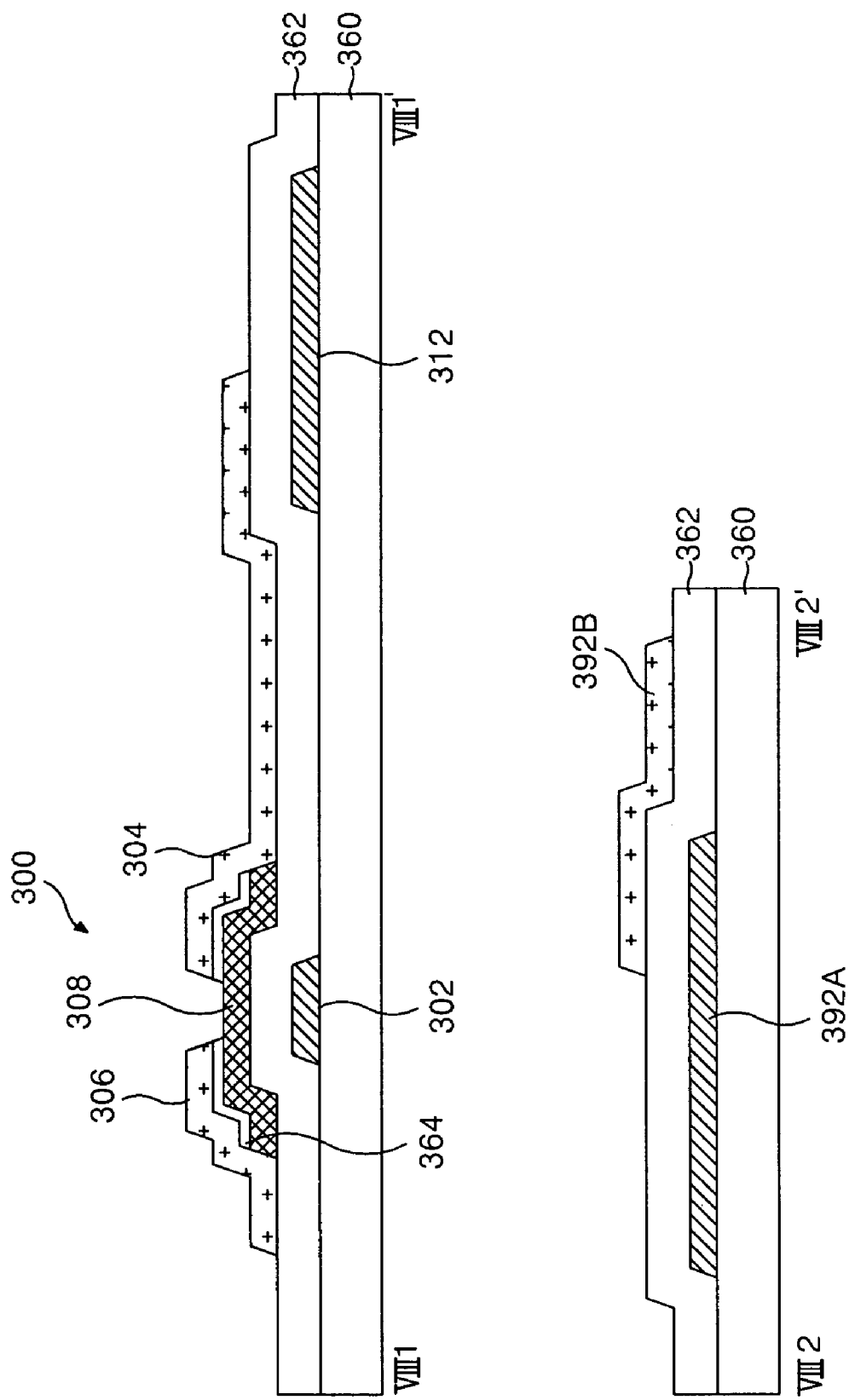

FIG. 33A and FIG. 33B are a plan view and a section view for explaining a third mask process, respectively, in a method of fabricating the thin film transistor array substrates according to the sixth embodiment of the present invention.

Using the third mask process, a second conductive pattern including the source electrodes 304, 414 and 324, the drain electrodes 306, 316 and 326, the data link 358, the lower data pad electrode 352, the odd shorting bar 391 and the first even shorting bar 392B is formed on the gate insulating film 362 provided with the semiconductor pattern. More specifically, the second conductive layer is formed on the gate insulating film 362 by a deposition technique such as PECVD, sputtering or the like. The second conductive layer is patterned by photolithography and etching using a third mask to thereby provide the source electrodes 304, 314 and 324, the drain electrodes 306, 316 and 326, the data link 358, the lower data pad electrode 352, the odd shorting bar 391 and the first even shorting bar 392B.

Then, the ohmic contact layer 364 exposed between the source electrodes 304, 314 and 324 and the drain electrodes 306, 316 and 326 by dry etching using the second conductive pattern as a mask to thereby expose the corresponding active layers 308, 318 and 328.

Figure 34A:
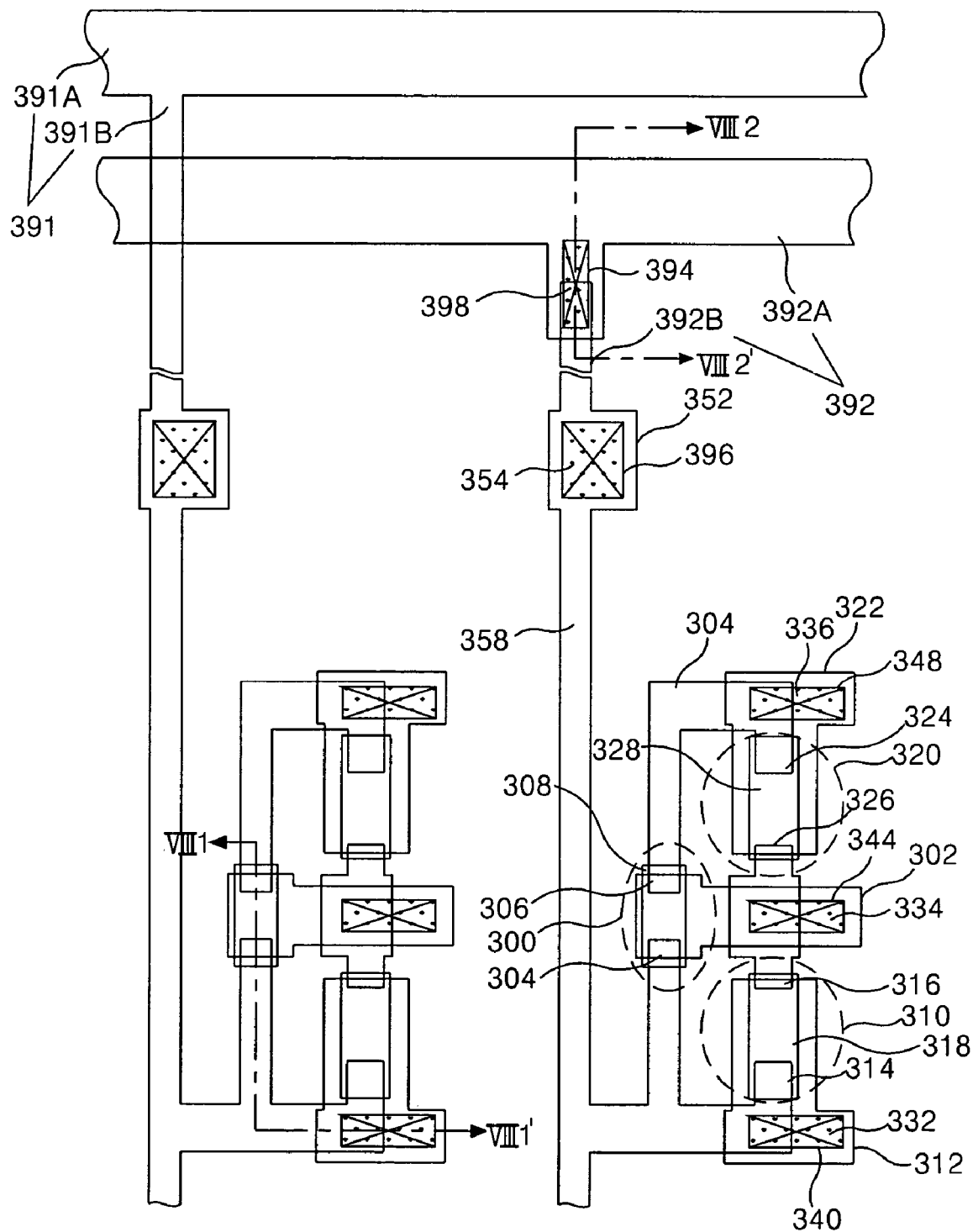
FIG. 34A and FIG. 34B are a plan view and a section view for explaining a fourth mask process, respectively, in a method of fabricating the thin film transistor array substrates shown in FIG. 29 and FIG. 30.
Figure 34B:
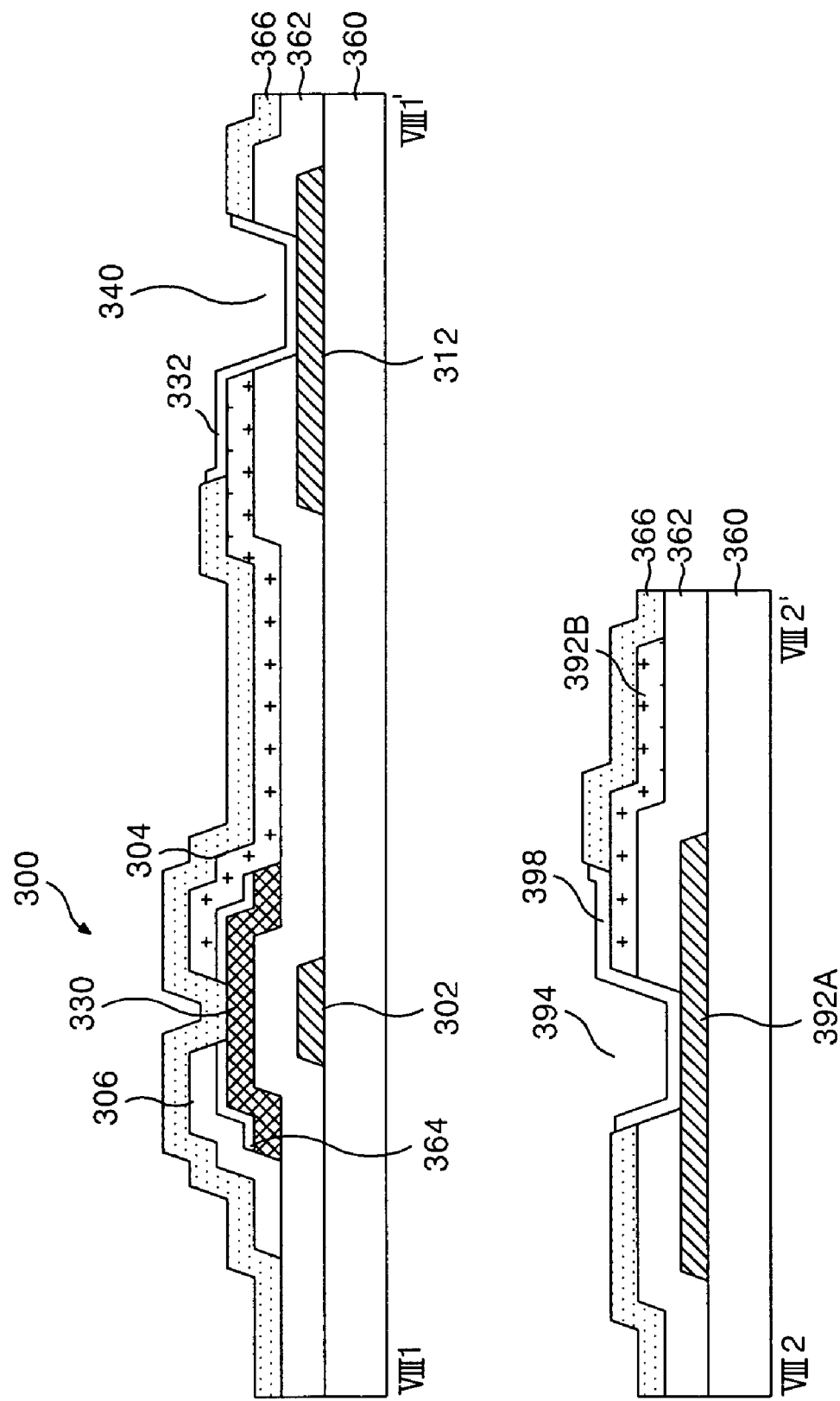

FIG. 34A and FIG. 34B are a plan view and a section view for explaining a fourth mask process, respectively, in a method of fabricating the thin film transistor array substrates according to the sixth embodiment of the present invention, and FIG. 35A to FIG. 35D are section views for explaining the fourth mask process in detail.

Using the fourth mask process, the entire protective film 366 and the gate insulating film 362 are patterned to define the contact holes 340, 344, 348 and 394 and a third conductive pattern including the contact electrodes 332, 334, 336 and 398 is formed along with the upper data pad electrode 354.

More specifically, the protective film 366 is formed on the entire gate insulating film 362 provided with the second conductive pattern as shown in FIG. 35A. Further, the photo-resist pattern 370 is provided on the entire protective film 366 at a portion where the protective film 366 exists as shown in FIG. 35A by photolithography using a third mask.

Figure 35B:
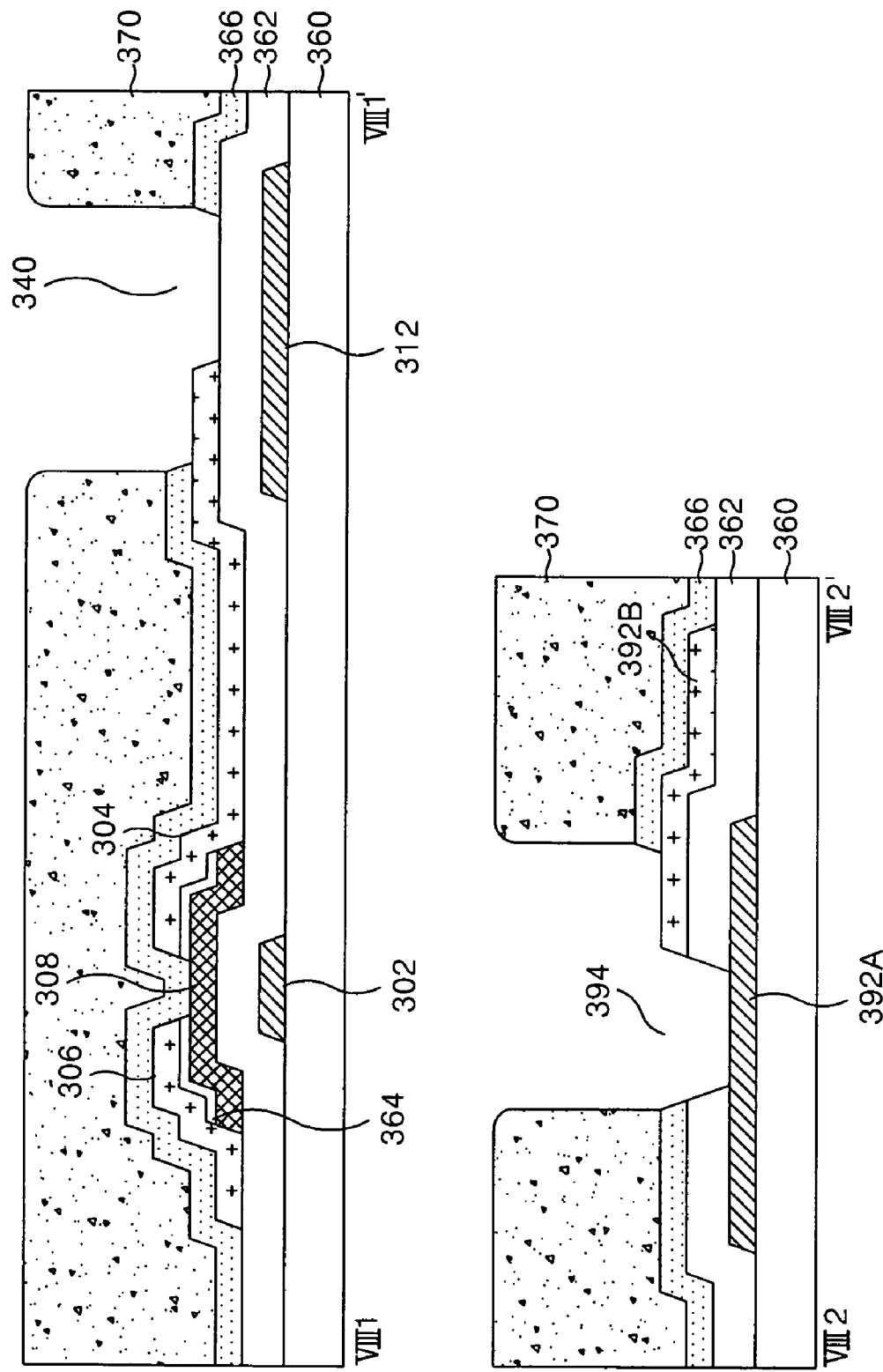

Next, the protective film 366 and the gate insulating film 362 are patterned by etching using the photo-resist pattern 370 to thereby provide the first to fourth contact holes 340, 344, 348 and 394, along with the fifth contact hole, as shown in FIG. 35B. The first contact hole 340 exposes the second source electrode 314 and the gate electrode 312; the second contact hole 344 exposes the third drain electrode 326 and the first gate electrode 302; the third contact hole 348 exposes the third source electrode 324 and the gate electrode 322; the fourth contact hole 394 exposes the first and second even shorting bars 392B and 392A; and the fifth contact hole exposes the lower data pad electrode 352.

Figure 35C:
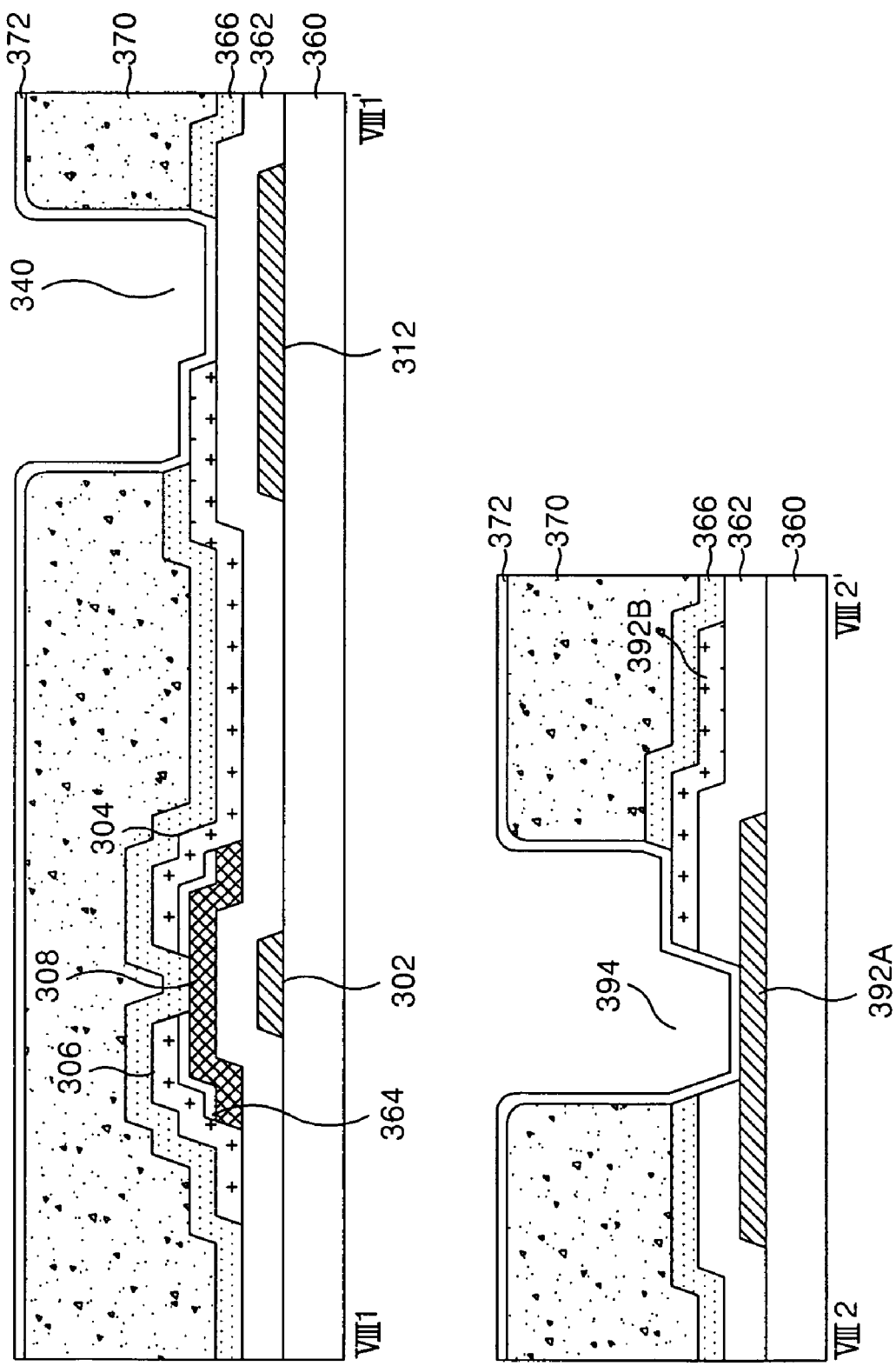

After the photo-resist pattern 370 has been formed, as shown in FIG. 35C the third conductive layer 372 is formed on the entire thin film transistor array substrate by a deposition technique such as sputtering, etc. The third conductive layer 372 is formed from a transparent conductive layer including ITO, TO, IZO, $S_nO_2$ or the like, or a titanium (Ti) having a high corrosion resistance and a high mechanical strength.

Figure 35D:
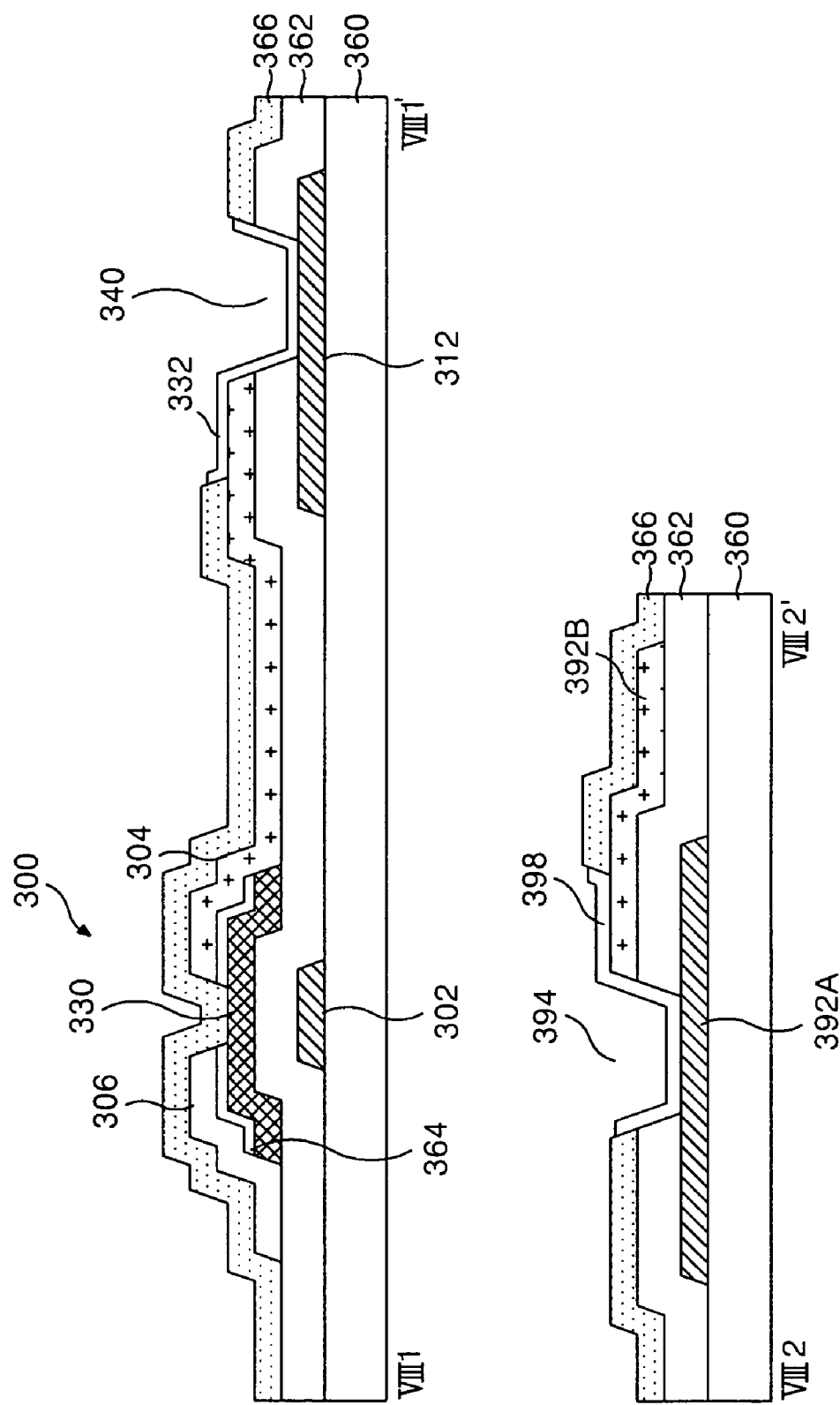

Subsequently, the photo-resist pattern 370 and the third conductive layer 372 thereon are simultaneously removed by lift-off to thereby pattern the third conductive layer 372. Thus, the contact electrodes 332, 334, 336 and 398 are provided within the first to fourth contact holes 340, 344, 348 and 394 while the upper data pad electrode 354 is provided within the fifth contact hole as shown in FIG. 35D.

As described above, according to the present invention, the thin film transistor array substrate is provided by the third mask process, thereby simplifying the structure and the fabrication process to reduce the manufacturing cost as well as improving the production yield. Furthermore, according to the present invention, when the signal line and the signal pad are formed from a different metal, the contact hole is provided to expose the end of the signal lines and/or the signal pad and an area adjacent thereto. The signal line is electrically connected, via the contact hole, to the signal pad, thereby preventing a breakage of the signal line and/or the signal pad. Moreover, according to the present invention, the contact holes exposing the first and second conductive layers are integrally provided. Accordingly, the first and second conductive layers exposed through the contact electrodes provided within the corresponding contact holes can be connected with each other and have a reduced step coverage, thereby preventing breakage thereof.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a liquid crystal display panel, the method comprising:
    providing a color filter array substrate; and
    providing a thin film transistor array substrate opposed to the color filter array substrate and having:
        a gate line and a data line intersecting each other on a lower substrate with a gate insulating film therebetween,
        a thin film transistor provided at an intersection between the gate line and the data line,
        a pixel electrode connected to the thin film transistor,
        a pad connected to a signal line via a contact hole, the signal line including the gate line or the data line, the pad formed from a transparent conductive film, and
        a protective film provided at least in an area overlapping with the color filter array substrate;
    joining the thin film transistor array substrate with the color filter array substrate by a sealant to expose a pad area including a gate pad and a data pad; and
    removing the protective film using the color filter array substrate as a mask to expose the transparent conductive film of the pad area,
    wherein the contact hole exposes an end of at least one of the pad and the signal line as well as an area adjacent thereto.

2. The method as claimed in claim 1, further comprising:
    providing a common electrode that provides an electric field when a voltage is applied between the common electrode and the pixel electrode;
    providing a common voltage pad through which the common electrode is supplied with a driving voltage;
    providing a common voltage supply line fabricated from a conductive layer different from a conductive layer forming the common pad; and
    providing a common contact hole connecting the common voltage pad with the common voltage supply line and exposing an end of at least one of the common voltage pad and the common voltage supply line as well as an area adjacent thereto.

3. The method as claimed in claim 1, further comprising:
    providing a plurality of first shorting patterns, one of the first shorting patterns connected to the signal line;
    providing a second shorting pattern connected to the plurality of first shorting patterns; and
    providing a shorting contact hole exposing an end of the one of the first shorting patterns and second shorting pattern as well as an area adjacent thereto to electrically connect the one of the first shorting patterns with the second shorting pattern.

4. The method as claimed in claim 1, wherein providing the thin film transistor array substrate comprises:
    forming gate patterns including a gate line, a gate electrode, a gate pad and data pad, and a pixel electrode on the substrate, the gate patterns including a transparent conductive film;

forming a semiconductor pattern having the contact hole exposing an end of the data pad and an area adjacent thereto and forming a gate insulating pattern on the substrate provided with the gate patterns and the pixel electrode;

forming a data pattern including a data line, a source electrode and a drain electrode connected, via the contact hole, to the data pad on the substrate provided with the semiconductor pattern and the gate insulating pattern; and forming the protective film on the substrate provided with the data pattern.

5. The method as claimed in claim 4, wherein at least one of the gate pad and the data pad includes:

the transparent conductive film; and a gate metal film formed on the transparent conductive film to expose at least portion of the transparent conductive film.

6. The method as claimed in claim 5, wherein the gate metal film contains at least one of molybdenum (Mo), copper (Cu), titanium (Ti) and tantalum (Ta).

7. A method of fabricating a thin film transistor array substrate, the method comprising:

providing gate patterns including a gate line, a gate electrode, a gate pad and data pad, and a pixel electrode on the substrate, the gate patterns including a transparent conductive film;

providing a semiconductor pattern and a gate insulating pattern on the substrate provided with the gate patterns and the pixel electrode;

providing a data pattern including a data line, a source electrode and a drain electrode connected, via the contact hole, to the data pad on the substrate provided with the semiconductor pattern and the gate insulating pattern;

providing a protective film on the entire substrate to protect a thin film transistor formed by the gate pattern, the semiconductor pattern, the gate insulating pattern, and the data pattern;

providing an alignment film on the protective film in an area other than a pad area, the pad area including the gate pad and the data pad; and removing the protective film covering the pad area using the alignment film as a mask, thereby exposing the transparent conductive film of the pad area, wherein the contact hole exposes an end of at least one of the data pad and the data line as well as an area adjacent thereto.

8. The method as claimed in claim 7, further comprising:

providing a common electrode that provides an electric field along with the pixel electrode when a voltage difference is applied between the common electrode and the pixel electrode;

providing a common voltage pad through which the common electrode is supplied with a driving voltage;

providing a common voltage supply line formed from a conductive layer that is different from a conductive layer forming the common pad; and providing a common contact hole connecting the common voltage pad with the common voltage supply line and exposing an end of at least one of the common voltage pad and the common voltage supply line as well as an area adjacent thereto.

9. The method as claimed in claim 7, further comprising:

providing a plurality of first shorting patterns, one of the first shorting patterns connected to one of the gate and data lines;

providing a second shorting pattern connected to the first shorting patterns; and providing a shorting contact hole exposing an end of the one of the first shorting patterns and the second shorting pattern as well as an area adjacent thereto to electrically connect the one of the first shorting patterns with the second shorting pattern.

10. The method as claimed in claim 7, wherein at least one of the gate pad and the data pad includes:

the transparent conductive film; and a gate metal film formed on the transparent conductive film to expose at least portion of the transparent conductive film.

11. The method as claimed in claim 10, wherein the gate metal film contains at least one of molybdenum (Mo), copper (Cu), titanium (Ti) and tantalum (Ta).

* * * * *